(12) United States Patent
Yoshinuma et al.

(10) Patent No.: US 6,378,199 B1
(45) Date of Patent: Apr. 30, 2002

(54) MULTI-LAYER PRINTED-WIRING BOARD PROCESS FOR PRODUCING

(75) Inventors: Hiroto Yoshinuma; Kenzaburo Kawai; Shinichi Kobayashi, all of Tokyo-To (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/222,988

(22) Filed: Dec. 22, 1998

Related U.S. Application Data

(63) Continuation of application No. 08/591,496, filed on Mar. 8, 1996, now abandoned.

(30) Foreign Application Priority Data

| May 13, 1994 | (JP) | 6-123235 |
| Aug. 23, 1994 | (JP) | 6-220962 |
| Dec. 26, 1994 | (JP) | 6-337358 |
| Dec. 29, 1994 | (JP) | 6-340391 |
| Mar. 3, 1995 | (JP) | 7-70878 |

(51) Int. Cl.⁷ .............................................. H05K 3/36
(52) U.S. Cl. .................... 29/830; 29/846; 29/852; 174/261; 174/262
(58) Field of Search .................... 29/852, 846, 830; 174/261, 262

(56) References Cited

U.S. PATENT DOCUMENTS

| 2,724,674 A | * 11/1955 | Pritikin |
| 2,874,085 A | * 2/1959 | Brietzke ........................ 29/846 |
| 3,207,838 A | 9/1965 | McCormack ................ 174/254 |
| 3,301,730 A | * 1/1967 | Spiwak et al. ................. 29/846 |
| 3,408,452 A | 10/1968 | Ruehlemann ................ 174/254 |
| 3,474,297 A | 10/1969 | Bylander ..................... 361/751 |
| 3,525,617 A | 8/1970 | Bingham ..................... 430/312 |
| 4,000,054 A | 12/1976 | Marcantonio .......... 204/192.17 |
| 4,113,981 A | 9/1978 | Fujita et al. .............. 174/88 R |
| 4,392,013 A | 7/1983 | Ohmura et al. |
| 4,464,704 A | 8/1984 | Huie et al. ................... 361/792 |
| 4,705,720 A | 11/1987 | Kundinger et al. .......... 428/332 |
| 4,764,644 A | 8/1988 | Reisman et al. ............. 174/253 |
| 4,875,283 A | * 10/1989 | Johnston ...................... 29/830 |
| 4,889,961 A | 12/1989 | Carlson ........................ 74/261 |
| 4,899,439 A | 2/1990 | Potter et al. .................. 29/846 |
| 5,063,658 A | * 11/1991 | Wild ............................ 29/846 |
| 5,153,986 A | * 10/1992 | Brauer et al. |
| 5,468,919 A | 11/1995 | Shiozaki et al. ............. 174/261 |
| 5,979,044 A | * 11/1999 | Sumi et al. .................... 29/830 |

FOREIGN PATENT DOCUMENTS

| EP | 0 185 998 | 7/1986 |
| EP | 0 199 300 | 10/1986 |
| EP | 0 259 784 | 3/1998 |
| JP | 48-91560 | 11/1973 |
| JP | 55-31639 | 8/1980 |
| JP | 56-51337 | 12/1981 |
| JP | 58-73186 | 5/1983 |
| JP | 59-16930 | 4/1984 |
| JP | 63-5666 | 1/1988 |
| JP | 2-101188 | 4/1990 |
| JP | 3-270292 | 12/1991 |
| JP | 4-234192 | 8/1992 |
| JP | 4-260389 | 9/1992 |
| JP | 5-507391 | 10/1993 |
| JP | 7-15115 | 1/1995 |

OTHER PUBLICATIONS

Patent Abstracts of Japan, vol. 17, No. 44 (E–1312), Jan. 27, 1993 & JP 04 260389 A (Dai Nippon Printing Co.), Sep. 16, 1992 Abstract.
Patent Abstracts of Japan, vol. 17, No. 518 (E–1434), Sep. 17, 1993 & JP 05 136551 A (Furukawa Electric Co.), Jun. 1, 1993 Abstract.
Patent Abstracts of Japan, vol. 17, No. 378 (E–1398), Jul. 15, 1993 & JP 05 063346 A (NEC Kansai), Mar. 12, 1993, Abstract.
Patent Abstracts of Japan, vol. 13, No. 123(E–733), Mar. 27, 1989 & JP 63 291494 A (Ibiden Co.), Nov. 29, 1988 Abstract.
IBM Technical Disclosure Bulletin, vol. 30, No. 8, "Dust Collector for PC I/O Tab", Jan. 8, 1988, N.Y., p. 352.

\* cited by examiner

*Primary Examiner*—Carl J. Arbes
(74) *Attorney, Agent, or Firm*—Parkhurst & Wendel, L.L.P.

(57) ABSTRACT

A multi-layer printed-wiring board including a substrate having a plurality of wiring pattern layers sequentially transferred thereon, each wiring pattern layer containing an electrically conductive layer and an electrically insulating layer. The wiring pattern layers are attached to the substrate through an electrically insulating layer.

21 Claims, 30 Drawing Sheets

MULTI-LAYER PRINTED-WIRING BOARD PROCESS FOR PRODUCING

This is a Continuation of application Ser. No. 08/591,496 filed Mar. 8, 1996 now abandoned.

TECHNICAL FIELD

The present invention relates to a multi-layer printed-wiring board and a process for producing it, and transferring original plates used in producing the multi-layer printed-wiring board and a process for producing them, and particularly to a multi-layer printed-wiring board having a highly precise pattern, a process for producing such a multi-layer printed-wiring board at low cost, and transferring original plates with which the above multi-layer printed-wiring board can be advantageously produced from the industrial viewpoint, and a process for producing them.

BACKGROUND ART

Remarkable development of the semiconductor technology has made rapid progress in miniaturizing semiconductor packages, using a configuration of as many pins as possible, realizing fine pitches, and minimizing the dimensions of electronic parts, thereby rushing into a so-called high-density packaging era. With the progress, the printed-wiring boards are also changing from single-side wiring to double-side wiring, and further to multi-layer wiring and thin-film structure.

Presently, the subtractive process and the additive process are mainly used to form copper patterns on the printed-wiring boards.

The subtractive process is a process consisting of forming holes in a copper-clad laminate, thereafter depositing a copper plating layer inside the holes and on the surface of the laminate, and then performing photo-etching to form patterns. This subtractive process is technically highly completed and low in cost, but it is difficult to form fine patterns because of restriction resulting from the thickness of a copper foil, for example.

On the other hand, the additive process is such a process that a resist layer is formed on portions except for circuit-pattern-forming portions on a laminate containing a catalyst for electroless plating and that circuit patterns are formed on the exposed portions on the laminate by electroless copper plating or the like. The additive process does permit fine patterns to be formed, but has drawbacks in terms of cost and reliability.

Used for forming multi-layer boards is a method for laminating under pressure a single-sided or double-sided printed-wiring board produced by either of the above methods etc. together with a pre-preg in a semi-curing condition, in which an epoxy resin etc. is impregnated in glass cloth. In this case, the pre-preg roles as an adhesive for layers, and connection between the layers is made by forming through holes and effecting electroless plating inside thereof.

Further, the progress of the high-density packaging demands to decrease the thickness and weight of multi-layer boards and also to raise wiring capacity per unit area, which results in producing ideas on the decrease of the thickness of board per layer, the method for connection between layers, the method for mounting parts, etc.

However, the production of multi-layer board using the double-side printed-wiring board produced by the above subtractive process had a limit of increasing the density in terms of the precision of drilling for forming holes in the double-side printed-wiring board and the limit of scale down, and was difficult to decrease the manufacturing cost in addition.

On the other hand, there is a recently developed multi-layer wiring board that is produced by laminating electrically conductive pattern layers and electrically insulating layers successively on a substrate, which meets the above-described demand. Since this multi-layer wiring board is produced by alternately performing photo-etching of a copper plating layer and patterning of a photosensitive resin, this process permits highly precise wiring and connection between layers at arbitrary position.

However, because in this method the copper plating and photo-etching were performed alternately plural times, the procedures were complicated; and because this method was a series process in which the layers were laminated one by one on the substrate, it was difficult to recover a product once trouble occurred in an intermediate step, which was a hinderance to the decrease in the production cost.

Furthermore, because in the conventional multi-layer wiring boards, connection between layers was effected by forming via holes, complicated photolithography steps were required, which was another obstacle against the decrease in the production cost.

DISCLOSURE OF THE INVENTION

The present invention has been accomplished taking the above points into account, and an object of the present invention is to provide a multi-layer printed-wiring board having a highly precise pattern, a process in which such a multi-layer printed-wiring board can be produced by a transfer-lamination-on-substrate method without including the photolithography step, transferring original plates with which the above multi-layer printed-wiring board can be advantageously produced from the industrial viewpoint, and a process for producing them.

A first feature of the present invention is a multi-layer printed-wiring board comprising a substrate for multi-layer printed-wiring board and a plurality of wiring pattern layers having sequentially been transferred onto the substrate, wherein each wiring pattern layer has an electrically conductive layer and an electrically insulating resin layer formed below the electrically conductive layer, and said insulating resin layer is fixed to the substrate or to a lower wiring pattern layer.

A second feature of the present invention is a multi-layer printed-wiring board comprising a substrate for multi-layer printed-wiring board and a plurality of wiring pattern layers having sequentially been transferred onto the substrate, wherein each wiring pattern layer has an electrically conductive layer and an electrically insulating resin layer formed below the electrically conductive layer; said insulating resin layer is fixed to said substrate or a lower wiring pattern layer; and an additional electrically insulating layer is interposed in an overlapping portion between the wiring pattern layers.

A third feature of the present invention is a multi-layer printed-wiring board comprising a substrate for multi-layer printed-wiring board and a plurality of wiring pattern layers having sequentially been transferred onto the substrate, wherein each wiring pattern layer has an electrically conductive layer and an adhesive layer formed below the electrically conductive layer, and an insulating resin layer is formed between upper and lower wiring pattern layers in a portion where the wiring pattern layers intersect or overlap in multi-layer structure with each other.

A fourth feature of the present invention is a multi-layer printed-wiring board comprising a substrate for multi-layer printed-wiring board and a plurality of wiring pattern layers having sequentially been transferred onto the substrate, wherein each wiring pattern layer has an electrically conductive layer, and an electrically insulating resin layer is formed between upper and lower wiring pattern layers in a portion where the wiring pattern layers intersect or overlap in multi-layer structure with each other.

A fifth feature of the present invention is a printed-wiring board comprising a substrate for printed-wiring board and a wiring pattern layer formed on the substrate, wherein a part of said wiring pattern layer is constituted by arranging a plurality of lines each having a small linewidth in parallel.

A sixth feature of the present invention is a process for producing a multi-layer printed-wiring board, comprising:
- a step of forming on electrically conductive substrates respective wiring pattern layers, each having an electrically conductive layer and a sticky or adhesive, electrically insulating resin layer laid on said conductive layer, thereby preparing a plurality of transferring original plates; and
- a step of pressing said transferring original plate onto a one-side surface of the substrate for multi-layer printed-wiring board and releasing said electrically conductive substrate, thereby transferring said wiring pattern layer to said substrate;
- wherein the transferring step of said wiring pattern layer is sequentially repeated with the plurality of transferring original plates, thereby laying the plurality of said wiring pattern layers in lamination on said substrate.

A seventh feature of the present invention is a process for producing a multi-layer printed-wiring board, comprising:
- a step of forming on electrically conductive substrates respective wiring pattern layers, each having an electrically conductive layer and a sticky or adhesive, electrically insulating resin layer laid on said conductive layer, thereby preparing a plurality of transferring original plates; and
- a step of pressing said transferring original plate onto a one-side surface of the substrate for multi-layer printed-wiring board and releasing said electrically conductive substrate, thereby transferring said wiring pattern layer to said substrate;
- wherein before laying the wiring pattern layers one over another, an additional insulating layer is preliminarily formed on an overlapping-intended portion of wiring pattern layers in a lower wiring pattern layer, and said step of transferring said wiring pattern layer is sequentially repeated with the plurality of transferring original plates, thereby laying the plurality of said wiring pattern layers in lamination on said substrate.

An eighth feature of the present invention is a process for producing a multi-layer printed-wiring board, comprising:
- a step of forming on electrically conductive substrates respective wiring pattern layers, each having an electrically conductive layer and an adhesive layer laid on said conductive layer, thereby preparing a plurality of transferring original plates;
- a step of pressing a lower transferring original plate onto a one-side surface of the substrate for multi-layer printed-wiring board and releasing said electrically conductive substrate, thereby transferring said wiring pattern layer to said substrate;
- a step of forming an insulating photosensitive resin layer so as to cover said lower wiring pattern layer, pressing an upper transferring original plate onto said insulating photosensitive resin layer, and releasing said electrically conductive substrate, thereby transferring the upper wiring pattern layer to said resin layer; and
- a step of performing exposure and development of said insulating photosensitive resin layer with the upper wiring pattern layer transferred as a mask.

A ninth feature of the present invention is a process for producing a multi-layer printed-wiring board, comprising:
- a step of forming on electrically conductive substrates respective wiring pattern layers, each having an electrically conductive layer, thereby preparing a plurality of transferring original plates;
- a step of forming an adhesive insulating photosensitive resin layer on a one-side surface of the substrate for multi-layer printed-wiring board, pressing said transferring original plate onto said adhesive insulating photosensitive resin layer, and releasing said electrically conductive substrate, thereby transferring said wiring pattern layer to said substrate; and
- a step of performing exposure and development of said adhesive insulating photosensitive resin layer with said wiring pattern layer transferred as a mask,
- wherein the step of transferring the wiring pattern layer and the exposure and development step of the adhesive insulating photosensitive resin layer are sequentially repeated, thereby laying a plurality of said wiring pattern layers in lamination on said substrate for multi-layer printed-wiring board.

A tenth feature of the present invention is a process for producing a multi-layer printed-wiring board, comprising:
- a step of forming on electrically conductive substrates respective wiring pattern layers, each having an electrically conductive layer and an adhesive layer laid on said conductive layer, thereby preparing a plurality of transferring original plates;
- a step of pressing a lower transferring original plate onto a one-side surface of the substrate for multi-layer printed-wiring board and releasing said electrically conductive substrate, thereby transferring said wiring pattern layer to said substrate; and
- a step of forming an insulating photosensitive resin layer so as to cover the wiring pattern layer on said substrate, pressing an upper transferring original plate onto said insulating photosensitive resin layer, and releasing said electrically conductive substrate, thereby transferring the upper wiring pattern layer to said resin layer;
- which further comprises a step of sequentially repeating the step of transferring the upper wiring pattern layer to lay a multiplicity of wiring pattern layers in lamination on the substrate for multi-layer printed-wiring board, and thereafter performing exposure and development of said insulating photosensitive resin layer with said wiring pattern layers as a mask.

An eleventh feature of the present invention is a process for producing a multi-layer printed-wiring board, comprising:
- a step of forming on electrically conductive substrates respective wiring pattern layers, each having an electrically conductive layer, thereby preparing a plurality of transferring original plates; and
- a step of forming an adhesive insulating photosensitive resin layer onto a one-side surface of the substrate for multi-layer printed-wiring board, pressing said transferring original plate onto said adhesive insulating photosensitive resin layer, and releasing said electrically conductive substrate, thereby transferring said wiring pattern layer to said substrate;

which further comprises a step of sequentially repeating the step of transferring the upper wiring pattern layer to lay a multiplicity of wiring pattern layers in lamination on the substrate for multi-layer printed-wiring board, and thereafter performing exposure and development of said insulating photosensitive resin layer with said wiring pattern layers as a mask.

A twelfth feature of the present invention is a process for producing a printed-wiring board, comprising:

a step of forming a current-carrying film on a one-side surface of a substrate for printed-wiring board;

a step of forming a patterning layer having a predetermined wiring pattern on the current-carrying film and exposing said current-carrying film with a wiring pattern in which a plurality of lines each having a small linewidth are arranged in parallel;

a step of forming an electrically conductive layer on said current-carrying film exposed by electro-deposition; and a step of removing said patterning layer and further removing the current-carrying film exposed by etching.

A thirteenth feature of the present invention is a process for producing a printed-wiring board, comprising:

a step of forming a transferring original plate provided with a wiring pattern layer comprised of an electrically conductive layer and an adhesive layer by forming the electrically conductive layer on an electrically conductive substrate by electro-deposition with a wiring pattern in which a plurality of lines each having a small linewidth are arranged in parallel, and then forming the adhesive layer on the conductive layer by electro-deposition; and a step of pressing said transferring original plate onto a one-side surface of a substrate for printed-wiring board and releasing said electrically conductive substrate, thereby transferring said wiring pattern layer to said substrate.

A fourteenth feature of the present invention is a transferring original plate comprising an electrically conductive substrate at least a surface of which is electrically conductive, an electrically insulating masking layer of a desired pattern formed on the electrically conductive substrate, and an electrically conductive layer formed on said electrically conductive substrate and between regions of the insulating masking layer.

A fifteenth feature of the present invention is a transferring original plate comprising an electrically conductive substrate at least a surface of which is electrically conductive, an electrically insulating masking layer which is formed on the electrically conductive substrate so as to expose the electrically conductive surface of said conductive substrate in such a desired wiring pattern as a set of lines each having a small linewidth, and an electrically conductive layer formed by electro-deposition on said electrically conductive substrate and between regions of the insulating masking layer.

A sixteenth feature of the present invention is a process for producing a transferring original plate, comprising:

a step of forming an insulating masking layer in a desired pattern on an electrically conductive substrate at least a surface of which is electrically conductive; and a step of forming an electrically conductive layer on an exposed portion of the surface of said electrically conductive substrate by electro-deposition.

BEST MODE FOR CARRYING OUT THE INVENTION

First Embodiment

Figure 1:
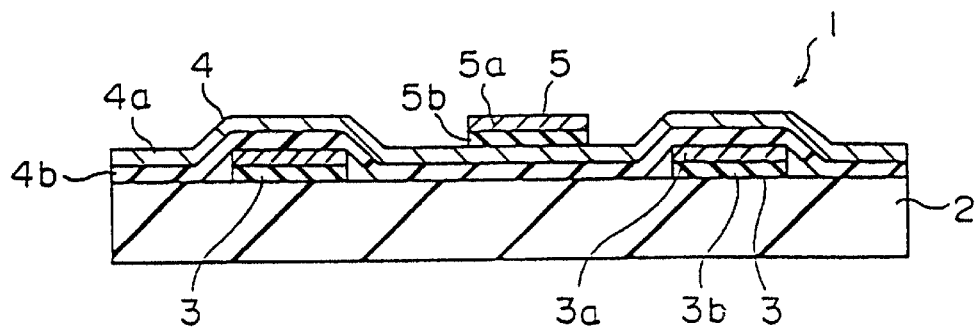
FIG. 1 is a schematic sectional view of a multi-layer printed-wiring board to show the first embodiment of the present invention.

The first embodiment of the present invention is described below referring to the drawings.

FIG. 1 is a schematic sectional view to show an example of the multi-layer printed-wiring board of the present invention. In FIG. 1, the multi-layer printed-wiring board 1 is provided with a substrate 2 for multi-layer printed-wiring board, a first layer of wiring pattern layer 3 formed on the substrate 2 for multi-layer printed-wiring board, a second layer of wiring pattern layer 4 laid on the wiring pattern layer 3, and a third layer of wiring pattern layer 5 further laid on the wiring pattern layer 4, and thus is a multi-layer printed-wiring board having the three-layer structure.

Each wiring pattern layer 3, 4, 5 constituting the multi-layer printed-wiring board 1 has an electrically conductive layer 3a, 4a, 5a and an electrically insulating resin layer 3b, 4b, 5b formed under the conductive layer. The multi-layer printed-wiring board 1 is of a superposition printing structure in which the wiring pattern layers 3, 4, 5 are sequentially transferred to be laid on the substrate 2 for multi-layer printed-wiring board or the lower wiring pattern layer, and in portions (intersecting portions) where the wiring pattern layers intersect with each other, electrical insulation between upper and lower wiring pattern layers is maintained by the insulating resin layer in the upper wiring pattern layer.

Therefore, the multi-layer printed-wiring board 1 of the present invention is formed in the absence of coating of an insulating layer over the entire wiring pattern, whereas the coating was observed in the conventional multi-layer printed-wiring boards, and the conductive layer 3a, 4a, 5a of each wiring pattern layer 3, 4, 5 is always exposed partially, whereby mutual connection between wiring pattern layers can be readily made in the intersecting portions of the wiring pattern layers or portions where the wiring pattern layers abut on each other (abutting portions), as described below.

The substrate 2 for multi-layer printed-wiring board, constituting the multi-layer printed-wiring board 1 of the present invention, may be one well known as a substrate for multi-layer printed-wiring board, such as a glass epoxy substrate, a polyimide substrate, an alumina ceramic substrate, or a composite substrate of glass epoxy and polyimide. The thickness of the substrate 2 is preferably in the range of from 5 to 1000 $\mu$m.

The thickness of each wiring pattern layer 3, 4, 5 is at most 100 $\mu$m, and preferably in the range of from 10 to 60 $\mu$m in order to permit the layer to ride across the lower wiring pattern layer without a defect in multilayer transfer as described below. Further, the thickness of the conductive layer 3a, 4a, 5a constituting each wiring pattern layer 3, 4, 5 is at least 1 $\mu$m, and preferably in the range of from 5 to 40 $\mu$m in order to suppress the electric resistance of the wiring pattern layer to a low level. Furthermore, the thickness of the insulating resin layer 3b, 4b, 5b is at least 1 $\mu$m, and preferably in the range of from 5 to 30 $\mu$m in order to maintain electrical insulation between the upper and lower wiring pattern layers in the intersecting portions, though the thickness depends on the insulating resin used. The linewidth of the wiring pattern layer 3, 4, 5 may be arbitrarily set above the minimum width of about 10 $\mu$m.

On a material for the conductive layer 3a, 4a, 5a there is no particular restriction as long as a thin film thereof can be formed by electro-deposition as described below; examples of the material that can be used are copper, silver, gold, nickel, chromium, zinc, tin, platinum, etc.

Further, a material for the insulating resin layer 3b, 4b, 5b may be any electro-depositing insulating substance that shows an adhesive property at ordinary temperature or when heated. For example, an anionic or cationic synthetic polymer resin with the adhesive property may be listed as a polymer used.

Specifically, the anionic synthetic polymer resin includes an acrylic resin, a polyester resin, a maleic acid oil resin, a polybutadiene resin, an epoxy resin, a polyamide resin, a polyimide resin, etc., used alone or in arbitrary combination thereof as a mixture. Further, the above anionic synthetic polymer resin may be used in combination with a cross-linking resin such as a melamine resin, a phenol resin, a urethan resin, etc.

On the other hand, the cationic synthetic polymer resin includes an acrylic resin, an epoxy resin, a urethan resin, a polybutadiene resin, a polyamide resin, a polyimide resin, etc., used alone or in arbitrary combination thereof as a mixture. Further, the above cationic synthetic polymer resin may be used in combination with a cross-linking resin such as a polyester resin, a urethan resin, etc.

Furthermore, in order to impart the adhesive property to the above polymer resin, an adhesion-imparting resin, for example, of a rosin type, a terpene type, or a petroleum resin type may be added thereto, as occasion demands.

The above polymer resin is used for the electro-deposition method in a solubilized-to-water state after neutralized with an alkaline or acidic substance or in a water-dispersed state in the production method of the present invention described below. Namely, the anionic synthetic polymer resin is neutralized with one from amines such as trimethylamine, diethylamine, dimethylethanolamine, diisopropanolamine, etc., or inorganic alkaline substances such as ammonia, caustic potash, etc. On the other hand, the cationic synthetic polymer resin is neutralized with one from acids such as acetic acid, formic acid, propionic acid, lactic acid, etc. Then, the polymer neutralized to be solubilized to water is used in a water-diluted state in either a water-dispersing type or a water-dissolving type.

In order to enhance the reliability, such as electrical insulation, heat resistance, etc., of the electro-depositing insulating substance to show the adhesive property, a conventional thermosetting resin having an unsaturated bond of the thermal polymerization type, for example, of block isocyanate may be added to the above polymer resin, and all the insulating resin layers may be cured by a thermal treatment after all the layers in the multi-layer printed-wiring board are formed by transfer. Of course, if a resin having a polymerizable unsaturated bond (for example, an acrylic group, a vinyl group, an allyl group, etc.) is added to the electro-depositing insulating substance, instead of the thermosetting resin, all the insulating resin layers can be cured by irradiation of electron rays after all the layers in the multi-layer printed-wiring board are formed by transfer.

In addition to the above materials, the material for the insulating resin layers may, of course, be a thermoplastic resin showing an adhesive property at ordinary temperature or when heated, and a thermosetting resin as being an adhesive resin which loses its adhesive property after cured. Further, in order to increase the strength of the coating layer, those containing an organic or inorganic filler may be used.

Furthermore, the material for the insulating resin layers 3b, 4b, 5b may be an electro-depositing adhesive to show fluidity at ordinary temperature or when heated.

Next, a process for producing the multi-layer printed-wiring board of the present invention is described referring to FIG. 2 to FIG. 5, using the production of the above multi-layer printed-wiring board 1 as an example.

Figure 3:
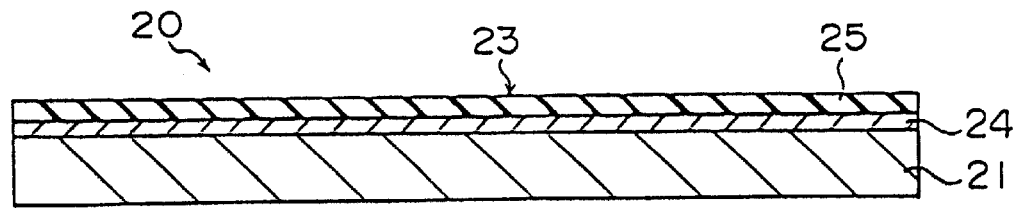
FIG. 3 is a schematic sectional view to show an example of a transferring original plate of the present invention, which is used in the process for producing the multi-layer printed-wiring board of the present invention.
Figure 4:
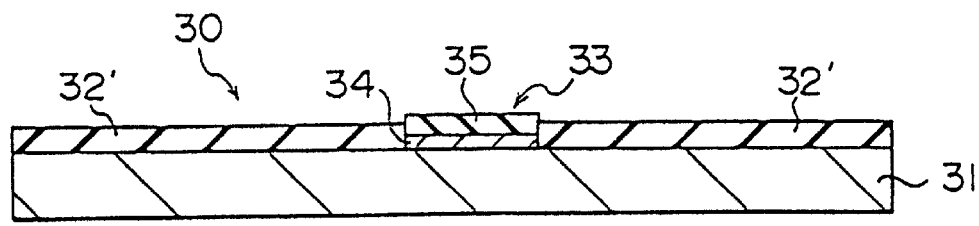
FIG. 4 is a schematic sectional view to show another example of the transferring original plate of the present invention, which is used in the process for producing the multi-layer printed-wiring board of the present invention.

First, in order to produce a transferring original plate of the present invention, a photoresist is laid on an electrically conductive substrate 11 as being a transferring substrate to form a photoresist layer 12 (FIG. 2(A)). Then, the photoresist layer 12 is subjected to shadow printing using a specific photomask and development to form an insulating masking layer 12', whereby wiring pattern portions 11a of the conductive substrate 11 are exposed (FIG. 2(B)). Then, a conductive layer 14 is formed by plating on the wiring pattern portions 11a of the conductive substrate 11 (FIG. 2(C)). Thereafter, a sticky or adhesive insulating resin layer 15 is formed on the conductive layer 14 by electro-deposition (FIG. 2(D)). Thus obtained is a transferring original plate 10 for wiring pattern layer, provided with the first layer of wiring pattern layer 13 having the conductive layer 14 and insulating resin layer 15. Formed in the same manner, as shown in FIG. 3 and FIG. 4, are a transferring original plate 20 for the second layer of wiring pattern layer and a transferring original plate 30 for the third layer of wiring pattern layer, each provided with an insulating masking layer 32' and a wiring pattern layer 23, 33 having a conductive layer 24, 34 and an insulating resin layer 25, 35 on a conductive substrate 21, 31.

Here, instead of the transferring original plate 10 shown in FIG. 2(D), a transferring original plate 10 shown in FIG. 2(E) may be used. Namely, as shown in FIG. 2(E), a releasing resin layer 12a is provided on surfaces of the conductive substrate 11 and the insulating masking layer 12'. The releasing resin layer 12a may be made of one of a silicone resin, a polyimide resin, a Teflon resin, etc., among which the silicone resin is preferably used when releasability from an adhesive is particularly taken into consideration. Either one of a thermo-setting silicone resin, an ultraviolet-curing silicone resin, and an electron-radiation-curing silicone resin may be used as the silicone resin. The thickness of the releasing resin layer is preferably in the range of from about 0.005 to 0.1 µm. If the thickness of the releasing resin layer 12a is less than 0.005 µm, for example, breakage of the releasing resin layer 12a by external force would occur, whereby protection of the insulating masking layer 12' becomes inadequate. On the other hand, if the thickness of the releasing resin layer 12a exceeds 0.1 µm, no electro-depositing material would be formed in a recess portion, or the shape of the recess portion would change, which is not preferred. A method for forming the releasing resin layer 12a may be one of a method in which curing is effected after coating by the pouring method; the spin coating; the roll coating, etc.

Next, the above transferring original plate 10 for wiring pattern layer is pressed onto the substrate 2 for multi-layer printed-wiring board so as to bring the insulating resin layer 15 into contact with the substrate 2. This pressing is effected by either of roller pressing, plate pressing, vacuum pressing, etc. Further, if the insulating resin layer is made of an insulating resin which shows the sticky or adhesive property when heated, thermal pressing may be employed. Then, the conductive substrate 11 is released so as to transfer the wiring pattern layer 13 onto the substrate 2, whereby the first layer of wiring pattern layer 3 having the conductive layer 3a and the insulating resin layer 3b is formed on the substrate 2 (FIG. 5(A)). Then, after achieving alignment of the transferring original plate 20 for the second layer of wiring pattern layer with the first layer of wiring pattern layer, the wiring pattern layer is similarly transferred onto the substrate 2, on which the first layer of wiring pattern layer 3 was transfer-formed, thereby forming the second layer of wiring pattern layer 4 having the conductive layer 4a and the insulating resin layer 4b (FIG. 5(B)). Further, onto the substrate 2, on which the first layer of wiring pattern layer 3 and the second layer of wiring pattern layer 4 were transfer-formed, another wiring pattern layer is transferred after achieving alignment using the transferring original plate 30 for the third layer of wiring pattern layer in the same manner, thereby forming the third layer of wiring pattern layer 5 having the conductive layer 5a and the insulating resin layer 5b (FIG. 5(C)).

As described above, since the lamination of the wiring pattern layers 3, 4, 5 is effected by transferring the wiring pattern layers 13, 23, 33 of the transferring original plates 10, 20, 30 for wiring pattern layers sequentially to the substrate, the multi-layer printed-wiring board 1 is of the so-called superposition printing structure composed of the wiring pattern layers 3, 4, 5.

Here, in the above example, the transferring original plate 10, 20, 30 for wiring pattern layer is composed of the conductive substrate 11, 21, 31, the insulating masking layer 12', 32' made of the photoresist, the conductive layer 14, 24, 34, and the sticky or adhesive insulating resin layer 15, 25, 35 formed on the conductive layer 14, 24, 34, but the transferring original plate 10 for the first layer of wiring pattern layer may be one without the insulating resin layer 15. In this case, the first layer of wiring pattern layer can be transferred onto the substrate 2 if an insulating sticky layer or adhesive layer is preliminarily formed on the substrate 2 for multi-layer printed-wiring board.

Now, another embodiment of the transferring original plates of the present invention is described.

Figure 6:
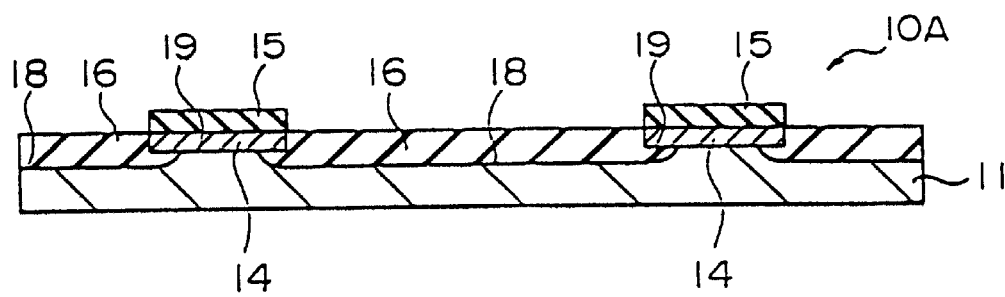
FIG. 6 is a schematic sectional view to show another embodiment of the transferring original plate of the present invention.

FIG. 6 is a schematic diagram of an intaglio type transferring original plate which is an embodiment of the transferring original plates according to the present invention. In FIG. 6, a transferring original plate 10A is provided with the conductive substrate 11 at least the surface of which shows electrical conductivity, recess portions 18 formed in the conductive substrate 11 by etching, and an insulating masking layer 16 made of an insulating substance and formed in the recess portions 18. The insulating masking layer 16 is so formed that the surface thereof projects by a predetermined height from the surface of the conductive substrate 11. Intaglio portions surrounded by the adjacent insulating masking layer 16 form conductive layer forming portions 19. Since the top surface of recess portion 18 has a wide dishing shape due to the side etching effect upon etching, a conductive layer forming portion 19 is so constructed that the surface of the conductive substrate 11 is exposed in the center of the bottom surface of the conductive layer forming portion 19 and that the edge portion thereof is comprised of the insulating masking layer 16. The conductive-surface-exposing portion in the center of the bottom surface becomes a starting electrode to form the conductive layer 14 in the conductive layer forming portion 19, and the sticky or adhesive insulating resin layer 15 is formed on the conductive layer 14.

Figure 7:
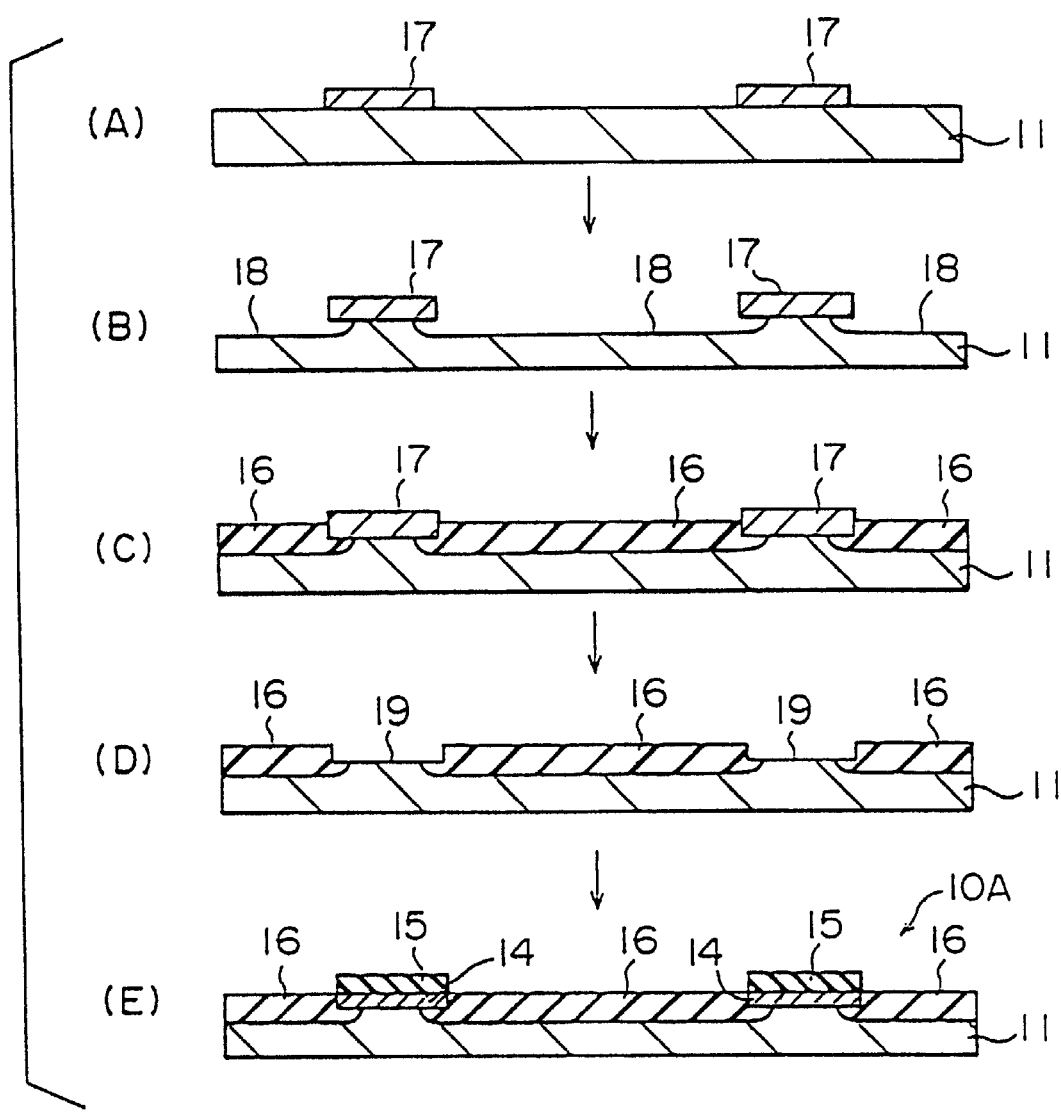
FIG. 7 is a drawing to illustrate a process for producing the transferring original plate as shown in FIG. 6.

FIG. 7 is an explanatory drawing of a process for producing the intaglio type transferring original plate as shown in FIG. 6. In FIG. 7, a photoresist layer is first formed on the conductive substrate 11 by a conventional method, and the photoresist layer is irradiated with ultraviolet rays through a photomask having a predetermined pattern, followed by exposure and removal (development) to form a masking layer 17 for etching having a predetermined pattern (FIG. 7(A)). Next, portions in which no masking layer is formed on the conductive substrate 11 are etched with the etching masking layer 17 as a mask for etching to form the recess portions 18, and on this occasion etching proceeds into substrate portions below the edges of the etching masking layer 17 to form side etching portions. The area of the top surface of a recess portion 18 including the side etching portions is formed to be larger than that of a portion in which no masking layer is formed, whereby the recess portion 18 becomes of the dishing shape (FIG. 7(B)).

Then, the insulating masking layer 16 is formed by electro-deposition of an insulating substance in the recess portions 18 thus formed in the dishing shape (FIG. 7(C)). The surface of the insulating masking layer 16 is formed substantially at the same height as the height of the etching masking layer 17. Thereafter, the etching masking layer 17 is removed to expose the conductive surface of the conductive substrate 11 to form the intaglio type conductive layer forming portions 19 (FIG. 7(D)). Then, after forming the conductive layer 14 by electro-deposition in the conductive layer forming portions 19, the sticky or adhesive insulating resin layer 15 is formed on the conductive layer 14 by electro-deposition to obtain the transferring original plate 10A of the present invention (FIG. 7(E)).

In the above-described transferring original plate 10A, the conductive layer 14 isotropically grows in the horizontal and vertical directions with the center portions of the recess conductive layer forming portions 19 as a starting electrode, whereby the conductive layer 14 is so formed that the surface thereof becomes substantially uniform and flat. Further, the conductive layer 14 is in contact with the conductive substrate 11 only at a part of the bottom surface thereof, so that adhesion to the conductive substrate 11 can be reduced by that extent, whereby the conductive layer 14 can be easily pulled out upon transferring without influence of contact peeling force on the insulating masking layer 16. Furthermore, because the conductive layer 14 is formed in the conductive layer forming portions 19 after removing the etching masking layer 17, the area of the final wiring pattern becomes the same as that of the pattern of the etching masking layer 17, which is the initial etching resist pattern. Thus, as long as the etching masking layer 17 is formed in a predetermined fine pattern, the conductive layer 14 can be formed in the same pattern to obtain a wiring pattern at high dimensional accuracy without a need of dimensional adjustment.

Figure 8:
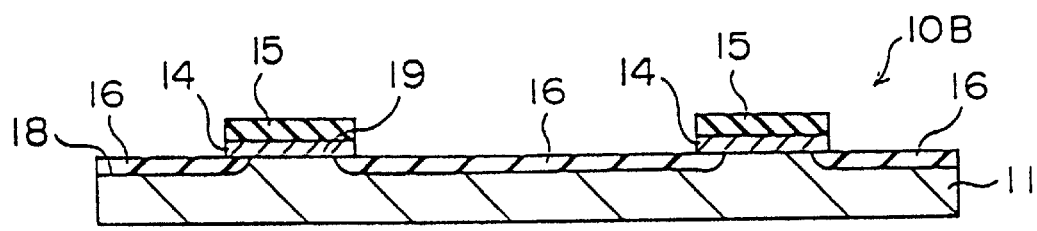
FIG. 8 is a schematic sectional view to show another embodiment of the transferring original plate of the present invention.

FIG. 8 is a schematic diagram of a lithography type electro-deposition transferring original plate, which is another embodiment of the transferring original plates according to the present invention. In FIG. 8, a transferring original plate 10B is provided with the conductive substrate 11 at least the surface of which shows electrical conductivity, the recess portions 18, which are formed by etching in the dishing shape with a wide area of top surface, on the conductive layer 11, and the insulating masking layer 16 made of an insulating substance and formed in the recess portions 18. The insulating masking layer 16 is so formed that the surface thereof is substantially at the same height as the surface of the conductive substrate 11. The conductive surface exposing portions surrounded by the adjacent insulating masking layer 16 form conductive layer forming portions 19. Here, since the recess portions 18 are of the dishing shape having the wide top surface by the side etching effect upon etching, the conductive layer forming portions 19 are so constructed that the centers of the bottom surfaces thereof are conductive-surface-exposing portions of the conductive layer forming portions 19 and that the edge portions are the insulating masking layer 16. Further, with the conductive surface exposing portions narrowed in the centers of the bottom surfaces as a starting electrode an electro-deposition substance is made to be deposited, so that the conductive layer 14 is isotropically formed in the horizontal and vertical directions on the conductive layer forming portions 19. Further, the sticky or adhesive insulating resin layer 15 is formed on the conductive layer 14 by electro-deposition.

Figure 9:
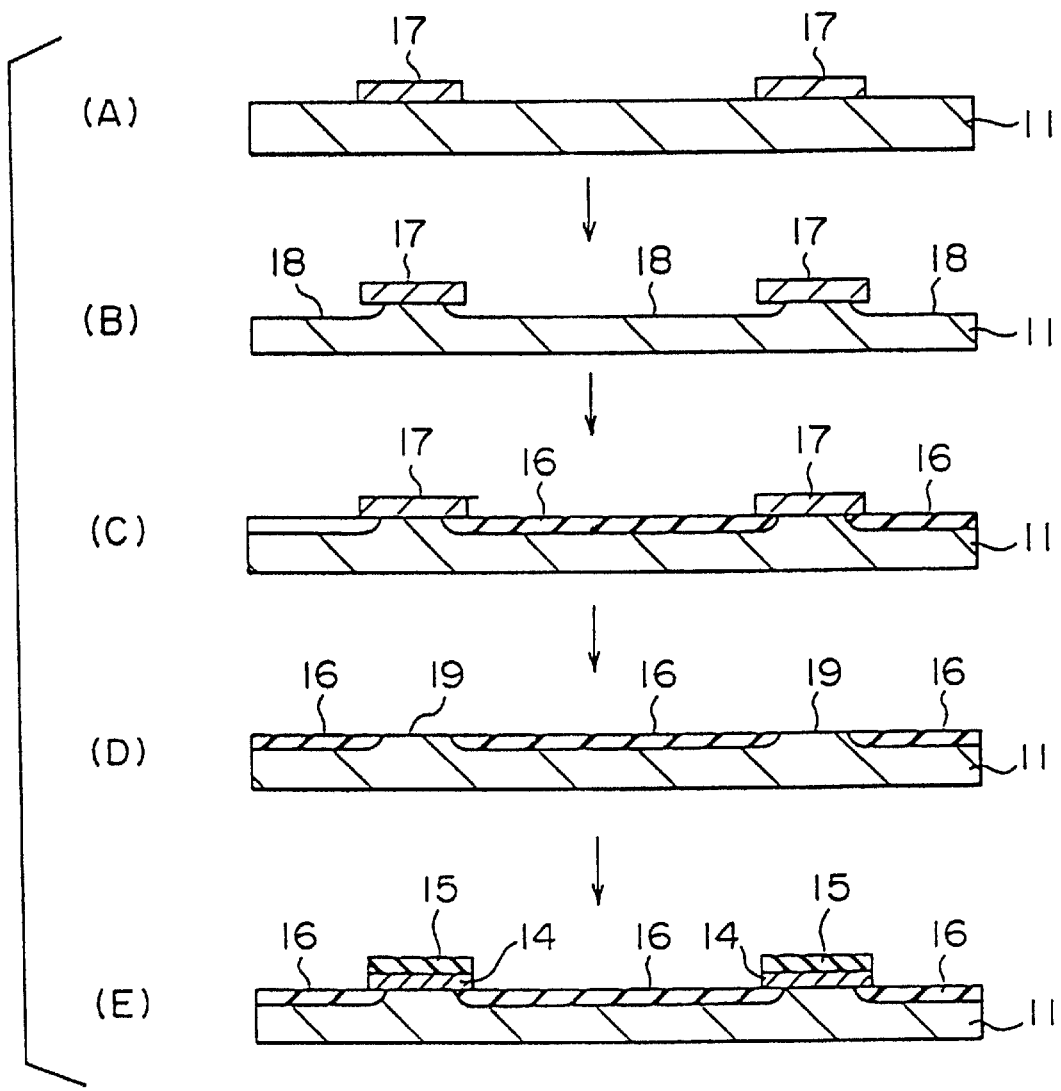
FIG. 9 is a drawing to illustrate a process for producing the transferring original plate as shown in FIG. 8.

FIG. 9 is an explanatory drawing of a process for producing the lithography type transferring original plate 10B as shown in FIG. 8. In FIG. 9, a photoresist layer is formed on the conductive substrate 11 in the same manner as in FIG. 7, and the photoresist layer is irradiated with ultraviolet rays through a photomask having a predetermined pattern, followed by exposure and removal (development) to form the etching masking layer 17 having the predetermined pattern (FIG. 9(A)). Next, the portions in which no masking layer is formed in the conductive substrate 11 are etched to form the recess portions 18 with the etching masking layer 17 as a mask for etching. As in FIG. 7, etching proceeds into the substrate portion at the edges of the etching masking layer 17 to form side etching portions, and the area of the top surface of a recess portion 18 including the side etching portions is formed as larger than that of a portion in which no masking layer is formed, whereby the recess portions 18 are of the dishing shape (FIG. 9(B)).

Next, the insulating masking layer 16 is formed by electro-deposition of the insulating substance in the recess portions 18 thus formed in the dishing shape (FIG. 9(C)), and the insulating masking layer 16 is formed substantially at the same height as the conductive substrate 11 in the lithography type original plate. Thereafter, the etching masking layer 17 is removed to expose the conductive surface of conductive substrate 11 to form the conductive layer forming portions 19 (FIG. 9(D)). After forming the conductive layer 14 by electro-deposition in the conductive layer forming portions 19, the sticky or adhesive insulating resin layer 15 is formed on the conductive layer 14 by electro-deposition, thereby obtaining the transferring original plate 10B of the present invention (FIG. 9(E)).

In the transferring original plate 10B, the conductive surface exposing portions of the conductive layer forming portions 19 are narrowed by the wide portions of the side etching portions in the insulating masking layer 16, and the electro-deposition substance isotropically grows in the horizontal and vertical directions on the substrate with the narrowed conductive surface exposing portions as a starting electrode, whereby the conductive layer 14 is so formed that the surface thereof is substantially uniform and flat. Here, because the conductive layer 14 is in contact with the conductive substrate 11 only at a part of the bottom surface and adhesion to the conductive substrate 11 can be reduced by that extent, the conductive layer 14 is readily peeled off upon transferring, without influence of contact peeling force on the insulating masking layer 16. Further, because of the structure of the plate, the insulating resin layer 15 and the conductive layer 14 are preferentially and selectively pressed to bond to the substrate 2 upon transferring, whereby the insulating masking layer 16 is free from the contact peeling force, so that the insulating masking layer 16 is free from deformation and damage.

Figure 10:
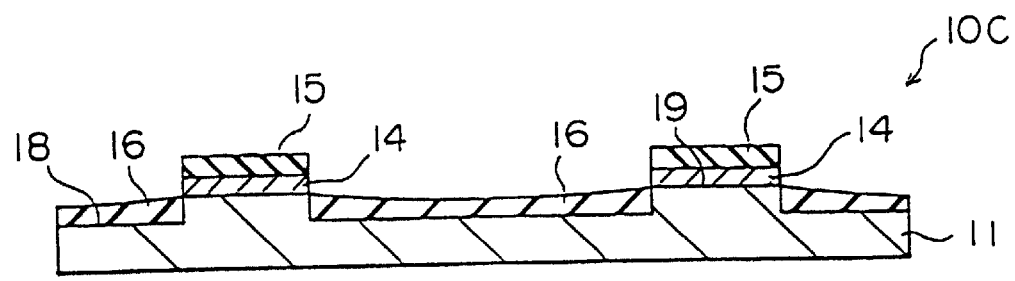
FIG. 10 is a schematic sectional view to show another embodiment of the transferring original plate of the present invention.

FIG. 10 shows a schematic diagram of a letterpress type transferring original plate, which is another embodiment of the transferring original plates according to the present invention. In FIG. 10, a transferring original plate 10C is provided with the conductive substrate 11 at least the surface of which shows electrical conductivity, the recess portions 18 formed on the conductive substrate 11, and the insulating masking layer 16 made of an insulating substance and formed in the recess portions 18. The insulating masking layer 16 is so formed that the surface thereof is a predetermined height lower than the surface of the conductive substrate 11. The conductive surface exposing portions in the conductive substrate 11 surrounded by the adjacent insulating masking layer 16 are conductive layer forming portions 19; the conductive layer 14 is formed on the conductive layer forming portions 19; and the sticky or adhesive insulating layer 15 is formed on the conductive layer 14.

Figure 11:
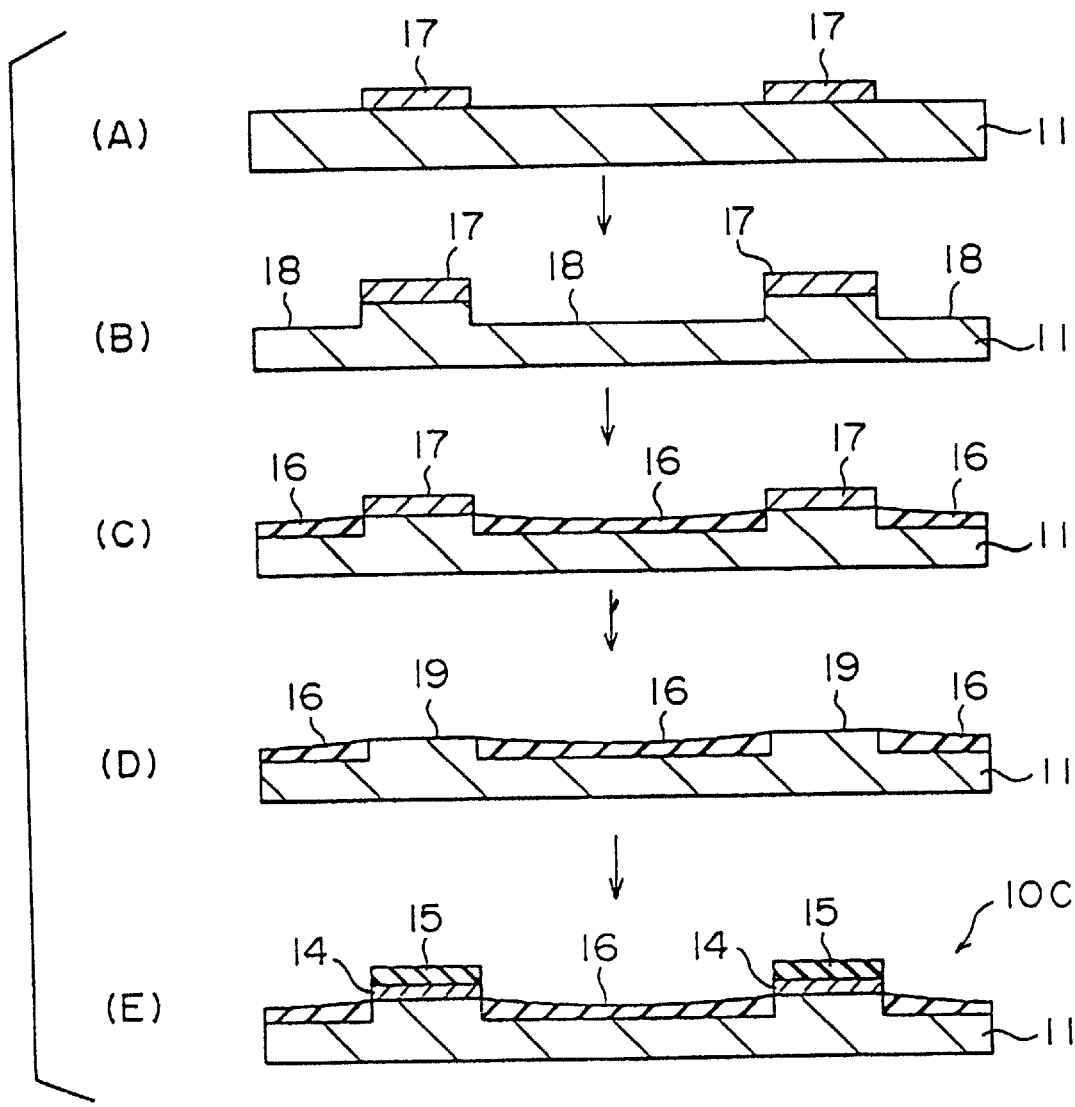
FIG. 11 is a drawing to illustrate a process for producing the transferring original plate as shown in FIG. 10.

FIG. 11 is an explanatory drawing of a process for producing the letterpress type transferring original plate 10C as shown in FIG. 10. In FIG. 11, a photoresist layer is formed on the conductive substrate 11 by a conventional method, and the photoresist layer is irradiated with ultraviolet rays through a photomask having a predetermined pattern, followed by exposure and removal (development) to form the etching masking layer 17 having a predetermined pattern (FIG. 11(A)). Next, portions in which no masking layer is formed in the conductive substrate 11 are etched with the etching masking layer 17 as a mask for etching to form the recess portions 18 as faithful to the mask pattern (FIG. 11(B)).

Next, the insulating masking layer 16 is formed by electro-deposition of an insulating substance in the recess portions 18 thus formed (FIG. 11(C)). The surface of the insulating masking layer 16 is so formed as to become lower than the surface of the etching masking layer 17. Thereafter, the etching masking layer 17 is removed, so that the conductive surface of the conductive substrate 11 is exposed to obtain the conductive layer forming portions 19 (FIG. 11(D)). Then, the conductive layer 14 is formed by electrodeposition on the conductive layer forming portions 19, and the sticky or adhesive insulating resin layer 15 is formed on the conductive layer 14, thereby obtaining the transferring original plate 10C of the present invention (FIG. 11(E)).

Since the surface of the insulating masking layer 16 is so formed as to become lower than the surface of the conductive substrate 11 in the above-described transferring original plate 10C, the insulating masking layer 16 is in no contact with the substrate 2 for multi-layer printed-wiring board upon transferring. Accordingly, the insulating masking layer 16 is free from influence of contact peeling force, thereby being free from deformation and damage. Further, since the conductive layer 14 is formed on the conductive layer forming portions 19 after removing the etching masking layer 17, the area of the final wiring pattern is the same as that of the pattern of the etching masking layer 17, which is the initial etching resist pattern. Thus, as long as the etching masking layer 17 is formed in a predetermined fine pattern, the conductive layer 14 can be formed exactly in accordance with the pattern, whereby the wiring pattern can be obtained at high dimensional accuracy without a need of dimensional adjustment.

In the transferring original plates according to the present invention, the conductive substrate 11, 21, 31 may be made of any material at least having a surface to show electrical conductivity, for example, a conductive metal plate of aluminum, copper, nickel, iron, stainless steel, or titanium; or a conductive thin film formed on the surface of an insulating substrate, such as a glass plate or a resin film of a polyester, a polycarbonate, a polyimide, a polyethylene, or an acrylic resin. The thickness of such a conductive substrate 11, 21, 31 is preferably in the range of about 0.05 to 1.0 mm. Further, in order to increase the plate wear of the original plate, a thin film of a material such as chromium (Cr) or ceramic Kanigen (Ni+P+SiC manufactured by Kanigen) may be formed on the surface of the conductive substrate. The thickness of the thin film is preferably in the range of about 0.1 to 1.0 $\mu$m.

The etching masking layer 17 is formed, for example, by one of various thin-film-forming methods such as the ion plating method; the vacuum deposition method, the sputtering method, the chemical vapor deposition method (CVD method), etc., in which a thin layer with high electrical insulation, such as a silica ($SiO_2$) thin film, a silicon nitride ($SiN_x$) thin film, a 96% alumina thin film, a beryllia thin film, a forsterite thin film, etc. is formed on the substrate, and then a photoresist is laid on the thin film, followed by exposure through a mask having a predetermined pattern, development, etching, and peeling-off of resist. Alternatively, a masking layer may be formed by coating the conductive substrate 11 with a photoresist, without forming the thin film. The photoresist used in forming the etching masking layer 17, may be a material obtained by adding a photosensitive material such as dichromate to gelatin, casein, or a polyvinyl alcohol, etc. The thickness of the etching masking layer 17 thus formed is preferably in the range of about 0.5 to 10.0 $\mu$m.

Further, etching of the conductive substrate 11 with the etching masking layer 17 as an etching mask, may be performed by a conventional means well known, for example, wet etching such as dipping, spraying, etc. or dry etching. For example, when the conductive substrate is a SUS plate, etching is preferably performed by contact with a solution of ferric chloride (dipping); and when the conductive substrate is a Ti plate, etching is preferably performed by contact with a solution of $HF$—$H_2O_2$—$H_2O$. Furthermore, in the case of the Ti plate, it may be further immersed for about a few ten seconds in an $HF$—$NH_4F$ solution or an HF solution after etching, thereby further roughening the surfaces of the recess portions. This procedure can further improve the fixing property into the recess portions, of the insulating substance to be formed by electro-deposition in the recess portions 18.

The insulating masking layer 16 is of an electro-depositing material composed of an insulating substance. The electro-depositing material for insulating pattern is generally comprised of an organic material (polymeric material), and the original form thereof is well known as electro-deposition coating. The electro-deposition coating includes cationic electro-deposition and anionic electro-deposition depending on the electrochemical reaction with the main electrode. Classification depends upon whether the electro-depositing material exists as a cation or behaves as an anion. As the organic polymer used in the electro-deposition, there are organic polymer materials such as natural fats and fatty oils, synthetic fats and fatty oils, alkyd resins, polyester resins, acrylic resins, epoxy resins, polyimide resins, etc. As those of the anion type, maleic oil and polybutadiene resins have been known for long, and curing of the electro-depositing material is effected by oxidative polymerization. Epoxy resins are the majority in the cation type, and one of them can be used singly or after modified. In addition, so-called polyamide type resins such as melamine resins, acrylic resins, etc. are often used, and a strong insulating layer can be formed by heat-curing or photo-curing thereof.

In order to improve the releasability in particular, those obtained by introducing fluorine to the above resins or dispersing fluorine polymer particles in the above resins are preferably used. As the fluorine resins, tetrafluoroethylene dispersing type electro-depositing resins or electro-depositing resins of a type in which fluorine is bonded to the acryl main chain or side chain, are particularly preferably used. Fluorine acrylic resins (PAFC) may be exemplified as the tetrafluoroethylene dispersing type electro-deposition resins, and fluoroolefin-vinyl ether copolymers having fluorine in the main chain may be exemplified as the electro-depositing resins of the type in which fluorine is bonded to the acryl main chain. Further, in order to increase the strength of the coating layer, it is preferred to form an eutectoid of a thermosetting melamine resin and to thermally treat it.

Next described is connection in the intersecting portion or the abutting portion between wiring pattern layers in the multi-layer printed-wiring board according to the present invention.

Figure 12:
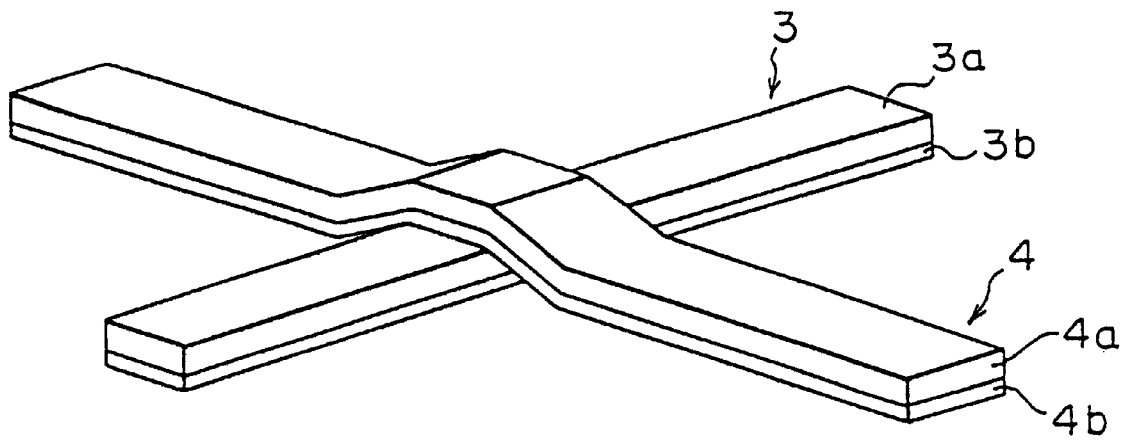
FIG. 12 is a perspective view to show an intersecting portion of wiring pattern layers in the multi-layer printed-wiring board of the present invention.
Figure 13:
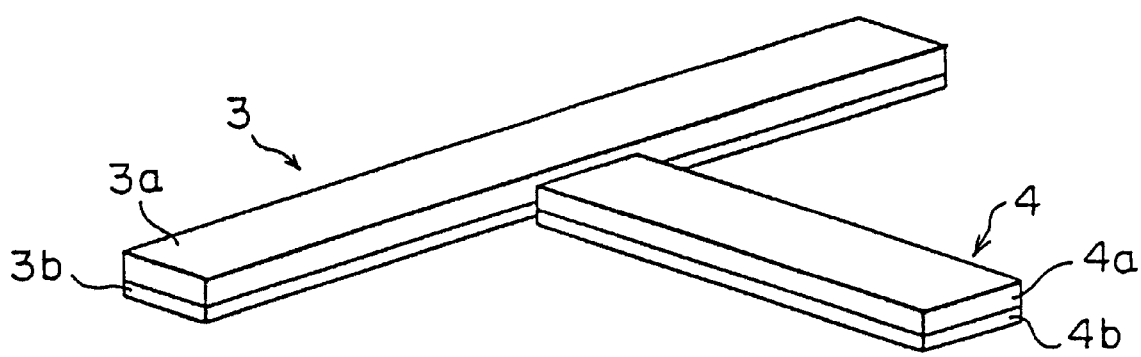
FIG. 13 is a perspective view to show an abutting portion of wiring pattern layers in the multi-layer printed-wiring board of the present invention.

FIG. 12 is a perspective view to show the intersecting portion of the wiring pattern layer 3 and wiring pattern layer 4 constituting the multi-layer printed-wiring board 1. As shown in FIG. 12, the conductive layer in each wiring pattern layer is always partially exposed, and electrical insulation between the wiring pattern layer 3 and wiring pattern layer 4 in the intersecting portion is maintained by the insulating resin layer 4b constituting the wiring pattern layer 4, which is an upper layer. Further, since the conductive layer in each wiring pattern layer is always partially exposed, connection between the wiring pattern layers can easily be made in the intersecting portion of the wiring pattern layers, or a portion where the wiring pattern layers come to abut on each other as shown in FIG. 13 (an abutting portion, where the wiring pattern layer 3 and wiring pattern layer 4 abut on each other in the example as illustrated).

For the connection in the intersecting portion or the abutting portion of the wiring pattern layers as described above, there may be listed (1) a lift-off method, (2) a printing method, (3) a dispensing method, (4) an ultra-fine-particles-spraying method, (5) a laser patterning method, (6) a selective electroless plating method, (7) a selective vapor deposition method, (8) a welding method, (9) a wire bonding method, (10) a one-shot method using a wire bonding apparatus, (11) a laser plating method, (12) a batch transferring method of a laminate of a conductive body and a solder plating layer, (13) a metal-bulk inserting method, and (14) an electroless plating method.

Figure 14:
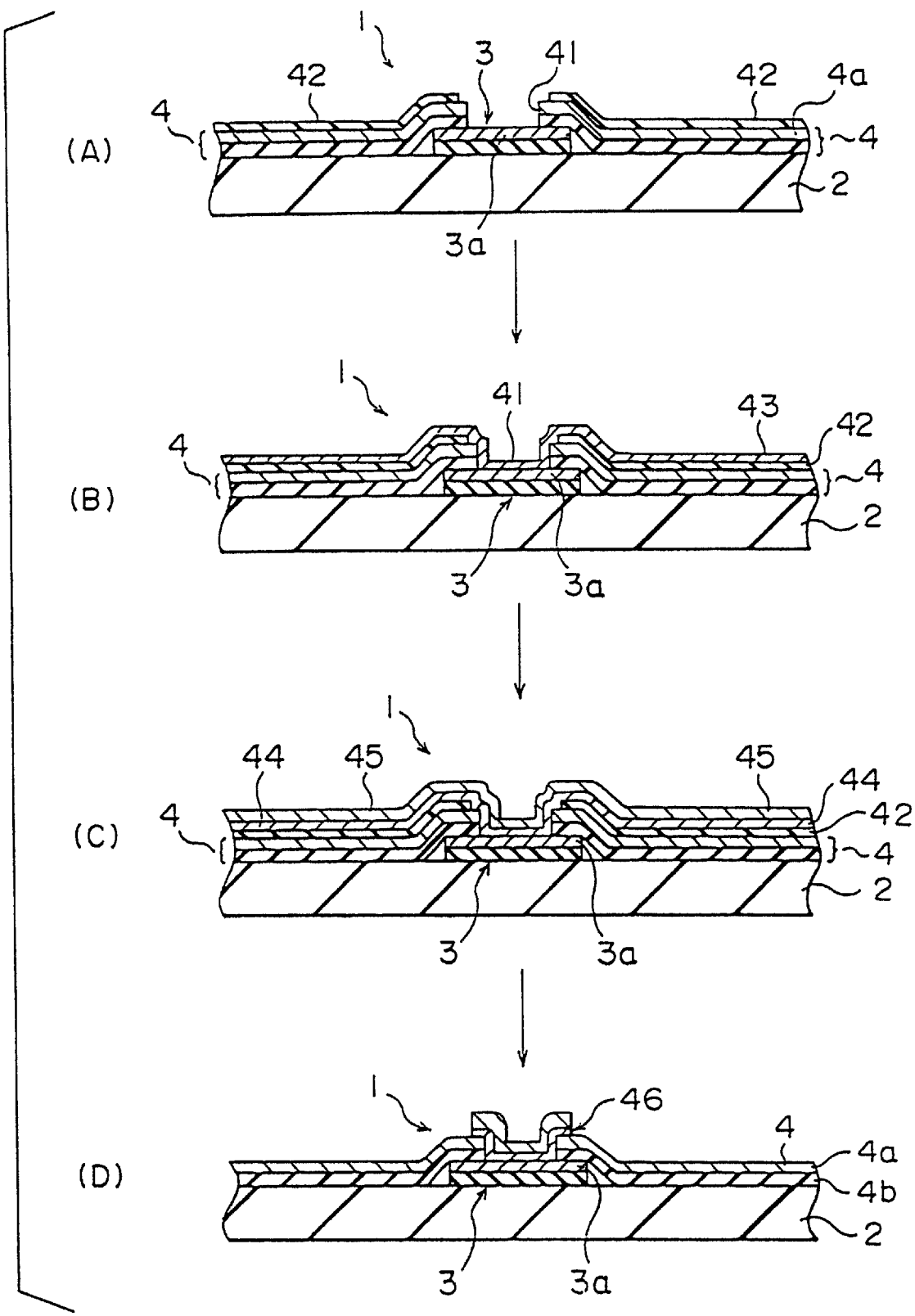
FIG. 14 is a drawing to illustrate a method for connecting two wiring pattern layers with each other in the multi-layer printed-wiring board of the present invention.
Figure 15:
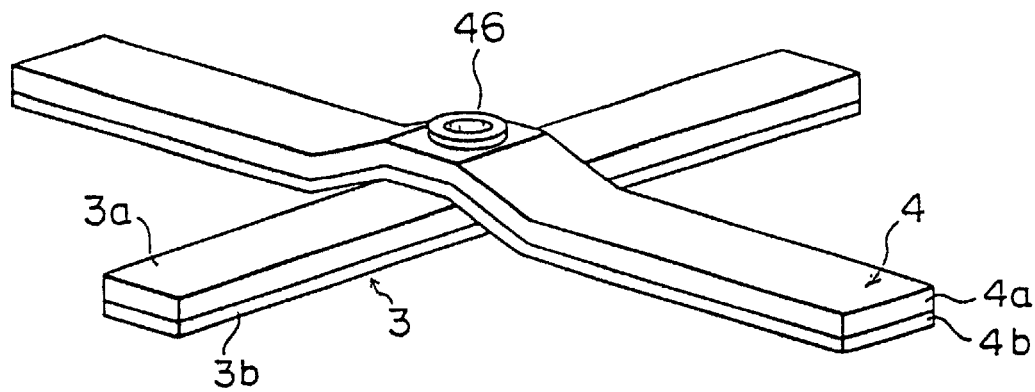
FIG. 15 is a perspective view to show a connecting state in the intersecting portion of the wiring pattern layers in the multi-layer printed-wiring board of the present invention.

FIG. 14 is an explanatory drawing to illustrate an example of the connection method in the intersecting portion of the multi-layer printed-wiring board 1, based on (1) the above lift-off method. First, the wiring pattern layer 4, in which a through hole pattern 41 penetrating a position to become an intersecting portion is preliminarily formed, is transferred onto the wiring pattern layer 3 to form the multi-layer printed-wiring board 1, and a photoresist (not shown) is laid on the multi-layer printed-wiring board 1 to form a photoresist layer. Then, the photoresist layer is subjected to shadow printing with a predetermined photomask and development, whereby a resist layer 42 is so formed that the conductive layer 4a around the through hole 41 in the intersecting portion is slightly exposed (FIG. 14(A)). Then, an electroless plating catalyst is laid on the multi-layer printed-wiring board 1 to form a catalyst layer 43 (FIG. 14(B)). Thereafter, a conductive substance is precipitated on the catalyst layer 43 by electroless plating to form a conductive layer 44, and then a conductive film 45 is formed by a plating method with the conductive layer 44 as an electrode (FIG. 14(C)). Then, the resist layer 42 is peeled and lifted off, thereby forming a junction portion 46 in the through hole 41 (FIG. 14(D)). FIG. 15 is a perspective view to show a state that the conductive layer 3a in the wiring pattern layer 3 and the conductive layer 4a in the wiring pattern layer 4 are thus connected with each other by the junction portion 46 as described above.

Connection in the intersecting portion or the abutting portion of the wiring pattern layers in the multi-layer printed-wiring board 1 by (2) the above printing method is made in such a manner that a conductive paste or solder is fixed by printing so as to bestride the conductive layers 3a, 4a constituting the respective wiring pattern layers 3, 4, thereby forming a junction portion. There is no particular limitation as to the printing method to be used, but a preferred method is screen printing, which is generally suitable for printing of thick film and which is frequently used in the fields of electronic industries. When the screen printing is employed, a screen printing plate which has openings at portions corresponding to the connecting portions between lines, is preliminarily formed and is placed on the multi-layer wiring board as aligned thereon, followed by printing with a conductive paste ink such as a silver paste.

Further, connection in the intersecting portion or the abutting portion of the wiring pattern layers in the multi-layer printed-wiring board 1 by (3) the above dispensing method is made in such a manner that a conductive ink is jet-sprayed through a fine nozzle to directly write and form a junction portion between the conductive layers 3a, 4a in the wiring pattern layers 3, 4, which is similar to the above printing method. Specifically, the method can use a dispenser with a needle-like jet-spraying port, which is generally used for depositing a small amount of an adhesive or the like on a desired portion. Further, depending on the viscosity of the conductive ink used, an ink jet process, which is used in output apparatus of computers etc., can be used.

The above ultra fine particles-spraying method (4) is such a method that ultra fine particles are conveyed as entrained on a high-speed air current to be sprayed to the multi-layer printed-wiring board 1 through a fine nozzle provided near the multi-layer printed-wiring board 1, whereby the ultra fine particles and the multi-layer printed-wiring board 1 are mutually sintered to form a film by energy of collision between them. A method called as a gas deposition method may be used. An apparatus to be used in the method is basically provided with two vacuum tanks of high vacuum and low vacuum and a connecting pipe to connect the vacuum tanks with each other. The ultra fine particles are formed by the vacuum evaporation method in the low vacuum tank into which an argon gas or the like is introduced, and the substrate is placed in the high-vacuum tank. The above connecting pipe has an opening portion near the portion where the ultra fine particles are generated in the lower-vacuum tank, and the other opening portion near the multi-layer printed-wiring board 1 in the high-vacuum tank and in the direction perpendicular to the wiring board. Each vacuum tank is maintained at a constant pressure by an associated vacuum exhausting system, whereby a high-speed air current (a gas current), flowing from the low-vacuum tank to the high-vacuum tank, appears in the connecting pipe because of a difference in the pressure between the tanks, and the ultra fine particles generated in the low-vacuum tank are conveyed to the high-vacuum tank side as entrained on the air current to collide with the wiring pattern layers 3, 4 in the multi-layer printed-wiring board 1 so as to become mutually sintered to form a film. By employing this method with a metal such as gold, silver, copper, or nickel as a base material, a conductive body (a junction portion) can be selectively formed in any portion where connection between the conductive layers 3a, 4a in the wiring pattern layers 3, 4 is desired.

The above laser patterning method (5) is such a method that a solution in which conductive fine particles are dispersed is laid on the multi-layer printed-wiring board; that a desired portion of the coating is heated by laser to decompose or evaporate a resin binder; and that the conductive fine particles are precipitated and agglomerated in the heated portion to selectively form a conductive body. As the solution, a solution with conductive fine particles of gold or silver dispersed in a polyester resin or an acrylic resin, is used, for example, and fine lines of about a few ten $\mu$m can be written by irradiation with a focused argon laser.

The above selective electroless plating method (6) can employ the selective electroless plating technique, which is generally known as a photoforming method. This technique is such a method that a photosensitive material layer containing a metal in an oxide state, which is reducible and is a catalyst for electroless plating, is formed on the multi-layer printed-wiring board, and the photosensitive material layer is subjected to selective exposure to precipitate metal particles to become a catalyst for electroless plating, and then is immersed in an electroless plating solution to effect selective plating only in exposed portions.

Further, the above selective vapor deposition method (7) employs the selective film, deposition technique which is one of the thin film forming techniques. Namely, an organic metal gas containing a conductive element such as a metal, carbon, and so on, or a vapor of an organic material containing a conductive element is introduced into a vacuum tank; the gas or vapor is let to be adsorbed on the surface of the multi-layer printed-wiring board 1 disposed in the vacuum tank; a laser or an ion beam is condensed or converged to irradiate the substrate; the gas or vapor adsorbed thereon is decomposed by heat or collision energy; and thereby the conductive material such as a metal or carbon is deposited on the multi-layer printed-wiring board 1. Such a selective vapor deposition method is under practical use as a wiring correction technique for LSI. Specifically, available techniques include the techniques of decomposing an organic metal gas containing chromium, cobalt, platinum, tungsten, etc. by a condensed argon laser beam to deposit the metals on a desired portion to be corrected, and the techniques of decomposing a vapor of an organic material, for example, pyrene by a gallium ion beam to form a carbon film deposit.

Further, the above welding method (8) is such a method that the intersecting portion of the wiring pattern layers 3, 4 is selectively heated by laser to melt and evaporate the insulating resin layer 4b (the insulating resin layer 4b constituting the upper layer) existing between the conductive layers 3a, 4a in the upper and lower wiring pattern layers 3, 4 and also to heat the conductive layers 3a, 4a themselves, whereby the conductive layers 3a, 4a constituting the respective wiring pattern layers are mutually welded to form a junction portion, thereby effecting connection.

Figure 20:
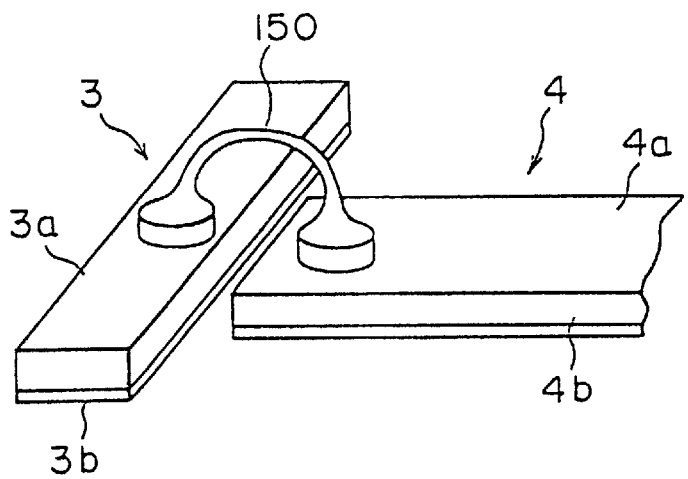
FIG. 20 is another perspective view to show a connecting state in the abutting portion of the wiring pattern layers in the multi-layer printed-wiring board of the present invention.

The above wire bonding method (9) is such a connecting method that a wire-bonding apparatus is used to effect wire-bonding on an abutting portion without electrical connection between the wiring pattern layers 3, 4, for example as shown in FIG. 20, (which is also effective similarly in the intersecting portion) thereby connecting the conductive layer 3a with 4a through a wire bridge 150.

Figure 21:
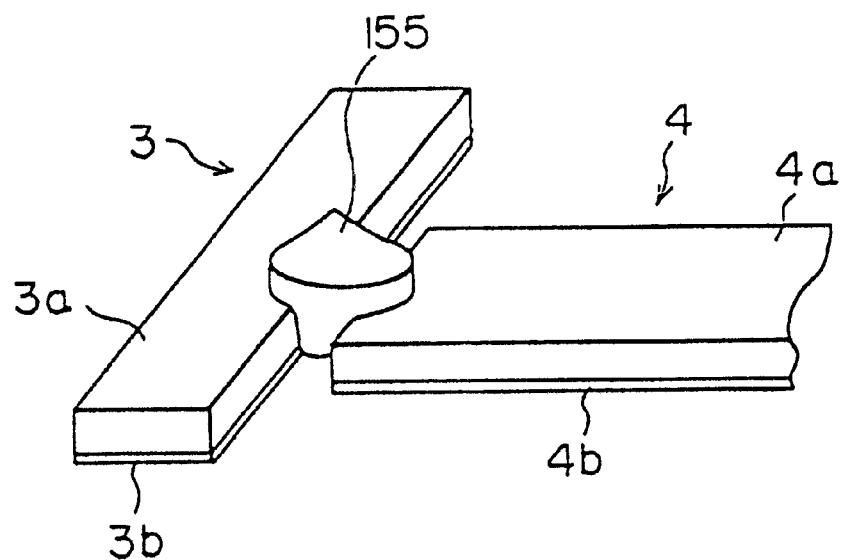
FIG. 21 is another perspective view to show a connecting state in the abutting portion of the wiring pattern layers in the multi-layer printed-wiring board of the present invention.

The above one-shot method (10) using the wire-bonding apparatus is such a connecting method that the wire-bonding apparatus is used to effect one-shot (single) bonding on an abutting portion without electrical connection between the wiring pattern layers 3, 4, for example as shown in FIG. 21, (which is also effective similarly in the intersecting portion) thereby connecting the conductive layer 3a with 4a in a bridgeless state through a bonding bulk (pad) 155.

Figure 22:
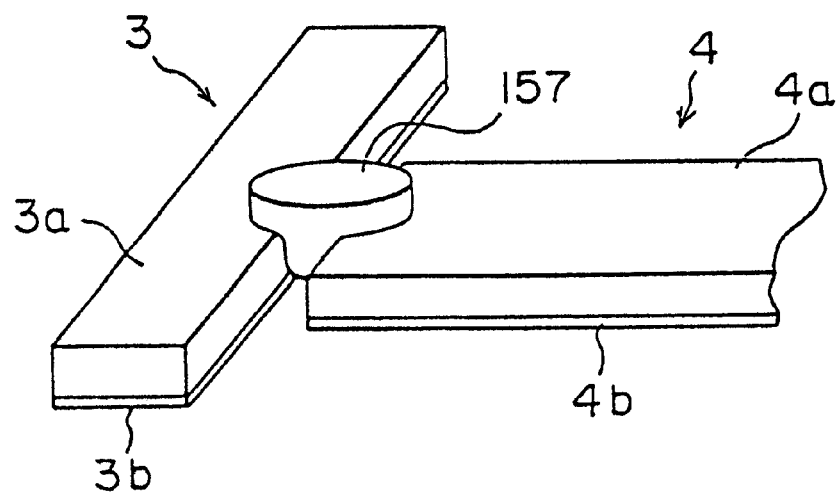
FIG. 22 is another perspective view to show a connecting state in the abutting portion of the wiring pattern layers in the multi-layer printed-wiring board of the present invention.

The above laser plating method (11) is such a connecting method that a laser (for example, argon laser) adjusted to have a predetermined spot diameter, power on an irradiation surface, etc., is irradiated onto the abutting portion or the intersecting portion to be electrically connected for a predetermined time in the state in which the multi-layer printed-wiring board 1 before connected is immersed, for example, in a palladium plating solution, thereby precipitating, for example, a Pd film in a predetermined thickness on the irradiated portion to effect connection. Further, it is preferred that the laser be irradiated while circulating the palladium plating solution. Furthermore, the plating solution is removed by washing with water, and the conductive layers 3a and 4a are connected with each other by the precipitated plating film 157, as shown in FIG. 22.

Figure 23A:
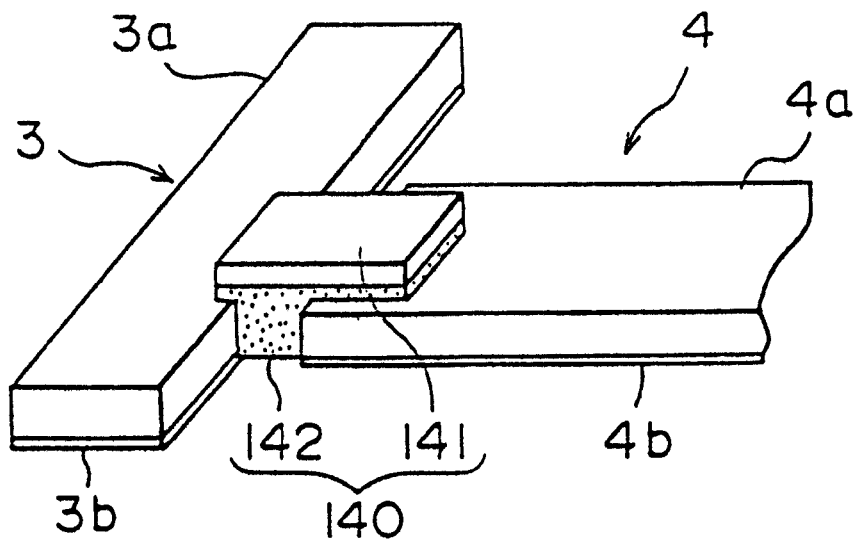
FIG. 23A is another perspective view to show a connecting state in the abutting portion of the wiring pattern layers in the multi-layer printed-wiring board of the present invention.
Figure 23B:
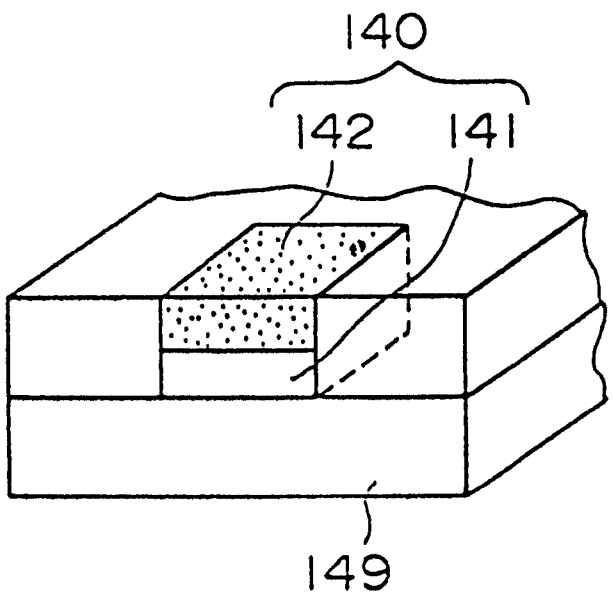
FIG. 23B is a drawing to show a state in which there is a connecting body formed, which is used for connection in the abutting-portion of the wiring pattern layers in the multi-layer printed-wiring board.

The above batch transferring method (12) of a laminate of a conductive body and a solder plating layer is carried out as shown in FIGS. 23A and 23B. First, a laminate 140 of a conductive layer 141 and a solder plating layer 142 as shown in FIG. 23B is formed as follows. Namely, for example, electrolytic plating is conducted to form the conductive layer 141 on a transferring substrate obtained by forming a desired pattern (conductive pattern) on a conductive substrate 149 through development using the resist method, and solder plating is then carried out on the conductive layer, using a predetermined solder plating bath composition, to form the solder plating layer 142. Here, the solder plating layer 142 can also be formed similarly by screen printing with solder paste or dipping instead of the solder plating. The laminate 140 thus formed is thermally-transferred at once onto the abutting portion without electrical connection between the wiring pattern layers 3, 4, as shown in FIG. 23A, (which is also effective similarly in the intersecting portion) thereby effecting connection of the conductive layer 3a with 4a. In this case, the thermal transfer is carried out at a temperature in the temperature range of from about 200 to 300° C., in which the solder plating layer 142 can melt to be deformed.

Figure 24:
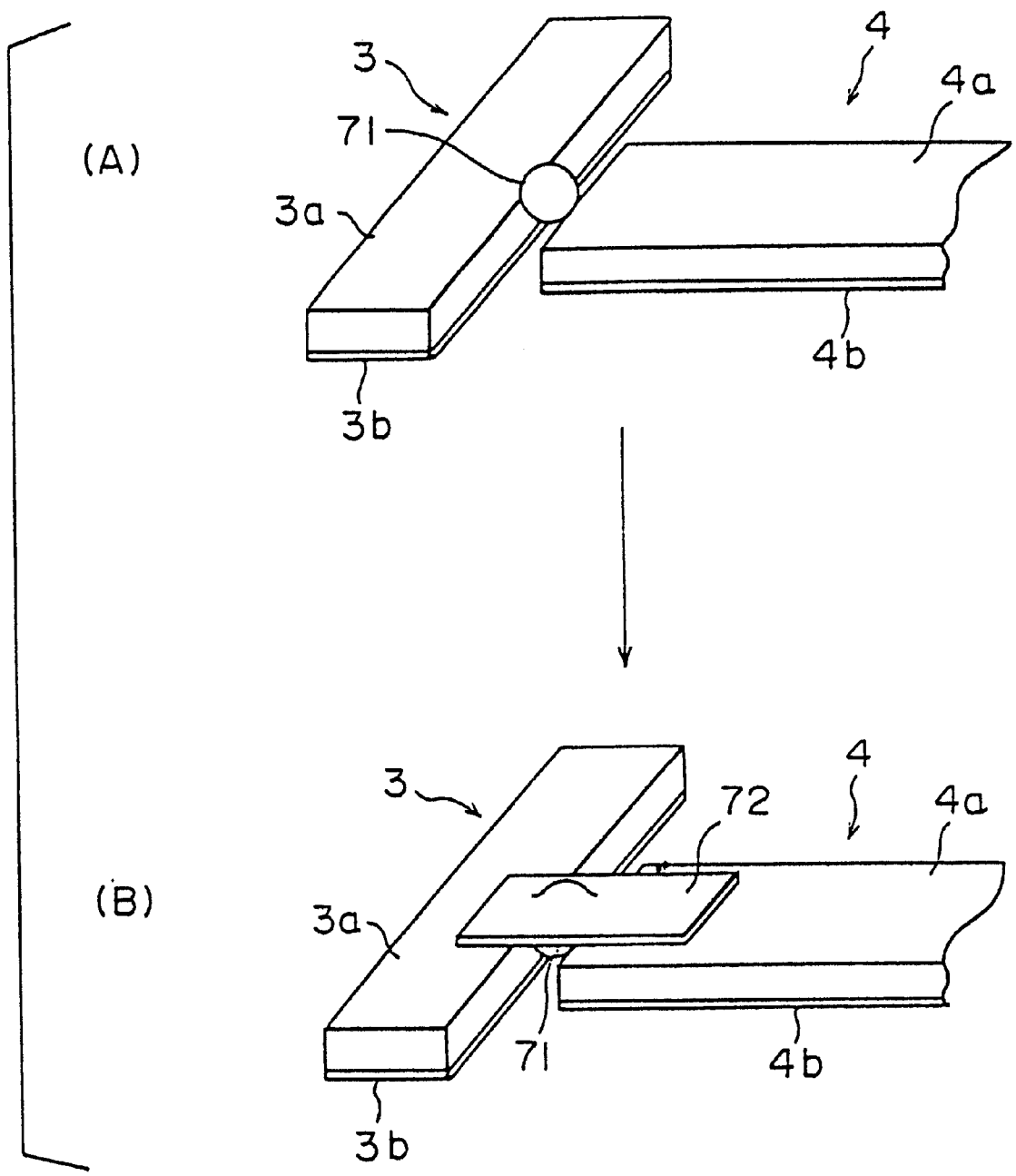
FIG. 24 is perspective views to show states of successive formation of connection in the abutting portion of the wiring pattern layers in the multi-layer printed-wiring board of the present invention.
Figure 25:
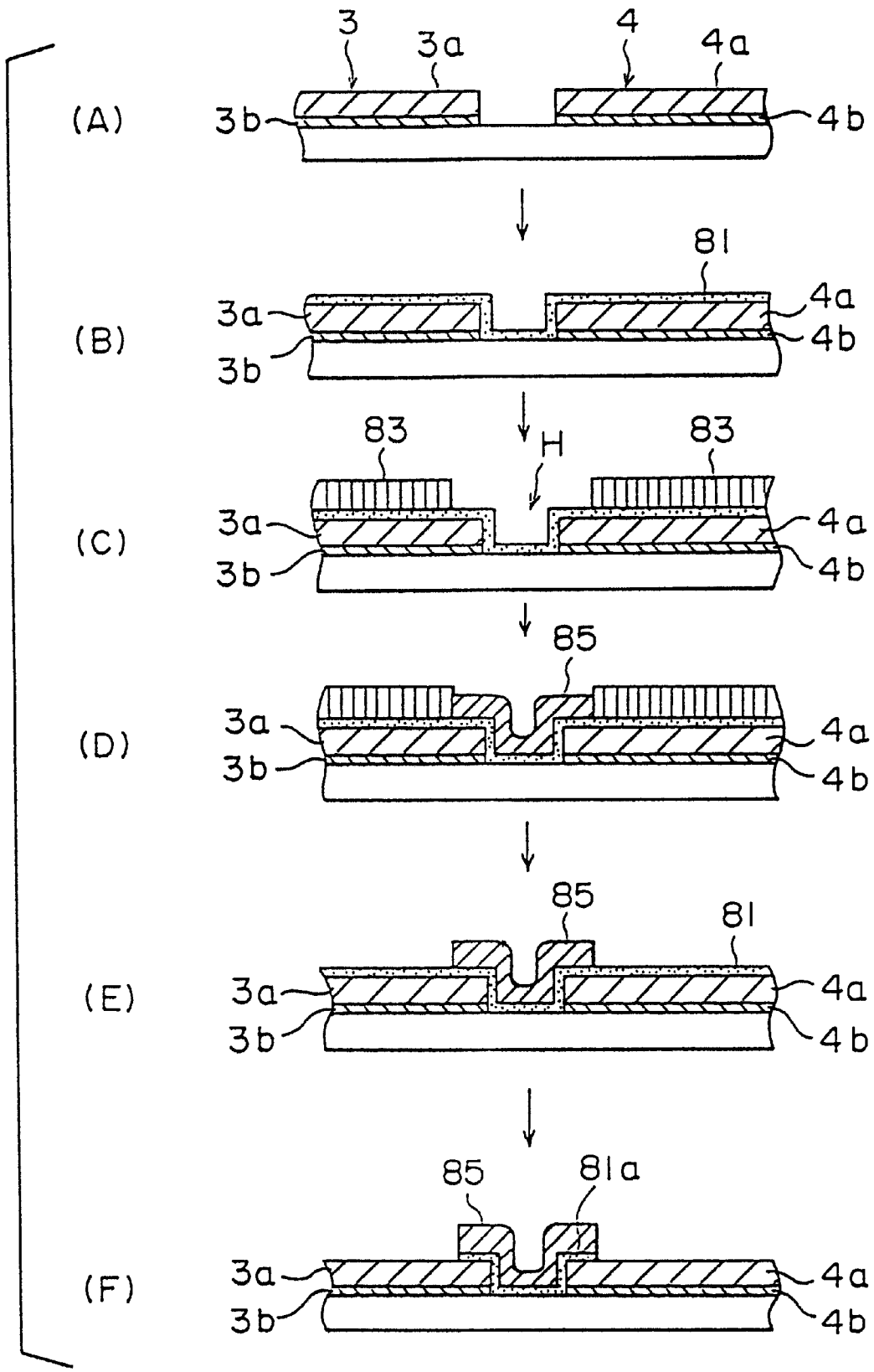
FIG. 25 is sectional views to show states of successive formation of connection in the abutting portions of the wiring pattern layers in the multi-layer printed-wiring board of the present invention.

The above metal-bulk inserting method (13) is such a connecting method that, for example, a metal ball 71 in diameter of about 30 to 100 μm is placed in a wiring gap in the abutting portion without electrical connection between the wiring pattern layers 3, 4, as shown in FIG. 24(A), and then a sheet 72 coated with a pressure-sensitive adhesive is pressed thereon as shown in FIG. 24(B) to connect the conductive layer 3a with 4a. Here, a so-called metal piece (bulk) which is not spherical can also be used, though the use of the metal ball is more preferred. Further, such a metal ball (bulk) can also be used in the above-described printing method and dispensing method in order to increase the reliability in the connecting portion. Namely, after setting of the metal ball, the above printing or dispensing is carried out.

The above electroless plating method (14) is described based on FIGS. 25(A)–(F). First, an electroless plating catalyst is laid over the entire surface of the multi-layer printed-wiring board having the wiring patterns 3, 4 as shown in initial FIG. 25(A) to form a catalyst layer 81 (FIG. 25(B)). Next, a photoresist is laid thereon to form a photoresist layer, and thereafter a portion H corresponding to the position to be connected in the wiring pattern is made to be exposed by shadow printing and development of resist layer 83, 83 using a predetermined photomask (FIG. 25(C)). Then, after activating the exposed portion H, electroless plating is carried out to form a junction portion 85, thereby connecting the conductive layer 3a with 4a (FIG. 25(D)). Thereafter, the unnecessary residual resist and catalyst layer are sequentially removed to leave only the connecting portion 85 (and catalyst layer 81a) (FIG. 25(E)).

Figure 16:
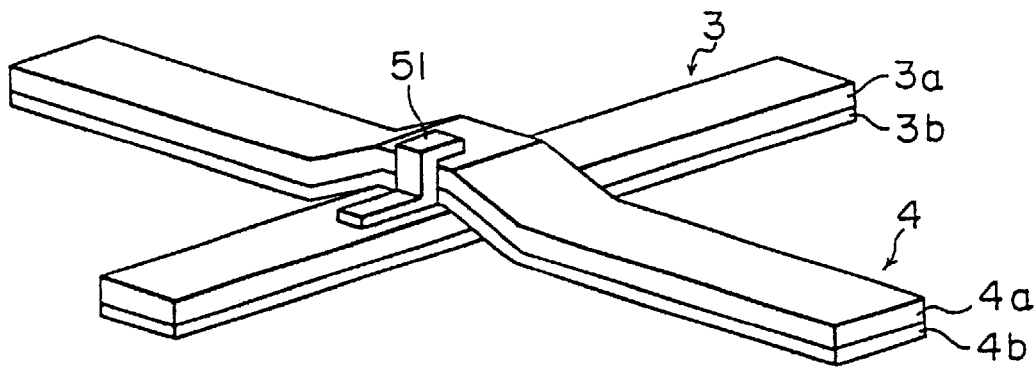
FIG. 16 is another perspective view to show a connecting state in the intersecting portion of the wiring pattern layers in the multi-layer printed-wiring board of the present invention.
Figure 17:
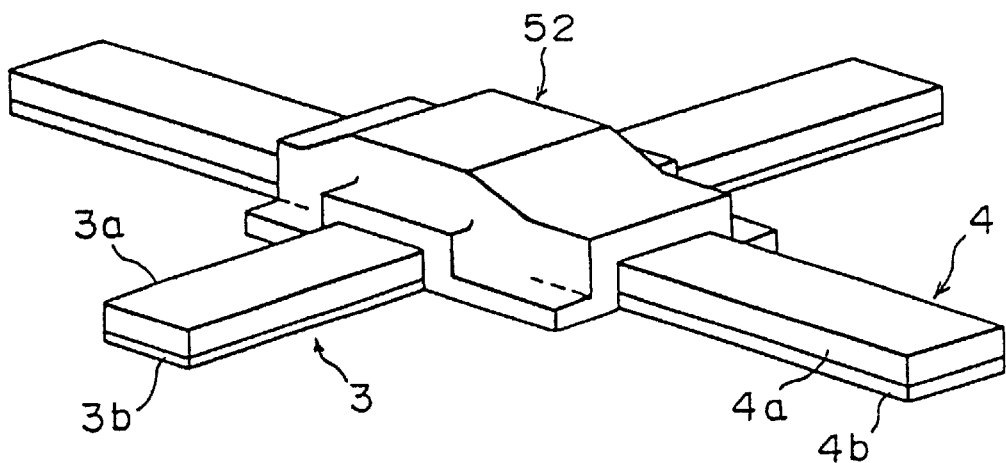
FIG. 17 is another perspective view to show a connecting state in the intersecting portion of the wiring pattern layers in the multi-layer printed-wiring board of the present invention.
Figure 18:
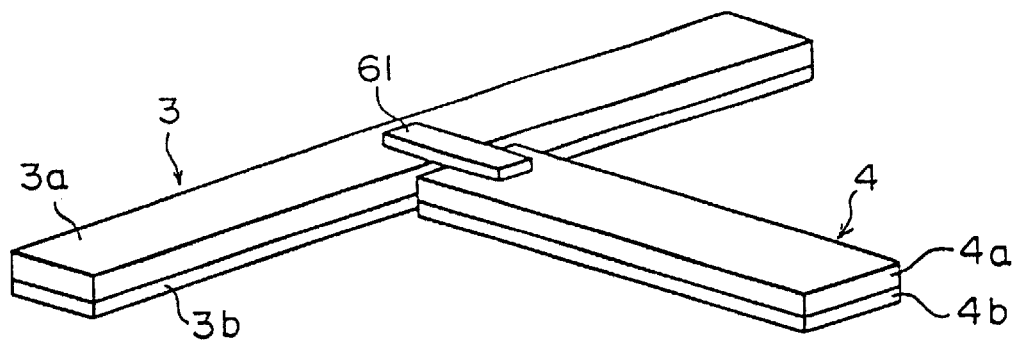
FIG. 18 is a perspective view to show a connecting state in the abutting portion of the wiring pattern layers in the multi-layer printed-wiring board of the present invention.
Figure 19:
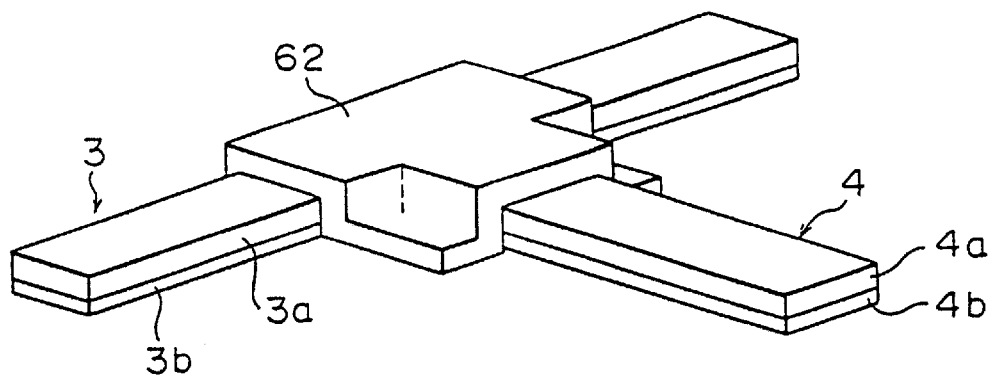
FIG. 19 is another perspective view to show a connecting state in the abutting portion of the wiring pattern layers in the multi-layer printed-wiring board of the present invention.

In the connection of the intersecting portion by the above-described methods (2)–(14), a junction portion 51 may be formed in a part of the intersecting portion, as shown in FIG. 16, in a possible region to connect the conductive layer 3a in the wiring pattern layer 3 with the conductive layer 4a in the wiring pattern layer 4; or a junction portion 52 covering the intersecting portion of the wiring pattern layer 3 and wiring pattern layer 4 may be formed as shown in FIG. 17. Also in the connection of the abutting portion, a junction portion 61 may be formed so as to bestride a part of the abutting portion, as shown in FIG. 18, to connect the conductive layer 3a in the wiring pattern layer 3 with the conductive layer 4a in the wiring pattern layer 4; or a junction portion 62 covering the abutting portion of the wiring pattern layer 3 and wiring pattern layer 4 may be formed as shown in FIG. 19.

Since the multi-layer printed-wiring board of the present invention allows connection between wiring pattern layers at any position, free from forming positions of through holes, by using the connecting methods as described above as (2) to (14), freedom of design change in circuitry after production of multi-layer printed-wiring board is higher than that for the conventional multi-layer printed-wiring boards.

In addition, although the multi-layer printed-wiring board 1 has the three-layer structure in the above examples, the process for producing the multi-layer printed-wiring board of the present invention can produce a multi-layer printed-wiring board having any desired number of wiring pattern layers by repeating the same laminate transfer.

Further, the multi-layer printed-wiring board of the present invention can be constructed of a further increased number of layers, for example, by pressure-laminating the above multi-layer printed-wiring board 1 of the three-layer structure with a semi-cured pre-preg in which an epoxy resin is impregnated in a glass cloth.

Furthermore, the multi-layer printed-wiring board of the two-layer structure of the present invention can solve the problem in the conventional double-side printed wiring boards, i.e., the problem against an increase of density, resulting from the precision of drilling for forming holes in the double-side printed-wiring board. This is because the conductive layer of each wiring pattern layer is always partially exposed in the multi-layer printed-wiring board of the present invention, as described above, and connection between wiring patterns can be easily made in the intersecting portion or the abutting portion of the wiring pattern layers without forming a through hole.

The present invention is next described in further detail, as presenting experimental examples.

EXPERIMENT 1

(1) Preparation of Electro-depositing Solution A for Insulating Resin Layer 13.2 parts by weight of butyl acrylate, 1.6 parts by weight of methyl methacrylate, 0.2 part by weight of divinylbenzene, and 85 parts by weight of a 1% potassium persulfate solution were mixed and polymerized at 80° C. for 5 hours to undergo emulsion polymerization without emulsifier, thereby preparing a polybutyl acrylate-polymethyl methacrylate copolymer emulsion solution.

Then, 72 parts by weight of the emulsion solution thus prepared, 2 parts by weight of an acrylic copolymer resin having a carboxyl group as an electro-depositing carrier, 0.85 part by weight of hexamethoxymelamine, 0.35 part by weight of trimethylamine as a neutralizing agent, 3 parts by weight of ethanol, 3 parts by weight of butyl cellosolve, and 18.8 parts by weight of water were stirred to mix, thereby preparing an anionic electro-depositing solution A.

(2) Preparation of Electro-depositing Solution B for Insulating Resin Layer 0.5 part by weight of sodium lauryl sulfate and 0.2 part by weight of sodium persulfide were added to 100 parts by weight of a mixture of 7 parts by weight of acrylonitrile, 5 parts by weight of ethyl acrylate, and 2 parts by weight of acrylic acid. The resultant was reacted for 5 hours in ion-exchanged water while introducing a nitrogen gas thereto, and a half equivalent of xylylenediamine to the acrylic acid added was further added thereto, thereby preparing an anionic electro-depositing solution B containing 19% of nonvolatile content.

(3) Preparation of Electro-depositing Solution C for Insulating Resin Layer 30.835 g (0.05 mol) of bis[4-{4-(aminophenoxy)phenoxy}phenyl]sulfone and 236.5 g of N,N-dimethylacetamide were put in a reactor equipped with a stirrer, a reflux condenser, and a nitrogen inlet tube, and then 10.9 g (0.05 mol) of pyromellitic acid dianhydride was added thereto at ordinary temperature under a nitrogen atmosphere as paying attention to an increase in temperature of the solution. The resultant was stirred for about 20 hours to obtain a polyamic acid. A logarithmic viscosity number (measured at temperature of 35° C., in a concentration of 0.5 g/100 ml and with N,N-dimethylacetamide as a solvent) of the polyamic acid thus prepared was 1.52 dl/g.

Next, 8.9 g (90 mol % to carboxylic equivalent) of dimethylethanolamine was gradually added to the polyamic acid solution and stirred at ordinary temperature for 20 minutes, and thereafter 130.2 g of water was gradually added to the resultant under stirring to dilute it, thereby preparing a polyamic acid electro-depositing solution C (in a resin concentration of 10%, by weight).

(4) Formation of Electrically Conductive Layer in Transferring Original Plate (Corresponding to FIG. 2(C))

Stainless steel plates having the thickness of 0.2 mm, the surfaces of which were polished, were prepared as electrically conductive substrates, and a commercially available photoresist for plating (PMERP-AR900 manufactured by Tokyo Oka Kogyo (KK)) was laid on the stainless steel plate in the thickness of 20 $\mu$m and dried. The plates each were subjected to shadow printing with three types of respective photomasks with wiring patterns formed therein, followed by development, washing with water, drying, and thermal curing, thereby preparing transferring original plates (3 types) each having an insulating layer.

A transferring original plate prepared above was set as opposed to a platinum electrode and immersed in a copper pyrophosphate plating bath having the below composition (pH=8, the solution temperature=55° C.). An electric current was let to flow for 5 minutes in the current density of 10 A/dm$^2$ while connecting the platinum electrode to the anode of DC power supply and the transferring substrate prepared above to the cathode thereof, to form a copper plating film as an electrically conductive layer in the thickness of 10 $\mu$m on exposed portions of the electrically conductive substrate, not covered with the photoresist. This formation of the electrically conductive layer was carried out for each of the three types of transferring original plates.

| (Composition of copper pyrophosphate plating bath) | |
| --- | --- |
| Copper pyrophosphate | 94 g/l |
| Potassium copper pyrophosphate | 340 g/l |
| Aqueous ammonia | 3 cc/l |

(5) Formation of Insulating Resin Layer A in Transferring Original Plate (Corresponding to FIG. 2(D))

Each of the three types of transferring original plates, in which the electrically conductive layer was formed in above (4), and a platinum electrode were set as opposed to each other and immersed in the anionic electro-depositing solution A prepared in above (1). The each transferring original plate was connected to the anode of the DC power supply and the platinum electrode to the cathode thereof, and electro-deposition was carried out at the voltage of 50 V for a minute, followed by a drying and heat treatment at 180° C. for 30 minutes to form an adhesive insulating resin layer A in the thickness of 15 $\mu$m on the electrically conductive layer, thus obtaining transferring original plates A1, A2, and A3 for the three types of wiring pattern layers.

(6) Formation of Insulating Resin Layer B in Transferring Original Plate (Corresponding to FIG. 2(D))

Each of the three types of the transferring original plates, in which the electrically conductive layer was formed in above (4), and a platinum electrode were set as opposed to each other and immersed in the anionic electro-depositing solution B prepared in above (2). The each transferring original plate was connected to the anode of the DC power supply and the platinum electrode to the cathode thereof, and electro-deposition was carried out at the voltage of 20 V for 30 seconds, followed by a drying and heat treatment at 120° C. for 10 minutes to form an adhesive insulating resin layer B in the thickness of 15 µm on the electrically conductive layer, thus obtaining transferring original plates B1, B2, and B3 for the three types of wiring pattern layers.

(7) Formation of Insulating Resin Layer C in Transferring Original Plate (Corresponding to FIG. 2(D))

Each of the three types of transferring original plates, in which the electrically conductive layer was formed in above (4), and a platinum electrode were set as opposed to each other and immersed in the anionic electro-depositing solution C prepared in above (3). The each transferring original plate was connected to the anode of the DC power supply and the platinum electrode to the cathode thereof, and electro-deposition was carried out at the voltage of 20 V for two seconds, followed by washing with an aqueous solution containing 50% by weight of N, N-dimethylacetamide, a drying treatment at ordinary temperature, and a heat treatment at 150° C. for one hour to form an insulating resin layer C in the thickness of 10 µm on the electrically conductive layer, thus obtaining transferring original plates C1, C2, and C3 for the three types of wiring pattern layers.

Figure 5:
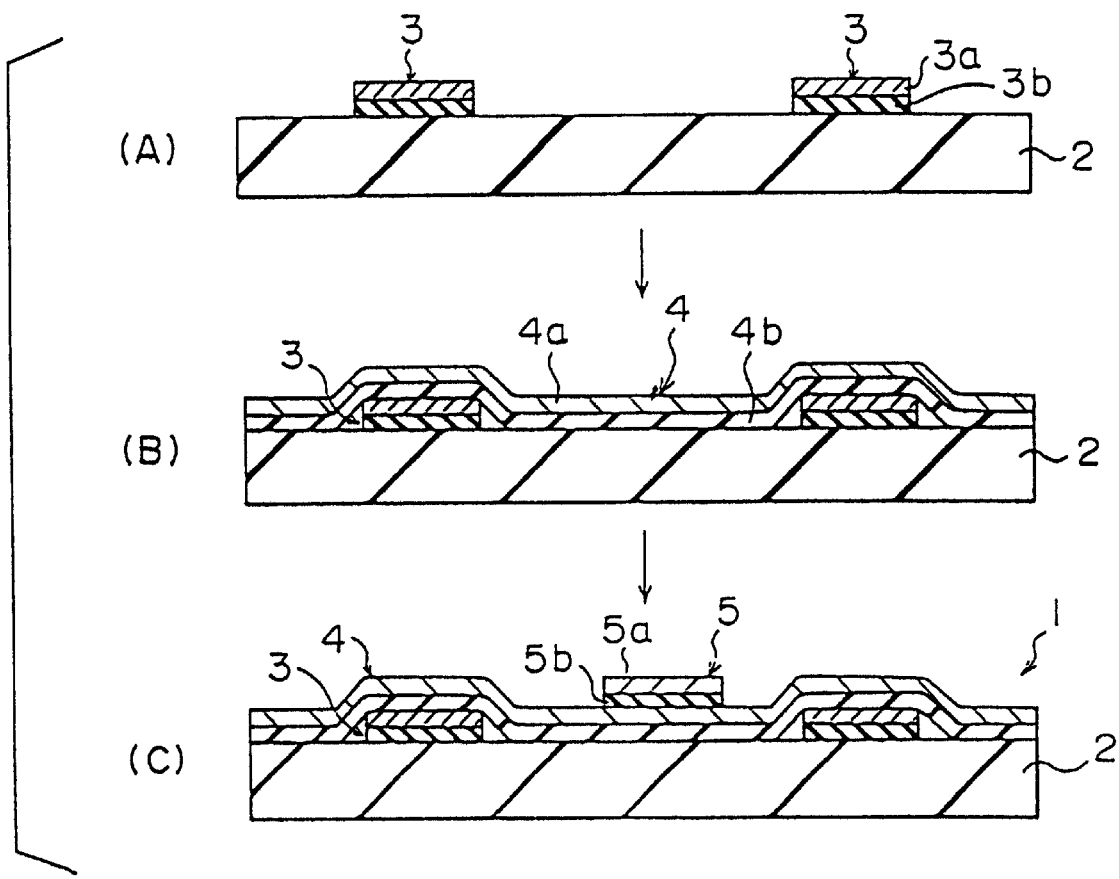
FIG. 5 is a drawing to illustrate a process for producing the multi-layer printed-wiring board of the present invention.

(8) Production 1 of Multi-layer Printed-wiring Board (Corresponding to FIG. 5)

The transferring original plates A1, A2, and A3 for the three types of wiring pattern layers prepared in above (5), were pressed in this order on a polyimide film substrate having the thickness of 50 µm under the following conditions, whereby the three types of wiring pattern layers, each composed of the electrically conductive layer and the insulating resin layer A, were transferred onto the film substrate, thereby forming a multi-layer printed-wiring board.

(Pressing Conditions)
Pressure: 20 kgf/cm$^2$
Temperature: 180° C.

(9) Production 2 of Multi-layer Printed-wiring Board (Corresponding to FIG. 5)

The transferring original plates B1, B2, and B3 for the three types of wiring pattern layers prepared in above (6), were pressed in this order on a polyimide film substrate having the thickness of 50 µm under the following conditions, whereby the three types of wiring pattern layers, each composed of the electrically conductive layer and the insulating resin layer B, were transferred onto the film substrate, thereby forming a multi-layer printed-wiring board.

(Pressing Conditions)
Pressure: 50 kgf/cm$^2$
Temperature: 200° C.

(10) Production 3 of Multi-layer Printed-wiring Board (Corresponding to FIG. 5)

The transferring original plates C1, C2, and C3 for the three types of wiring pattern layers prepared in above (7), were pressed in this order on a polyimide film substrate having the thickness of 50 µm under the following conditions, whereby the three types of wiring pattern layers, each composed of the electrically conductive layer and the insulating resin layer C, were transferred onto the film substrate. Then, a heat treatment at 230° C. for one hour was effected on the film substrate to cure the insulating resin layer C transferred, thus forming a multi-layer printed-wiring board.

(Pressing Conditions)
Pressure: 40 kgf/cm$^2$
Temperature: 200° C.

EXPERIMENT 2

Connection by the Lift-off Method

Connection was made by the lift-off method on a connection-intended portion, in which a through hole was made in the upper layer, among intersecting portions of the wiring pattern layers in the multi-layer printed-wiring board prepared in (10) of Experiment 1.

This connection was made as follows. A photoresist (OFPR-800 manufactured by Tokyo Oka Kogyo (KK)) was first laid on the multi-layer printed-wiring board to form a photoresist layer (thickness 1.0 µm), and then shadow printing was done with a photomask for forming a connecting portion, followed by development, washing with water, and drying, thereby exposing the through hole in the intersecting portion. Here, as shown in FIG. 14(A), the pattern of the resist layer 42 having an opening in the intersecting portion is desired to be slightly larger than the diameter of the through hole on the upper wiring pattern layer 4, which will result in attaining such a shape that an electroless plating layer (junction portion 46) formed inside the through hole partially runs on the surface of the upper wiring pattern layer 4, as shown in FIG. 14(D), thereby making surer the connection of the upper wiring pattern layer 4 with the lower wiring pattern layer 3.

Next, the multi-layer printed-wiring board was immersed in an electroless plating catalyst (Enplate activator 444 and Enplate PA-491 manufactured by Meltex (KK)) to form a catalyst layer, and then the multi-layer printed-wiring board was immersed in an electroless plating solution (Melplate CU-390 manufactured by Meltex (KK)) for 20 minutes, followed by washing with water and drying to form an electrically conductive layer. Further, copper plating was performed on the electrically conductive layer in the same manner as in (4) of Experiment 1 to form an electrically conductive film, and then the resist layer was peeled and lifted off, thereby forming a junction portion in the through hole. Electric conduction was confirmed between the wiring pattern layers.

EXPERIMENT 3

Connection by the Printing Method

An electrically conductive paste ink (Silbest P-225 manufactured by Tokuriki Kagaku Kenkyusho) was printed using a screen printing plate with an opening portion corresponding to the intersecting portion on an intersecting portion with no through hole formed therein among intersecting portions of the wiring pattern layers in the multi-layer printed-wiring board prepared in (10) of Experiment 1, followed by drying. Electric conduction was confirmed between the wiring pattern layers.

EXPERIMENT 4

Connection by the Dispensing Method

The multi-layer printed-wiring board prepared in (10) of Experiment 1 was set in an automatic coating apparatus (XYD 4550ZC2-2 type) manufactured by Iinuma Gauge Seisakusho (KK), and a needle (a needle-like jet-spraying port) having an inner diameter of 0.2 mm and being connected to a dispenser, was moved to above an intersecting portion with no through hole formed therein among intersecting portions of the wiring pattern layers to drop an electrically conductive paste ink (Silbest P-225 manufactured by Tokuriki Kagaku Kenkyusho) so as to apply a small amount thereof on the intersecting portion. After drying, electric conduction was confirmed between the wiring pattern layers.

EXPERIMENT 5

Connection by the Ultra-fine-particles-spraying Method

Two vacuum tanks each independently equipped with a vacuum pump were connected to each other with a 2 mm diameter-connecting pipe made of stainless steel and having a stop valve in the center thereof, and the interior of each vacuum tank was exhausted while the valve was kept close, so that one of them was maintained at $2 \times 10^{-3}$ Torr (high-vacuum tank) whereas the other at 500 Torr (low-vacuum tank) as introducing an argon gas thereto. Then, a multi-layer printed-wiring board prepared in (10) of Experiment 1 was set in the high-vacuum tank. In the high-vacuum tank, the tip of the above connecting pipe (tip diameter=80 $\mu$m) was aligned with an intersecting portion of wiring pattern layers in the multi-layer printed-wiring board (an intersection with no through hole formed therein), and also was set to be perpendicular to the wiring board. On the other hand, in the low-vacuum tank, gold was put in an evaporation source of a resistance heating type, and one opening end of the connecting pipe was located at about 2 cm above the evaporation source.

Next, the power was supplied to the resistance heating type evaporation source so as to initiate evaporation of gold, and gold fine particles were sprayed to the intersecting portion of the wiring pattern layers from the tip of the connecting pipe in the high-vacuum tank, thereby forming a gold film (junction portion) in the diameter of 100 $\mu$m and the thickness of 30 $\mu$m in the intersecting portion after spraying for about a second. Then electric conduction was confirmed between the wiring pattern layers.

EXPERIMENT 6

Connection by the Laser Patterning Method

The multi-layer printed-wiring board prepared in (10) of Experiment 1 was coated with a fine-particle-dispersing solution having the following composition by the spin coating method, and dried to form a coating film.

| (Composition of the fine-particle-dispersing solution) | |
|---|---|
| Gold fine particles (produced by the evaporation method in a gas, the diameter about 0.1 $\mu$m) | 30 parts by weight |
| A polyester resin (Bilon 200 manufactured by Toyobo (KK)) | 2 parts by weight |
| Toluene | 50 parts by weight |
| Methyl ethyl ketone | 50 parts by weight |

Next, the argon laser, which was adjusted to have the spot diameter of 100 $\mu$m and the power of 1 W on the irradiation surface, was applied to an intersecting portion with no through hole formed therein among intersecting portions of wiring pattern layers in the multi-layer printed-wiring board for about 3 ms, whereby the polyester resin in the above coating film was evaporated and removed to form a gold thin film on the intersecting portion. Then, non-irradiated portions of the coating film were dissolved to remove with a solvent (a solvent mixture of toluene : methyl ethyl ketone= 1:1). After washing and drying, electric conduction was confirmed between the wiring pattern layers.

EXPERIMENT 7

Connection by the Selective Electroless Plating Method

The multi-layer printed-wiring board prepared in (10) of Experiment 1 was immersed in a photosensitive aqueous solution (solution temperature=40° C.) having the following composition, and then was dried to form a photosensitive layer.

| (Composition of the photosensitive aqueous solution) | |
|---|---|
| Copper acetate | 8 g/l |
| Glycerin | 16 g/l |
| Sorbitol | 110 g/l |
| Pentaerythritol | 10 g/l |

Next, exposure was conducted on the above wiring board in contact with a photomask arranged to permit exposure to be effected on only an intersecting portion with no through hole formed therein among those of the wiring pattern layers in the multi-layer printed-wiring board, followed by washing with water, and the board was immersed in an electroless plating bath (bath temperature=68° C.) having the following composition for 3 hours to undergo electroless plating. After washing with water and drying, electric conduction was confirmed between the wiring pattern layers.

| (Composition of the electroless plating bath) | |
|---|---|
| Copper sulfate | 0.03 mol/l |
| Caustic soda | 0.125 mol/l |
| Sodium cyanide | 0.0004 mol/l |
| Formalin | 0.09 mol/l |
| Sodium ethylenediaminetetraacetate | 0.036 mol/l |

EXPERIMENT 8

Connection by the Selective Evaporation Method

The multi-layer printed-wiring board prepared in (10) of Experiment 1, an evaporation source of pyrene, and an ion source of gallium were set in a vacuum tank, and the interior of the vacuum tank was exhausted to $3 \times 10^{-6}$ Torr. Here, the ion source of gallium was so set that the ion beam entered the wiring board perpendicularly.

Next, the evaporation source was heated to about 70° C. to evaporate pyrene, and the gallium ion beam was let to irradiate an intersecting portion with no through hole formed therein among intersecting portions of the wiring pattern layers in the multi-layer printed-wiring board under the following conditions to effect deposition of a carbon film thereon. As a result, the carbon film was formed in the thickness of 3 $\mu$m on the intersecting portion, and electric conduction was confirmed between the wiring pattern layers.

| (Ion beam irradiation conditions) | |
|---|---|
| Beam accelerating voltage | 20 kV |
| Beam irradiation area | 30 μm□ |
| Irradiation time | 15 minutes |

EXPERIMENT 9

Connection by the Welding Method

The multi-layer printed-wiring board prepared in (9) of Experiment 1 and an emitting portion of argon laser were set in a container, the interior of which was replaced with an argon gas. The spot diameter of the laser was adjusted to 80 μm and the power on the irradiation surface was adjusted to 1 W. Then, the argon laser was let to irradiate an intersecting portion with no through hole formed therein among intersecting portions of the wiring pattern layers in the multi-layer printed-wiring board for about 5 ms, whereby an insulating resin layer between the upper wiring pattern layer and the lower wiring pattern layer in the intersecting portion was evaporated and removed, to weld the conductive layers in the wiring pattern layers to each other. Then, electric conduction was confirmed between the wiring pattern layers.

EXPERIMENT 10

Connection by the Wire Bonding Method

A wire-bonding apparatus was used to effect wire-bonding of the wiring pattern layers in the multi-layer printed-wiring board prepared in (10) of Experiment 1, with a gold line (diameter 40 μm) on an abutting portion without electrical connection, thereby connecting the abutting portion through a wire bridge, as shown in the diagram of FIG. 20. Then, electric conduction was confirmed between the wiring patterns.

EXPERIMENT 11

Connection by the One-shot Method Using the Wire-bonding Apparatus)

The wire-bonding apparatus was used to effect one-shot bonding of the wiring pattern layers in the multi-layer printed-wiring board prepared in (10) of Experiment 1, with a gold line (diameter 100 μm) on an abutting portion without electrical connection, thereby connecting the abutting portion through a bonding bulk (pad), as shown in the diagram of FIG. 21. Then, electric conduction was confirmed between the wiring patterns.

EXPERIMENT 12

Connection by the Laser Plating Method

The multi-layer printed-wiring board prepared in (10) of Experiment 1 was immersed in a palladium plating solution having the following composition.

| (Composition of the palladium plating solution) | |
|---|---|
| $PdCl_2$ | 1.7733 g/l |
| Ethylenediamine | 5.3 ml/l |

| -continued | |
|---|---|
| (Composition of the palladium plating solution) | |
| Thiodiglycolic acid | 30 mg/l |
| $NaH_2PO_2.H_2O$ | 6.3594 g/l |
| $Pb(CH_3COO)_2$ | 3 p.p.b. |

Next, the argon laser, which was adjusted to have the spot diameter of 100 μm and the power of 1.0 W on the irradiation surface, was let to irradiate an intersecting portion without electrical connection for about 90 seconds to precipitate a Pd film in about 50 μm on the irradiated portion (FIG. 22). Then washing with water and drying were carried out, and thereafter electric conduction was confirmed between the wiring pattern layers thus connected.

EXPERIMENT 13

Connection by the Batch Transferring Method of a Laminate of a Conductive Body and a Solder Plating Layer First, a laminate of a conductive body and a solder plating layer was prepared in the following manner. Namely, on a transferring substrate obtained by forming a desired pattern (conductive pattern) on a conductive substrate using the resist method, a conductive layer was formed in the following manner, and solder plating was carried out on the conductive layer using the below plating bath composition, thus forming a solder plating layer. Here, the solder plating layer can also be formed similarly by screen printing with a solder paste or dipping instead of the solder plating.

In forming the conductive layer, the above transferring substrate and the platinum electrode were set as opposed to each other and immersed in a copper pyrophosphate plating bath (pH=8.8, solution temperature=55° C.) having the following composition. The platinum electrode was connected to the anode of the DC power supply while the transferring substrate to the cathode thereof, respectively, and an electric current was let to flow in the current density of 3 $A/dm^2$ for two minutes to form a copper plating film on the conductive pattern (conductive-surface-exposing portion), as a conductive layer (thickness 2.0 μm).

| (Composition of the copper pyrophosphate plating bath) | |
|---|---|
| Copper pyrophosphate | 94 g/l |
| Potassium copper pyrophosphate | 340 g/l |
| Aqueous ammonia | 3 cc/l |
| The solder plating bath compound for forming the solder plating layer was made to have the following composition. | |
| (Composition of the plating bath) | |
| Stannous salt | 40 g/l |
| Lead | 15 g/l |
| Free boron fluoric acid | 100 g/l |
| Formalin (37%) | 10 ml/l |
| Gloss agent | 60 ml/l |
| Dispersing agent | 40 g/l |

Here, the above gloss agent used was one obtained by reacting 280 ml of acetaldehyde with 106 ml of o-toluidine in a 2% sodium carbonate solution at 15° C. for ten days so as to obtain a precipitate and then dissolving the precipitate in isopropanol so as to obtain a 20% solution thereof. Further, used as the above dispersing agent was a polyethyleneglycol nonylphenyl ether, which was a product resulting from adding 15 mol of ethylene oxide to 1 mol of nonylalcohol.

In forming the solder plating layer, an electric current was let to flow in a current density of 3 A/dm² for three minutes at room temperature, to form a solder plating layer in the thickness of 5.0 μm on the conductive layer of the above copper plating film.

Next, the wiring pattern layers in the multi-layer printed-wiring board as prepared in (10) of Experiment 1 were set ready, and an abutting portion without electrical connection was connected by thermal transfer as shown in FIG. 23(A) with the above laminate of the conductive layer and the solder plating layer to effect the batch-transfer of the laminate of the conductive layer and the solder plating layer. The thermal transferring temperature was 350° C. Then, electric conduction was confirmed between the wiring patterns thus connected.

EXPERIMENT 14

Connection by the Metal-bulk Inserting Method

Using the wiring pattern layers in multi-layer printed-wiring board as prepared in (10) of Experiment 1, a metal ball (bulk) made of Au in the diameter of 50 μm was placed in a wiring gap in an abutting portion without electrical connection, and a sheet coated with a pressure-sensitive adhesive was pressed thereon to form a junction portion. Then, electric conduction was confirmed between the wiring patterns thus connected.

EXPERIMENT 15

Connection by the Electroless Plating Method

An electroless plating catalyst was laid over the entire surface of the multi-layer printed-wiring board prepared in (10) of Experiment 1 to form a catalyst layer. Then, a photoresist was laid thereon, and the resist layer was subjected to shadow printing with a predetermined photomask, and development, thus exposing a portion corresponding to a position to be connected in the wiring pattern. After activating the exposed portion, electroless copper plating was carried out to form a junction portion. After that, the unnecessary residual resist and catalyst layer were sequentially removed, and then electric conduction was confirmed between the wiring patterns thus connected.

The compositions and operation conditions for the electroless plating catalyst, activation (accelerator), and electroless plating were as follows.

| (Electroless plating catalyst) | |
|---|---|
| Catalyst: Palladium chloride | 0.2 g/l |
| Stannous chloride | 20 g/l |
| Concentrated hydrochloric acid | 200 ml |
| Operation conditions: room temperature, treating time: 5 minutes | |
| (Activation (accelerator)) | |
| Accelerating agent: sulfuric acid | 150 g/l |
| Operation conditions: 50° C., treating time: 5 minutes | |
| (Composition of electroless plating bath) | |
| Copper sulfate | 7 g/l |
| EDTA | 25 g/l |
| Formaldehyde | 50 g/l |
| NaCN | 60 mg/l |
| Operation conditions: pH = 12.6, bath temperature: 70° C., treating time: 20 minutes | |
| Thickness of film formed: 0.5 μm | |

EXPERIMENT 16

(1) Production of Transferring Original Plates D1, D2, D3 (Corresponding to FIG. 7)

Produced as conductive substrates were SUS430 substrates (thickness 0.15 mm) with surfaces being sufficiently close to a mirror surface; each substrate was subjected to surface washing with an alkali degreasing solution and to a neutralizing treatment at 25° C. with a 10% hydrochloric acid, followed by washing in flowing pure water and drying; then each substrate was coated with OFPR (a positive resist manufactured by Tokyo Oka (KK)) of 20 cp as a resist for etching by the spin coating method (the number of revolutions: 1200 rpm) for 40 sec; the substrates were subjected to exposure with three types of photomasks having respective wiring patterns formed, and development, thereby forming the conductive substrates (of three types) with masking layers for etching (thickness 2.0 μm) in predetermined patterns.

Next, recess portions were formed in the depth of about 2 μm on the surface of each conductive substrate, using an iron chloride type etching solution (manufactured by Junsei Kagaku (KK); ferric chloride solution) with the etching masking layer as a photomask, thereby achieving the intaglio structure.

After washing, an ethylene tetrafluoride dispersing type electro-depositing resin (manufactured by (KK) Shimizu; elecoat nicelon) was electro-deposited as an undercoat on the entire surface of the each substrate in 25 mA/dm² while maintaining the etching masking layer, and then electro-deposition was carried out for about three minutes at a constant voltage of 20 V, whereby an electro-depositing film was raised in the above recess portions formed by etching until the surface of film had the same height as the etching masking layer, thereby forming an electrically insulating masking layer.

Then the conductive substrates were baked in a circulating oven at 110° C. for 30 minutes, and thereafter only the etching masking layers were dissolved and removed at ordinary temperature by immersing them in acetone for 30 seconds. After peeling off the etching masking layers, the substrates were further baked at 180° C. for 30 minutes in a clean oven, thereby preparing transferring original plates of the intaglio structure having the step of 2 μm.

The SUS substrates of the transferring original plates thus prepared were washed at room temperature with a 10% hydrochloric acid. Then the each above transferring original plate and the platinum electrode were set as opposed to each other and immersed in the copper pyrophosphate plating bath having the below composition (pH=8.8, solution temperature=55° C). The platinum electrode was connected to the anode of the DC power supply while the each transferring original plate to the cathode thereof, and an electric current was let to flow in the current density of 5 A/dm² for 2.2 minutes, thereby forming a copper plating film on electrically-conductive-surface-exposing portions of the conductive substrate without the insulating masking layer to obtain an electrically conductive layer (thickness 2.2 μm).

| (Composition of the copper pyrophosphate platingbath) | |
|---|---|
| Copper pyrophosphate | 94 g/l |
| Potassium copper pyrophosphate | 340 g/l |
| Aqueous ammonia | 3 cc/l |

In the growing process of the copper plating film on this occasion, the film grew inside the recess portions of the step of 2 μm isotropically in the horizontal and vertical directions, with the conductive-surface-exposing portions of the SUS substrate, which were reduced by 4 μm in total on the both sides because of the side etching portions formed in the etching process, as a starting electrode.

Next, in the same manner as in (7) of Experiment 1, the adhesive insulating resin layer C was formed on the conductive layer, thereby obtaining three types of transferring original plates D1, D2, D3 for wiring pattern layers.

(2) Production of Multi-layer Printed-wiring Board

The three types of transferring original plates D1, D2, and D3 for wiring pattern layers prepared in the above step (1), were pressed in this order on a polyimide film substrate of the thickness of 50 μm under the below conditions, thereby transferring the three types of wiring pattern layers, each composed of the conductive layer and the insulating resin layer C, onto the film substrate to obtain a multi-layer printed-wiring board.

(Pressing Conditions)
Pressure: 40 kgf/cm$^2$
Temperature: 200° C.

Here, during the above production of the multi-layer printed-wiring board by transfer, no breakage of the insulating layers in the transferring original plates was observed at all.

Thereafter, production of the same multi-layer printed-wiring board was repeated 70 times using the above transferring original plates, and no damage of the insulating layers was observed at all in the 70-times continuous transfers, which confirmed that the transferring original plates of the present invention had excellent durability and that production of highly precise multi-layer printed-wiring boards became possible.

EXPERIMENT 17

(1) Production of Transferring Original Plates E1, E2, E3 (Corresponding to FIG. 9)

Prepared as conductive substrates were SUS430 substrates (thickness 0.25 mm) with surfaces being sufficiently close to a mirror surface; each substrate was subjected to surface washing with an alkali degreasing solution and to a neutralizing treatment at 25° C. with a 10% hydrochloric acid, followed by washing in flowing pure water and drying; then each substrate was coated with OFPR (positive resist manufactured by Tokyo Oka (KK)) of 20 cp as a resist for etching by the spin coating method (the number of revolutions: 1500 rpm) for 40 sec; the substrates were subjected to exposure with three types of photomasks having wiring patterns formed, and development, thereby forming the conductive substrates (of three types) with a masking layer for etching (thickness 1.2 μm) in predetermined patterns.

Next, recess portions were formed in the depth of about 4 μm on the surface of each conductive substrate, using an iron chloride type etching solution (manufactured by Junsei Kagaku (KK); ferric chloride solution) with the etching masking layer as a photomask, thereby achieving the intaglio structure.

After washing, an ethylene tetrafluoride dispersing type electro-depositing resin (manufactured by (KK) Shimizu; elecoat nicelon) was electro-deposited as an undercoat on the entire surface of the each substrate in 25 mA/dm$^2$ while maintaining the etching masking layer, and then electro-deposition was carried out for about three minutes at a constant voltage of 20 V, whereby an electro-depositing film was raised in the above recess portions formed by etching until the surface of film had the same height as the surface of the conductive substrate, thereby forming an electrically insulating masking layer.

Then the conductive substrates were baked in a circulating oven at 110° C. for 30 minutes, and thereafter only the etching masking layers were dissolved and removed at ordinary temperature by immersing them in acetone for 30 seconds. After peeling off the etching masking layers, the substrates were further baked at 180° C. for 30 minutes in a clean oven, thereby preparing transferring original plates of the lithography structure.

The SUS substrates of the transferring original plates thus prepared were washed at room temperature with a 10% hydrochloric acid. Then the each above transferring original plate and the platinum electrode were set as opposed to each other and immersed in the copper pyrophosphate plating bath having the below composition (pH=8.8, solution temperature=55° C.). The platinum electrode was connected to the anode of the DC power supply while the each transferring original plate to the cathode thereof, and an electric current was let to flow in the current density of 5 A/dm$^2$ for one minute, thereby forming a copper plating film on electrically-conductive-surface-exposing portions in the conductive substrate without the insulating masking layer to obtain an electrically conductive layer (thickness 1.0 μm).

| (Composition of the copper pyrophosphate platingbath) | |
|---|---|
| Copper pyrophosphate | 94 g/l |
| Potassium copper pyrophosphate | 340 g/l |
| Aqueous ammonia | 3 cc/l |

In the growing process of the copper plating film on this occasion, the conductive layer was formed 2 μm wider on either side on the substrate than the width of the surface of a conductive-surface-exposing portion of the substrate, with the conductive-surface-exposing portions of the SUS substrates, each of which was reduced by 4 μm in total on the both sides thereof because of the side etching portions formed by the etching process, as a starting electrode. Further, the copper plating film grew isotropically in the horizontal and vertical directions.

Next, in the same manner as in (7) of Experiment 1, the adhesive insulating resin layer C was formed on the conductive layer, thereby obtaining three types of transferring original plates E1, E2, and E3 for wiring pattern layers.

(2) Production of Multi-layer Printed-wiring Board

The three types of transferring original plates E1, E2, and E3 for wiring pattern layers prepared in the above step (1), were pressed in this order on a polyimide film substrate of the thickness of 50 μm under the below conditions, thereby transferring the three types of wiring pattern layers, each composed of the conductive layer and the insulating resin layer C, onto the film substrate to obtain a multi-layer printed-wiring board.

(Pressing Conditions)
Pressure: 40 kgf/cm$^2$
Temperature: 200° C.

Here, during the above production of the multi-layer printed-wiring board by transfer, no breakage of the insulating layers in the transferring original plates was observed at all.

Thereafter, production of the same multi-layer printed-wiring board was repeated 90 times using the above transferring original plates, and no damage of the insulating masking layers was observed at all in the 90-times continuous transfers, which confirmed that the transferring original plates of the present invention had excellent durability and that production of highly precise multi-layer printed-wiring boards became possible.

EXPERIMENT 18

(1) Production of Transferring Original Plates F1, F2, F3 (Corresponding to FIG. 11)

Substrates (thickness 0.4 mm) made of titanium (Ti) were provided as conductive substrates, and the surface of each substrate was coated with a photoresist (manufactured by Tokyo Oka (KK); OFPR800) by the spin coating method (the number of revolutions: 1500 rpm, 40 sec). The substrates each were subjected to exposure with the three types of photomasks having respective wiring patterns formed, and development, thereby forming the conductive substrates (of three types) with respective etching masking layers (thickness 1.0 $\mu$m) in predetermined patterns.

Next, the each conductive substrate was immersed in a solution of HF (2.5 wt %)-$H_2O_2$ (15 wt %)-$H_2O$ (the rest) for two minutes with the etching masking layer as a mask, thereby etching exposed portions of Ti (in the depth of etching of 2 $\mu$m) to form recess portions. Then, the surface of the recess portions was roughened (for 30 seconds) in a HF—$NH_4$ solution in order to improve the adhesion of an electro-depositing substance to the substrate.

Next, an ethylene tetrafluoride dispersing type electro-depositing resin (manufactured by (KK) Shimizu; elecoat nicelon) was electro-deposited as an undercoat in the above recess portions in 25 mA/dm$^2$ with the above etching masking layer as a mask for electro-deposition, and then electro-deposition was carried out at a constant voltage of 20 V for about 60 seconds, whereby an electro-depositing film was so raised that the nearly central portions became of a recess shape and that the surface thereof was lower than the surface of Ti substrate, as shown in FIG. 11(C), thereby forming an electrically insulating masking layer.

Then the conductive substrates were baked in a circulating oven at 110° C. for 30 minutes, and thereafter only the etching masking layers were dissolved and removed at ordinary temperature by immersing them in acetone for 30 seconds. After peeling off the etching masking layers, the substrates were further baked at 180° C. for 30 minutes in a clean oven, thereby preparing transferring original plates of the letterpress structure.

The each transferring original plate thus prepared and the platinum electrode were set as opposed to each other and immersed in the copper pyrophosphate plating bath having the below composition (pH=8.8, solution temperature=55° C.). The platinum electrode was connected to the anode of the DC power supply while the transferring original plate to the cathode thereof and an electric current was let to flow in the current density of 5 A/dm$^2$ for 1.5 minutes, thereby forming a copper plating film on the electrically-conductive-surface-exposing portions of the conductive substrate without the insulating masking layer to obtain an electrically conductive layer (thickness 1.5 $\mu$m).

| (Composition of the copper pyrophosphate plating bath) | |
|---|---|
| Copper pyrophosphate | 94 g/l |
| Potassium copper pyrophosphate | 340 g/l |
| P ratio | 7.0 |

Next, in the same manner as in (7) of Experiment 1, the adhesive insulating resin layer C was formed on the conductive layer, thereby obtaining three types of transferring original plates F1, F2, and F3 for wiring pattern layers.

(2) Production of Multi-layer Printed-wiring Board

The three types of transferring original plates F1, F2, and F3 for wiring pattern layers prepared in the above step (1), were pressed in this order on a polyimide film substrate of the thickness of 50 $\mu$m under the below conditions, thereby transferring the three types of wiring pattern layers, each composed of the conductive layer and the insulating resin layer C, onto the film substrate to obtain a multi-layer printed-wiring board.

(Pressing Conditions)

Pressure: 40 kgf/cm$^2$

Temperature: 200° C.

Here, during the above production of the multi-layer printed-wiring board by transfer, no breakage of the insulating layers in the transferring original plates was observed at all.

Thereafter, production of the same multi-layer printed-wiring board was repeated 100 times using the above transferring original plates, and no damage of the insulating layers was observed at all in the 100-times continuous transfers, which confirmed that the transferring original plates of the present invention had excellent durability and that production of highly precise multi-layer printed-wiring boards became possible.

As detailed above, the present invention includes transferring the wiring pattern layers each composed of the conductive layer or of the conductive layer and the insulating resin layer, formed on the transferring original plates, onto the substrate for multi-layer printed-wiring board, whereby the wiring pattern layers each having the conductive layer in the upper portion and the insulating resin layer in the lower portion can be laid in multiple layers on the substrate for multi-layer printed-wiring board. Since this multi-layer lamination is such a parallel series process that a plurality of transferring original plates each having their predetermined wiring pattern layers are formed in parallel and that the wiring pattern layers are transferred in series with these transferring original plates, a defective product can be eliminated by check before transferring, thereby not only improving the manufacturing yield, but also attaining a high throughput. Further, obviated is a need to perform formation of wiring layers, plating for patterning, and the photoetching step, which were conventionally carried out on the substrate, thereby enabling to simplify the manufacturing steps. Furthermore, the wiring patterns are not coated with an insulating layer in the multi-layer printed-wiring board, which used to be observed in the conventional multi-layer printed-wiring boards; the electrically conductive layer constituting each wiring pattern layer is always partially exposed; and mutual connection of wiring pattern layers can be made easily in an intersecting portion of the wiring pattern layers or in a portion where the wiring pattern layers are close to each other, thereby enabling to provide multi-layer printed-wiring boards with extremely high general versatility.

Modifications of Transferring Original Plates
(Modification 1)

Figure 2:
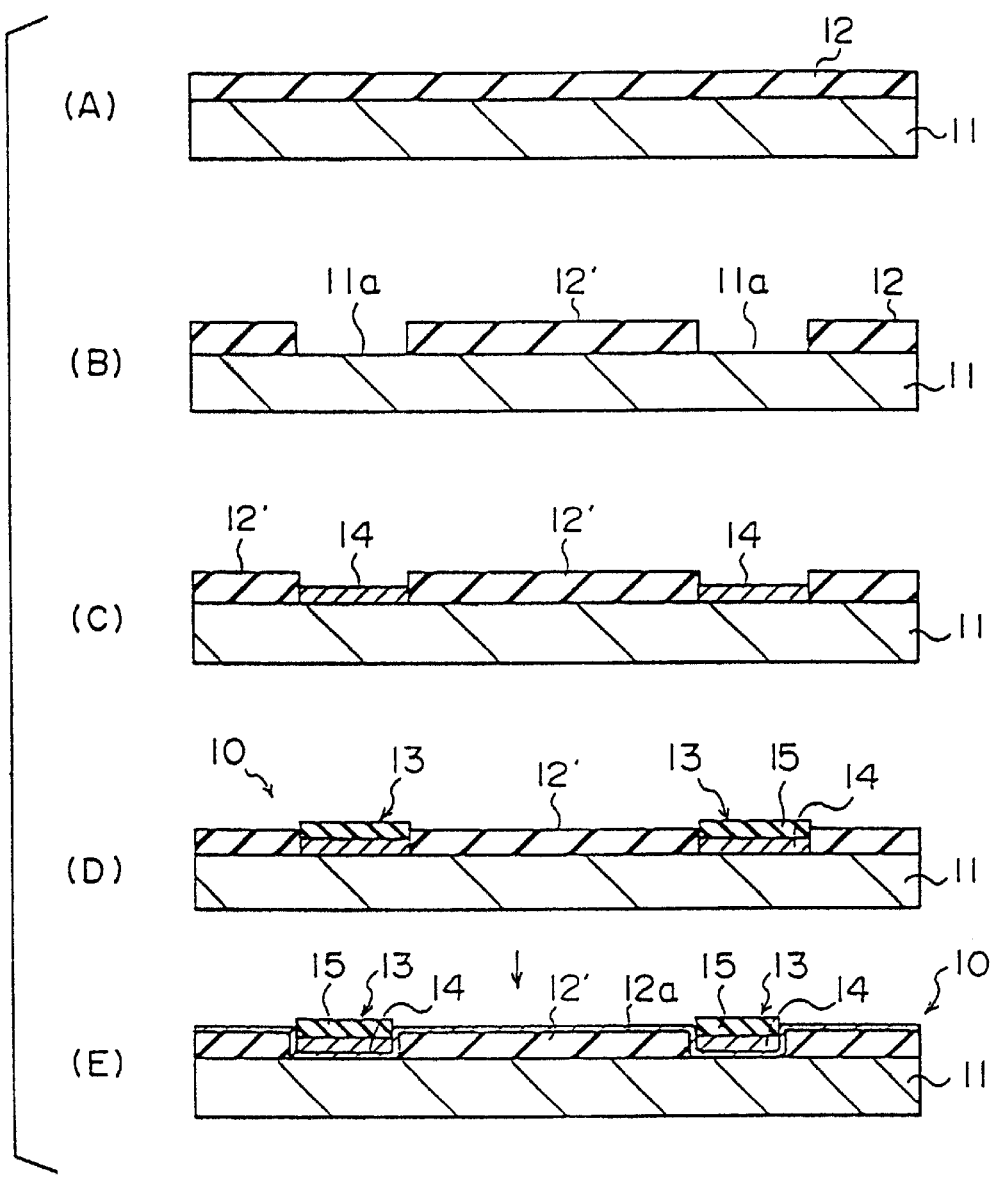
FIG. 2 is a drawing to illustrate a process for producing the multi-layer printed-wiring board of the present invention.

A modification of the transferring original plate 10 shown in FIG. 2 is described below.

The substrate 11 used for the transferring original plate 10 may be a substrate made of a metal, at least the surface of which can be thermally-oxidized or nitrized and which shows electrical conductivity. Specifically, there may be listed thermally oxidizable metal plates such as stainless steel (SUS), Ti, Ta, etc.; nitrizable metal plates such as Ti, Si, etc.; or those obtained by forming a thin film of one of the above thermally-oxidizable or nitrizable metals on a surface of an electrically conductive substrate. The thickness of the above metal thin film is preferably in the range of about 1 to 2 $\mu$m.

Here, the surface of substrate 11 is preferably subjected to mirror finishing to some extent in order that a plating layer can be readily peeled off from the substrate in transfer of the plating layer to a processed product as described below.

The surface of the substrate 11, made of a thermally-oxidizable or nitrizable metal, is subjected to a thermal oxidation treatment or a nitrization treatment to form a thin film of an oxide or a nitride of the metal. In this case, the thickness of the thin film is preferably in the range of about 0.1 to 0.5 $\mu$m. Next, a photoresist layer is formed in a predetermined pattern on the thin film. Then, the thin film is etched with the photoresist layer as a mask, thereby exposing the conductive metal surface of the substrate 11. Then, the photoresist layer is removed to obtain a transferring original plate 10 having the insulating masking layer of the oxide or nitride on the surface of the conductive substrate 11. Since the insulating masking layer has electrical insulation properties, no plating layer will grow on the insulating masking layer in the subsequent steps.

(Modification 2)

The substrate 11 used for the transferring original plate 10 may be a substrate made of a metal at least the surface of which is anodizable. Specifically, there are anodizable metal plates such as Al, Ta, Ti, etc., or those obtained by forming a thin film of one of the above anodizable metals, on a surface of a conductive substrate.

Here, the surface of substrate is preferably subjected to mirror finishing to some extent in order that a plating layer can be readily peeled off from the substrate in the transfer of the plating layer to a processed product as described below.

A photoresist layer is formed in a predetermined pattern on the substrate 11. Next, the substrate 11 is etched to form recess portions. Then, anodization of the substrate 11 is effected in an anodization solution with the substrate 11 as the anode and a platinum plate as the cathode, thereby forming an anodized film in photoresist-absent portions on the substrate 11. The anodized film is a film having electrical insulation properties, and an insulating masking layer comprised of the anodized film can be obtained by thereafter removing the photoresist layer to expose conductive portions of the substrate 11.

(Modification 3)

The substrate 11 used for the transferring original plate 10 may be a metal plate at least the surface of which is made of Ti—Al or one obtained by forming a thin film of Ti—Al on a surface of a conductive substrate. The composition of the Ti—Al film is preferably Ti:Al=50:50 (which is a composition ratio in atom %) in terms of crystallinity and electrical insulation properties of the oxidized film.

Here, the surface of substrate 11 is preferably subjected to mirror finishing to some extent in order that a plating layer can be readily peeled off from the substrate in transfer of the plating layer to a processed product as described below.

A photoresist layer is formed in a predetermined pattern on the substrate 11 comprised of the Ti—Al plate. Next, the substrate 11 is etched to form recess portions. Thereafter, anodization of the substrate 11 is effected in the anodization solution with the substrate 11 as the anode and the platinum plate as the cathode, thereby forming a Ti—Al anodized film on photoresist-absent portions on the substrate 11. The Ti—Al anodized film is a film having electrical insulation properties, and an insulating masking layer comprised of the Ti—Al anodized film can be obtained by thereafter removing the photoresist layer to expose conductive portions of the substrate 11.

(Modification 4)

A stainless steel substrate 11 for transferring original plate 10 is subjected to a heat treatment, and then a resist film is formed on the stainless steel substrate 11. The resist film is then subjected to exposure through a photomask having a desired fine pattern and to development, thereby obtaining an insulating masking layer of the resist on the stainless steel substrate 11. The conditions of the heat treatment for the stainless steel substrate 11 may be set as a heating temperature in the range of about 150 to 300° C. and a heating time in the range of from 1 to 3 hours. If the heating temperature and the heating time were set lower than the above ranges, residual stress in the direction of rolling or residual stress due to tension upon rolling in the stainless steel substrate 11 could not be completely removed, which would result in shrinkage of the stainless steel substrate 11 occurring after completion of production of the original plate for forming fine patterns. Further, if the heat treatment were carried out over the above heating temperature and heating time, further effects could not be expected by the heat treatment, which would unpreferably increase the production cost.

There is no particular limitation on the stainless steel substrate 11 to be applicable in the present invention, and it may be one from conventional substrates which are used for original plates for forming fine patterns. Particularly, there are stainless steel substrates such as SUS304, SUS301, SUS430, SUS405, SUS403, SUS410, etc.

It is preferred that the stainless steel substrate 11 be preliminarily washed before the heat treatment of the stainless steel substrate 11. The washing of the stainless steel substrate 11 can be performed using a known washing means such as washing with an organic solvent, electrolytic degreasing in an alkali solution, or washing with water.

The resist used in the present invention may be one of known organic resists, for example, those with photosensitive properties provided by adding a substance having a photo-setting photosensitive group, for example one selected from diazo resins which are reaction products of diazonium compounds having a diazo group with paraformaldehyde, azido compounds having an azido group, cinnamic-acid-condensed resins obtained by condensation of cinnamic acid with polyvinyl alcohol, resins obtained using stylbazolium salts, and dichromates, to one or a mixture of two or more selected from the group consisting of natural proteins such as gelatin, casein, glue, egg white albumin, etc. carboxymethyl cellulose, polyvinyl alcohol, polyacrylic acid, polyacrylamide, polyvinyl pyrrolidone, polyethylene oxide, maleic anhydride copolymer, and the above resins modified with carboxylic acid or sulfonic acid. Here, the photo-sensitive group is not necessarily limited to the above-described photo-setting photosensitive group.

(Modification 5)

The insulating masking layer for the transferring original plate 10 may be a ceramic precursor polymer or a curing type resin, for example. More particularly, the ceramic precursor polymer may be one from silazane polymers, and silanol compounds $Si(OR)_n(OH)_{4-n}$ (R:hydrocarbon group). When a ceramic precursor polymer is used for the insulating substance, curing of the insulating film can be effected by baking the ceramic precursor polymer.

On the other hand, a thermo-setting resin may be used from melamine resins, urea resins, polyimides, epoxy resins, novolak resins, etc. An ultraviolet-curing resin may also be used from epoxy resins, etc. Further, an electron-radiation-curing resin may also be used from epoxy resins, etc. When the above curing type resins are used for insulating substance, curing of insulating film can be effected by heating, irradiation of ultraviolet rays, or irradiation of electron beams.

Further, the insulating masking layer may be formed of an inorganic thin film such as $SiO_2$, $SiN_x$, $Ta_2O_5$, etc. produced in vacuum. If the above inorganic thin film is used for the insulating masking layer, it becomes unnecessary to cure the insulating film remaining in the recess portions at the stage when the conductive portions of the substrate 11 are exposed by removing the insulating film on the photoresist layer by the lift-off process after forming the insulating film of the inorganic thin film over the entire surface of substrate 11.
(Modification 6)

The transferring original plate 10 is provided with a substrate 11, at least the surface of which shows electrical conductivity, a chromate-treated surface formed in a predetermined pattern on the substrate 11, and an insulating masking layer formed on the chromate-treated surface. The substrate 11 may be one having electrical conductivity. Particularly, the substrate 11 may be any in which recess portions can be formed by etching, and may be a substrate comprised of an electrically conductive metal such as stainless steel, titanium, nickel, etc. The thickness of the substrate 11 is preferably in the range of about 0.2 to 2 mm.

Here, the surface of substrate 11 is preferably subjected to mirror finishing to some extent in order to readily peeling off a plating layer from the substrate 11 in transferring the plating layer to a processed product as described below.

First, a photoresist layer is formed in a predetermined pattern on the substrate 11. Next, the substrate 11 is subjected to a chromate treatment to form a chromate-treated surface on exposed portions of the substrate 11. Then, the entire surface of the substrate 11 is coated with a coating solution of an insulating substance to form an insulating film, and the insulating film on the photoresist layer is removed by the lift-off process at the same time with removing the photoresist layer, thereby exposing conductive portions of the substrate 11. By this, the insulating film is left only on the chromate-treated surface in the substrate 11, and an insulating masking layer can be obtained by curing the remaining insulating film, as occasion demands.
Second Embodiment The second embodiment of the present invention is described below referring to the drawings. Here, same portions as those in the first embodiment shown in FIG. 1 to FIG. 25 are denoted by the same reference numerals and detailed description thereof is omitted.

Figure 26:
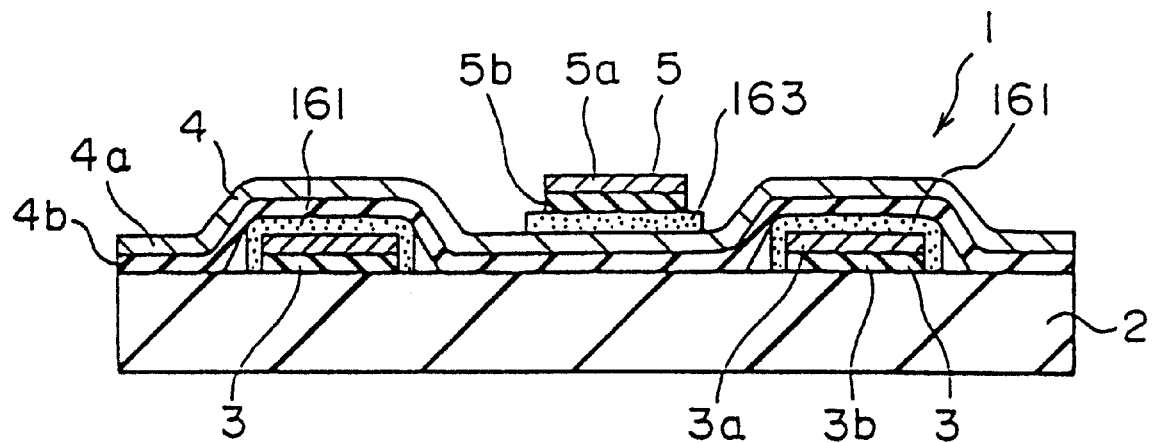
FIG. 26 is a schematic sectional view of the multi-layer printed-wiring board to show the second embodiment of the present invention.

FIG. 26 is a schematic sectional view to show an example of the multi-layer printed-wiring board of the present invention. In FIG. 26, the multi-layer printed-wiring board 1 is provided with a substrate 2 for multi-layer printed-wiring board, a first layer of wiring pattern layer 3 formed on the substrate 2 for multi-layer printed-wiring board, a second layer of wiring pattern layer 4 laid on the wiring pattern layer 3, and a third layer of wiring pattern layer 5 further laid on the wiring pattern layer 4, and thus is a multi-layer printed-wiring board having the three-layer structure.

Further, an additional insulating layer 161 is interposed in portions where the first layer of wiring pattern layer 3 and the second layer of wiring pattern layer 4 laid on the wiring pattern layer 3 overlap each other, as shown in FIG. 26. Further, an additional insulating layer 163 is interposed in portions where the second layer of wiring pattern layer 4 and the third layer of wiring pattern layer 5 laid on the wiring pattern layer 4 overlap each other. The additional insulating layer 163 covers a part of the second layer of wiring pattern layer 4 of a band shape, but because FIG. 26 is the sectional view, it might be hard to seize its image. Then, the specific structure can be readily understood with reference to the perspective view of FIG. 28.

In addition, such a case is naturally expected that the first layer of wiring pattern layer 3 and the third layer of wiring pattern layer 5 overlap each other, and the additional insulating layer 161 is also interposed in an overlapping portion in this case.

Each wiring pattern layer 3, 4, 5 constituting the multi-layer printed-wiring board 1 has an electrically conductive layer 3a, 4a, 5a and an insulating resin layer 3b, 4b, 5b formed under the conductive layer. The multi-layer printed-wiring board 1 is of a superposition printing structure, in which the wiring pattern layers 3, 4, 5 are sequentially transferred to be laid on the substrate 2 or the lower wiring pattern layer and in which the additional insulating layers 161, 163 are interposed in the overlapping portions of the wiring pattern layers as described above, thereby making sure electrical insulation between the upper and lower wiring pattern layers. Namely, although the insulation between the upper and lower wiring pattern layers can be attained by the insulating resin layers 3b, 4b, 5b each constituting the upper wiring pattern layers, the additional insulating layers 161, 163 newly added are interposed in addition to them, thereby improving reliability of the multi-layer printed-wring board 1 in the present invention.

Here, since the multi-layer printed-wiring board 1 of the present invention takes such a structure that the additional insulating layers 161, 163 are selectively interposed in the portions where the wiring pattern layers overlap each other, the conductive layer 3a, 4a, 5a of the wiring pattern layer 3, 4, 5 is always partially exposed in the other portions, thereby readily making electrical connection between wiring pattern layers near an intersecting portion of wiring pattern layers or in a portion where wiring pattern layers come to abut on each other (abutting portion).

Figure 28:
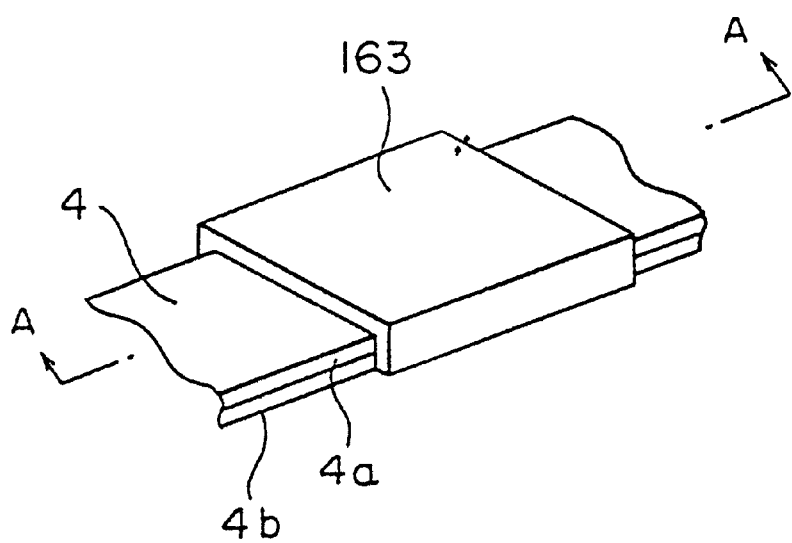
FIG. 28 is a perspective view to show a state in which an insulating layer is formed on the wiring pattern layer.

It is desired that the additional insulating layer 161, 163 interposed in the overlapping portion of wiring pattern layers be shaped to completely cover the entire top and side surfaces of wiring pattern layer in the overlapping portion, as shown in FIG. 26 and FIG. 28. It is because electrical insulation is completely assured thereby. The material and process for producing such an insulating layer will be described later.

Figure 27:
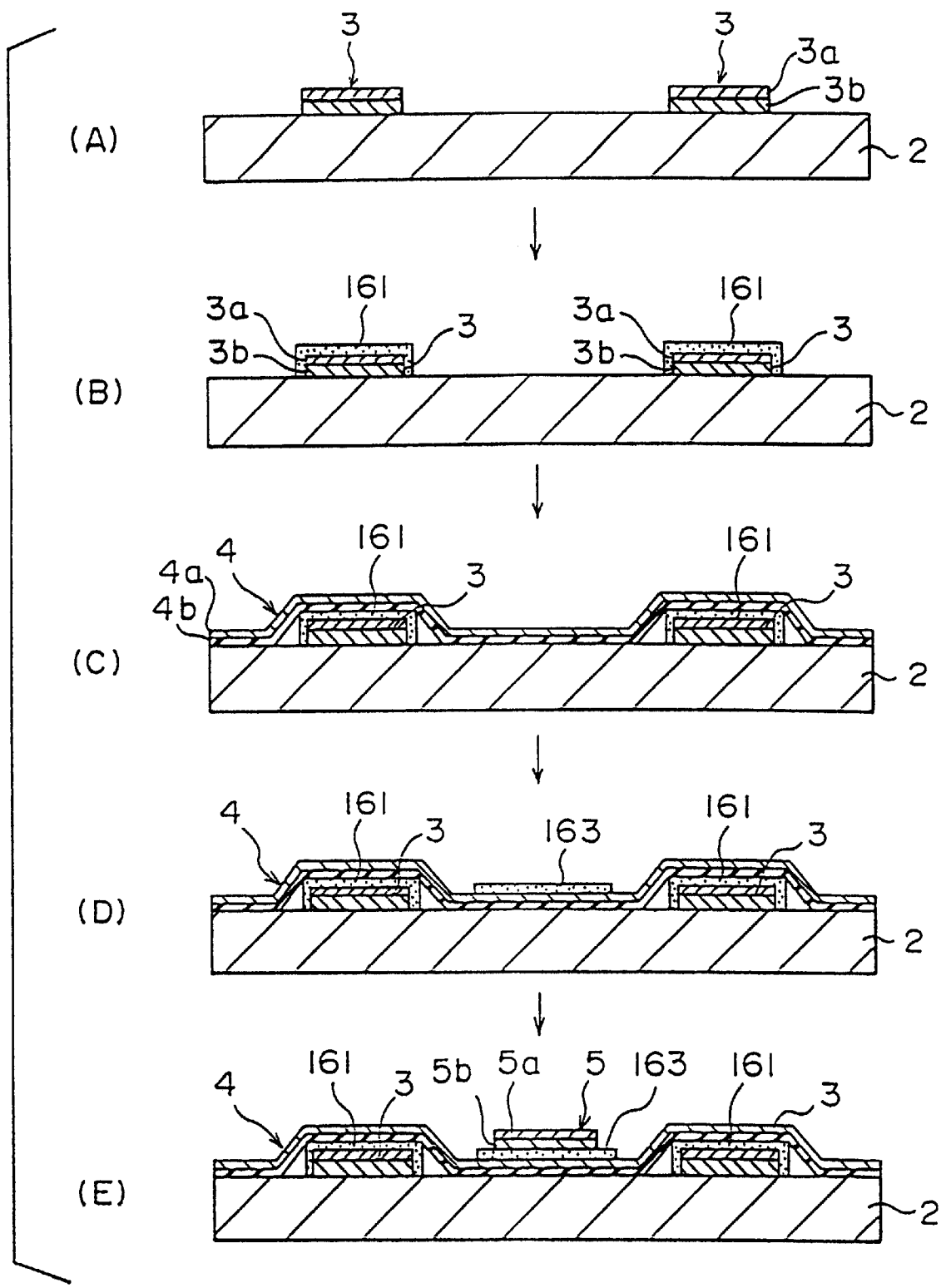
FIG. 27 is a drawing to illustrate a process for producing the multi-layer printed-wiring board of the present invention.

Next, a process for producing the multi-layer printed-wiring board of the present invention is described, referring to FIG. 27, with an example of production of the above multi-layer printed-wiring board 1.

First, the above transferring original plate 10 for wiring pattern layer (see FIG. 2) is pressed onto the substrate 2 for multi-layer printed-wiring board so as to bring the insulating resin layer 15 into contact with the substrate 2. This pressing is effected by either of roller pressing, plate pressing, vacuum pressing, etc. Further, if the insulating resin layer is made of an insulating resin which shows the sticky or adhesive property when heated, thermal pressing may be employed. Then, the conductive substrate 11 is released so as to transfer the wiring pattern layer 13 onto the substrate 2, whereby the first layer of wiring pattern layer 3 having the conductive layer 3a and the insulating resin layer 3b is formed on the substrate 2 for multi-layer printed-wiring board (FIG. 27(A)).

The additional insulating layer is formed in overlapping-intended portions between the first layer of wiring pattern layer 3 thus formed and, the second layer of wiring pattern layer 4 or the third layer of wiring pattern layer 5 to be formed in the next step. The overlapping-intended portion means a portion where overlapping naturally occurs when a wiring pattern layer to be laid in the next step is transferred. In the example shown in FIG. 27, it is assumed that the second layer of wiring pattern layer 4 only overlaps the first layer of wiring pattern layer 3 (actually, the third layer of wiring pattern layer 5 frequently overlaps it) in order to make understanding easier, and the additional insulating layer 161 is formed by screen printing with a screen printing plate which is preliminarily produced so as to match the pattern of the overlapping-intended portions where the wiring pattern layers overlap each other (FIG. 27(B)). There is no particular limitations on the ink composition for the printing as long as electrical insulation after coating and drying can be assured. However, a polyimide resin solution (Semicofine SP-110, manufactured by Toray) and an epoxy resin solution can be listed as more suitable, specific examples. Preferably used is the polyimide resin.

Then, after achieving alignment of the transferring original plate 20 (see FIG. 3) for the second layer of wiring pattern layer with the first layer of wiring pattern layer 3, the wiring pattern layer is similarly transferred onto the substrate 2 on which the first layer of wiring pattern layer 3 was transfer-formed, thereby forming the second layer of wiring pattern layer 4 having the conductive layer 4a and the insulating resin layer 4b (FIG. 27(C)). On this occasion, the additional insulating layer 161 is interposed in the overlapping portions between the first layer of wiring pattern layer 3 and the second layer of wiring pattern layer 4.

Next, the additional insulating layer 163 is formed this time in an overlapping-intended portion between the second layer of wiring pattern layer 4 and the third layer of wiring pattern layer 5 laid in the next step. It is assumed that the third layer of wiring pattern layer 5 only overlaps the second layer of wiring pattern layer 4, and the additional insulating layer 163 is formed by screen printing with a screen printing plate which is preliminarily produced so as to match the pattern of the overlapping-intended portion between the wiring pattern layers (FIG. 27(D)). Since the cross section of FIG. 27(D) failed to show an image of the insulating layer 163 covering the second layer of wiring pattern layer 4, reference should be made to the perspective view of FIG. 28. A view taken along A–A' and observed along the arrows corresponds to the sectional view of FIG. 27(D).

Next, after achieving the like alignment using the transferring original plate 30 (see FIG. 4) for the third layer of wiring pattern layer, another wiring pattern layer is transferred onto the substrate 2, on which the first layer of wiring pattern layer 3 and the second layer of wiring pattern layer 4 were transfer-formed, thereby forming the third layer of wiring pattern layer 5 having the conductive layer 5a and the insulating resin layer 5b (FIG. 27(E)). On this occasion, the additional insulating layer 163 is interposed in the overlapping portion between the second layer of wiring pattern layer 4 and the third layer of wiring pattern layer 5. It is noted here that the number of overlapping portions between the wiring pattern layers in FIG. 27 was explained just as an example including an as small number thereof as possible for easier understanding, but it is by no means limited to the number exemplified, of course.

Figure 29:
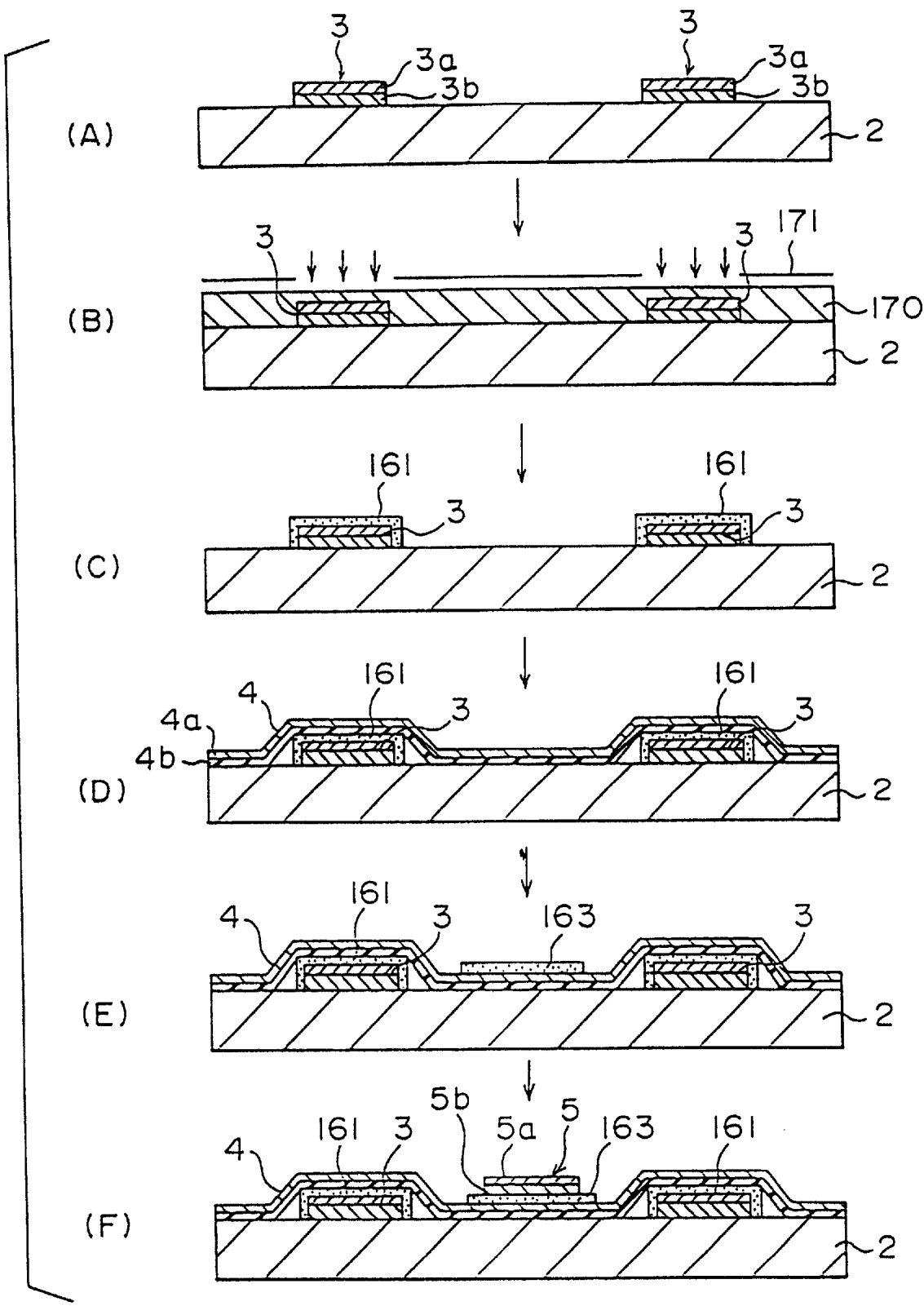
FIG. 29 is a drawing to illustrate a process for producing the multi-layer printed-wiring board of the present invention.

Next, described is another example for interposing the insulating layer in the overlapping portions between the wiring pattern layers, referring to FIG. 29.

FIG. 29(A) shows a state in which the first layer of wiring pattern layer 3 having the conductive layer 3a and insulating resin layer 3b is transferred onto the substrate 2 for multi-layer printed-wiring board, and the first layer of the wiring pattern layer 3 is formed in the same manner as in FIG. 27(A).

Next, onto the substrate 2 on which the first layer of wiring pattern layer 3 was transferred and cured, a photosensitive insulating material, particularly preferably a photosensitive coating solution composed mainly of a photosensitive polyimide resin, is applied and dried, thereby forming a photosensitive insulating coating film 170, as shown in FIG. 29(B). Either method of the plate coating method, the bar coating method, the dipping method, the spin coating method, etc. may be employed as the coating method. Thereafter, the photosensitive insulating coating film 170 is subjected to shadow printing with a photomask 171 which is preliminary prepared so as to match the pattern of the overlapping-intended portions between the first layer of wiring pattern layer 3 and, the second layer of wiring pattern layer 4 or the third layer of wiring pattern layer 5 to be transferred in the next step (FIG. 29(B)). Thereafter, after performing development and patterning of the overlapping-intended portions, the substrate is subjected to a heat treatment in an oven or by a hot plate, thereby curing the insulating coating film to form the additional insulating layer 161 (FIG. 29(C)). Then, after achieving alignment of the transferring original plate 20 (see FIG. 3) for the second layer of wiring pattern layer with the first layer of wiring pattern layer 3, the wiring pattern layer is similarly transferred onto the substrate 2 on which the first layer of wiring pattern layer 3 was transfer-formed, thereby forming the second layer of wiring pattern layer 4 having the conductive layer 4a and the insulating resin layer 4b (FIG. 29(D)). On this occasion, the additional insulating layer 161 is interposed in the overlapping portions between the first layer of wiring pattern layer 3 and the second layer of wiring pattern layer 4.

Next, the additional insulating layer 163 is formed in the overlapping-intended portion between the second layer of wiring pattern layer 4 and the third layer of wiring pattern layer 5 to be transferred in the next step (FIG. 29(E)). The additional insulating layer 163 is formed along the steps shown in FIGS. 29 (B)–(C) in accordance with the formation of the above additional insulating layer 161. Since the cross section of FIG. 29(E) failed to show an image of the insulating layer 163 covering the second layer of wiring pattern layer 4, reference should be made to the perspective view of FIG. 28. A view taken along A–A' and observed along the arrows corresponds to the sectional view of FIG. 29(E).

Further, after achieving the like alignment using the transferring original plate 30 (see FIG. 4) for the third layer of wiring pattern layer, another wiring pattern layer is transferred onto the substrate 2, on which the first layer of wiring pattern layer 3 and the second layer of wiring pattern layer 4 were transfer-formed, thereby forming the third layer of wiring pattern layer 5 having the conductive layer 5a and the insulating resin layer 5b (FIG. 29(F)). On this occasion, the additional insulating layer 163 is interposed in the overlapping portion between the second layer of wiring pattern layer 4 and the third layer of wiring pattern layer 5.

It is noted here that the number of overlapping portions between the wiring pattern layers in FIG. 29 was explained just as an example including an as small number thereof as possible for easier understanding, but it is by no means limited to the number exemplified, of course.

The photosensitive polyimide resin is preferably used, as described above, as the photosensitive insulating material for forming the insulating layer as shown in FIG. 29. Use of the photosensitive polyimide resin provides a merit of achieving higher insulation.

Figure 30:
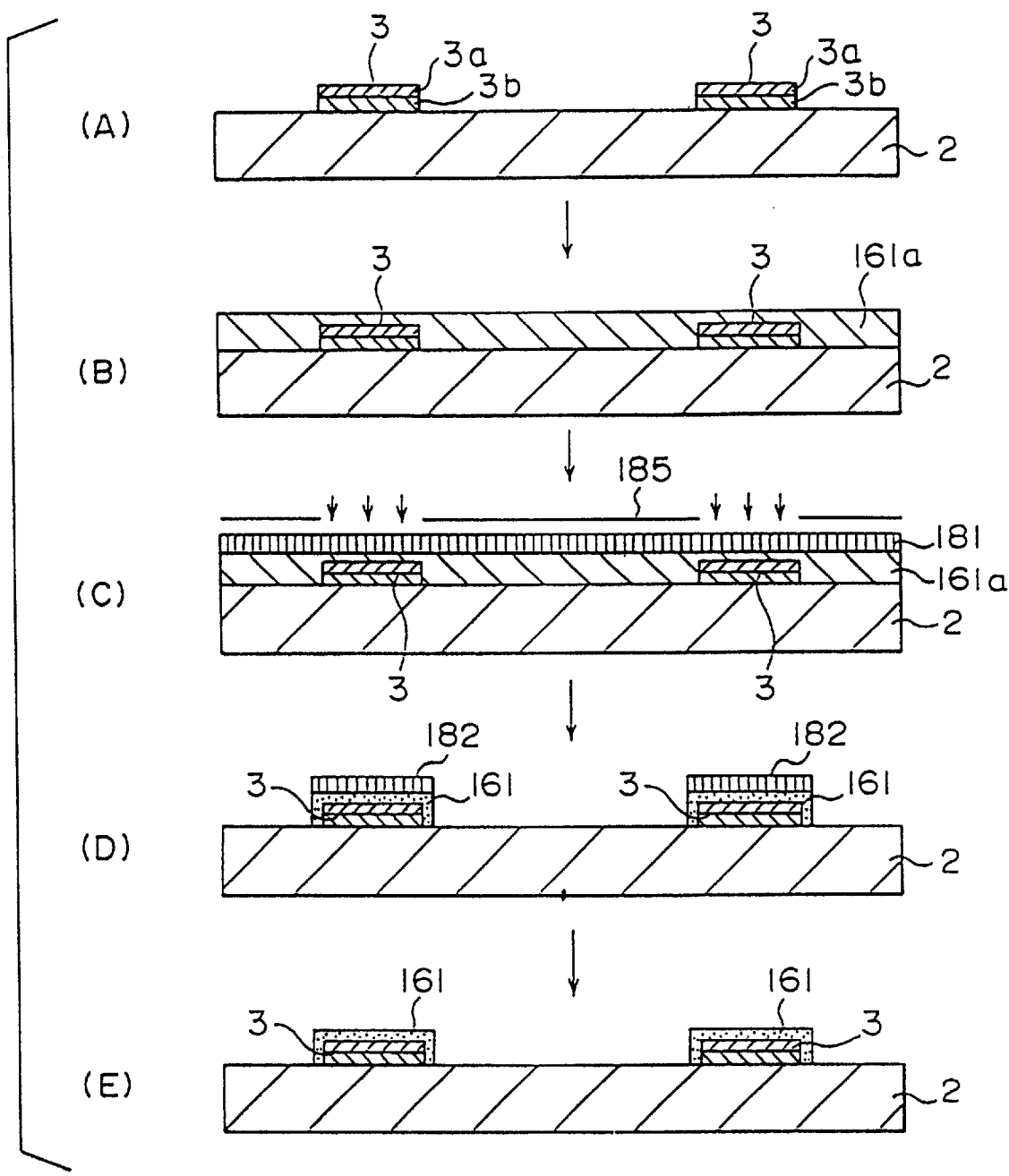
FIG. 30 is a drawing to illustrate a process for producing the multi-layer printed-wiring board of the present invention.
Figure 31:
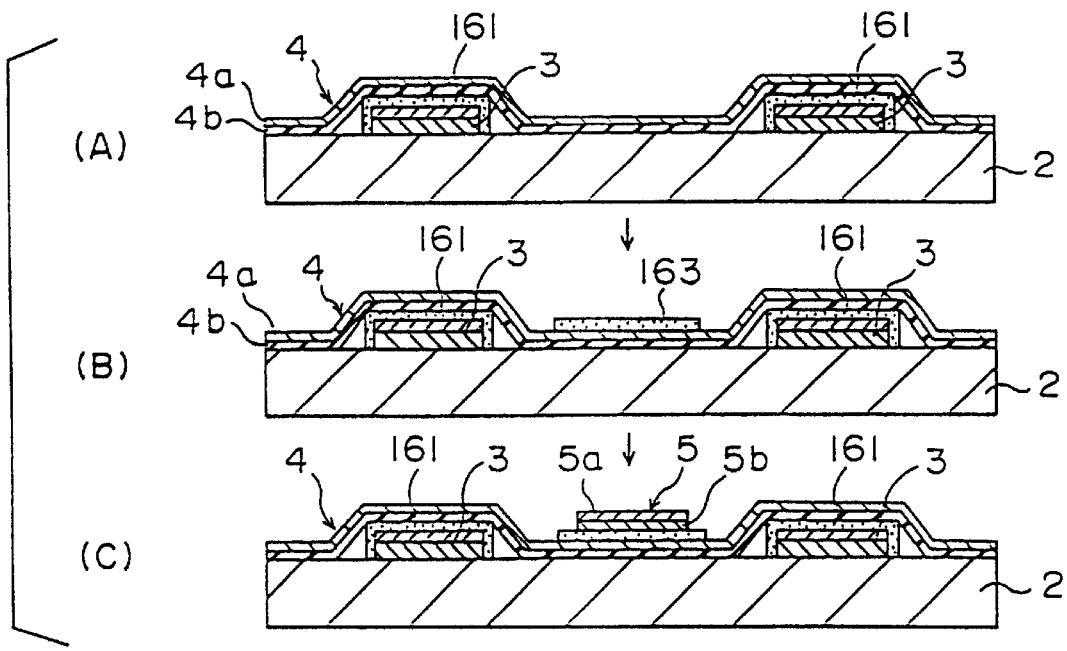
FIG. 31 is a drawing to illustrate a process for producing the multi-layer printed-wiring board of the present invention.

Next described is a further example for interposing the insulating layer in the overlapping portions between the wiring pattern layers, referring to FIG. 30 to FIG. 31.

FIG. 30(A) shows a state in which the first layer of wiring pattern layer 3 having the conductive layer 3a and insulating resin layer 3b is transferred onto the substrate 2 for multi-layer printed-wiring board, which is formed in the same manner as in FIG. 27(A) described above.

Next, to the substrate 2 on which the first layer of wiring pattern layer 3 was transferred and cured, an insulating material (polyimide resin or epoxy resin), particularly preferably a coating solution composed mainly of a polyimide resin, is applied and dried, thereby forming an insulating coating film 161a, as shown in FIG. 30(B). Either method of the plate coating method, the bar coating method, the dipping method, the spin coating method, etc. may be employed as the coating method.

Then, a photoresist layer 181 is formed and dried as shown in FIG. 30(C). The photoresist layer 181 may be formed by either of the plate coating method, the bar coating method, the dipping method, the spin coating method, etc. Thereafter, the photoresist layer 181 is subjected to shadow printing with a photomask 185 which was preliminarily prepared so as to match the pattern of overlapping-intended portions between the first layer of wiring pattern layer 3 and the second layer of wiring pattern layer 4 (or the third layer of wiring pattern layer 5) to be transferred in the next step (FIG. 30(C)).

Thereafter, after effecting development and patterning in the overlapping-intended portions (formation of resist 182), exposed portions of the insulating coating film 161a are removed by etching (FIG. 30(D)). Further, the resist 182 is removed by etching, and thereafter the substrate is subjected to a heat treatment in an oven or by a hot plate, thereby curing the residual insulating coating film to form the additional insulating layer 161 (FIG. 30(E)).

Then, after achieving alignment of the transferring original plate 20 (see FIG. 3) for the second layer of wiring pattern layer with the first layer of wiring pattern layer, another wiring pattern layer is similarly transferred onto the substrate 2, on which the first layer of wiring pattern layer 3 was transfer-formed, thereby forming the second layer of wiring pattern layer 4 having the conductive layer 4a and the insulating resin layer 4b (FIG. 31(A)). On this occasion, the additional insulating layer 161 is interposed in the overlapping portions between the first layer of wiring pattern layer 3 and the second layer of wiring pattern layer 4.

Next, the additional insulating layer 163 is then formed in the overlapping-intended portion between the second layer of wiring pattern layer 4 and the third layer of wiring pattern layer 5 to be laid in the next step (FIG. 31(B)). The additional insulating layer 163 may be formed along the steps as shown in (FIGS. 30(B)–(E)) in accordance with the formation of the above additional insulating layer 161. Since the cross section of FIG. 31(B) failed to show an image of the insulating layer 163 covering the second layer of wiring pattern layer 4, reference should be made to the perspective view of FIG. 28. A view taken along A–A' and observed along the arrows corresponds to the sectional view of FIG. 31(B).

Next, after achieving the like alignment using the transferring original plate 30 (see FIG. 4) for the third layer of wiring pattern layer, another wiring pattern layer is transferred onto the substrate 2, on which the first layer of wiring pattern layer 3 and the second layer of wiring pattern layer 4 were transfer-formed, thereby forming the third layer of wiring pattern layer 5 having the conductive layer 5a and the insulating resin layer 5b (FIG. 31(C)). On this occasion, the additional insulating layer 163 is interposed in the overlapping portion between the second layer of wiring pattern layer 4 and the third layer of wiring pattern layer 5. It is noted here that the number of overlapping portions between the wiring pattern layers in FIG. 30 and FIG. 31 was explained just as an example including an as small number thereof as possible for easier understanding, but it is by no means limited to the number exemplified, of course.

Figure 32:
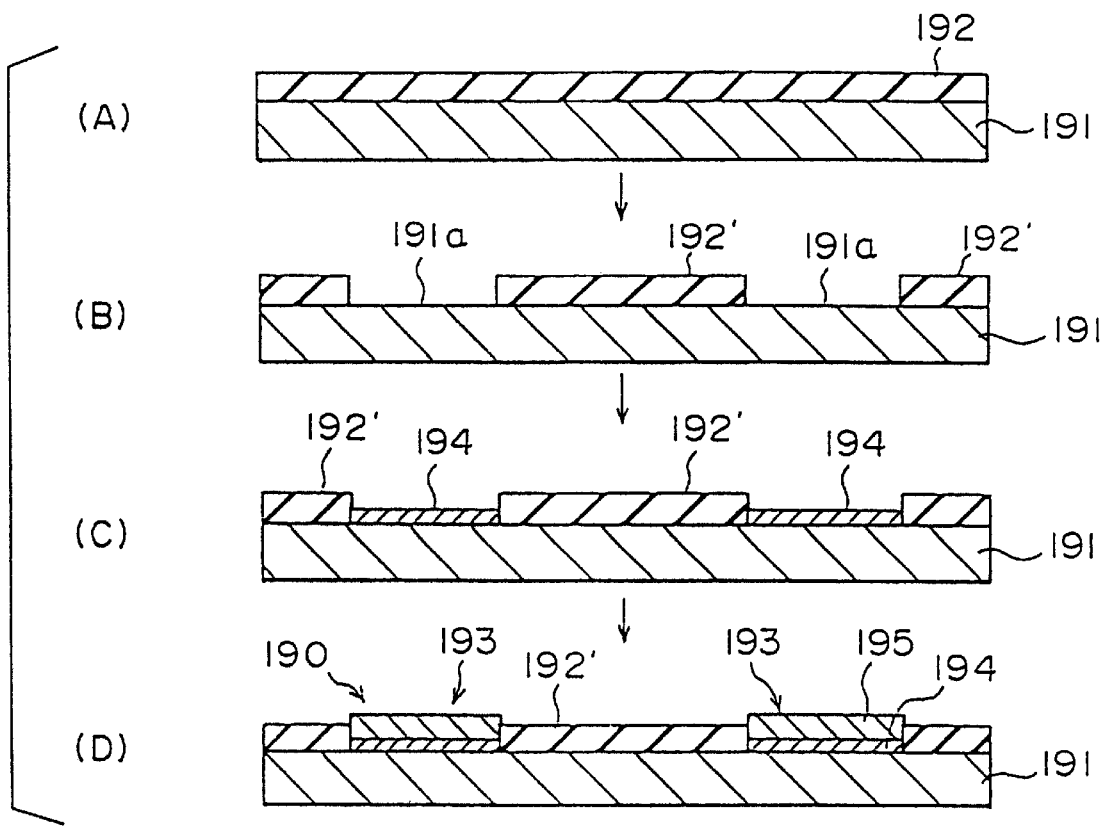
FIG. 32 is a drawing to illustrate a process for producing the multi-layer printed-wiring board of the present invention.
Figure 33:
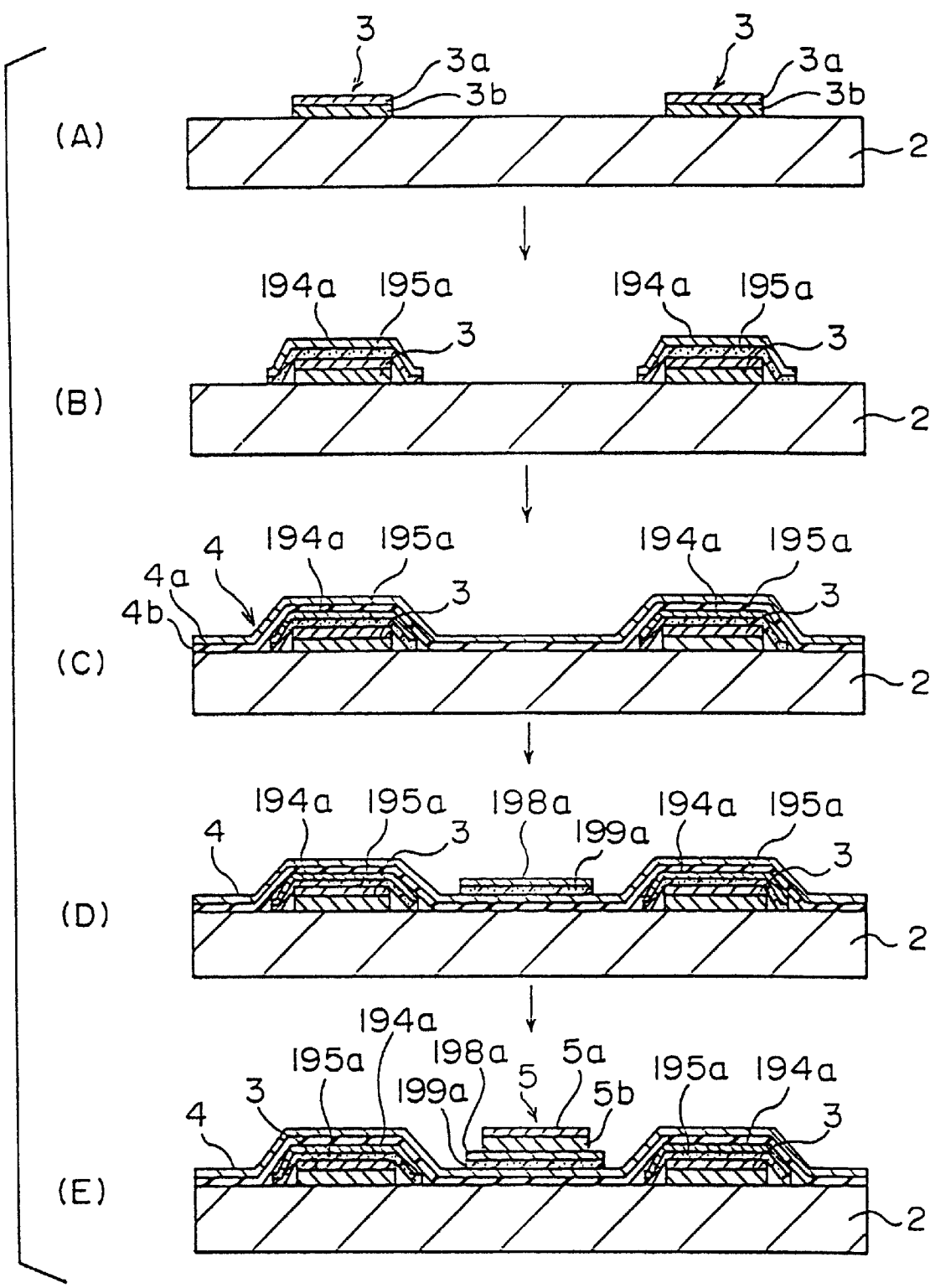
FIG. 33 is a drawing to illustrate a process for producing the multi-layer printed-wiring board of the present invention.

Next described is a yet further example for interposing the insulating layer in the overlapping portions of the wiring pattern layers, referring to FIG. 32 to FIG. 33.

The additional insulating layer is formed by preliminarily preparing an insulating layer transferring substrate provided with an insulating layer pattern to match the pattern of the overlapping-intended portions between the wiring pattern layers and transferring the insulating pattern onto the substrate for multi-layer printed-wiring board. Accordingly, the insulating layer transferring substrate 190 (FIG. 32(D)) is first prepared as shown in FIG. 32. Namely, a photoresist is laid on a conductive substrate 191 for the insulating layer transferring substrate, thereby forming a photoresist layer 192 (FIG. 32(A)). Then the photoresist layer 192 is subjected to shadow printing with a photomask (not shown) which was preliminarily prepared so as to match the pattern of the overlapping-intended portions between the first layer of wiring pattern layer 3, as described above, and the second layer of wiring pattern layer 4 (or the third layer of wiring pattern layer 5) to be transferred in the next step, and is then developed, thereby exposing insulating pattern portions 191a of the conductive substrate 191 (FIG. 32(B)). Next, a conductive layer 194 is formed on the insulating pattern portions 191a of the conductive substrate 191 by the plating method (FIG. 32(C)). In this case, the conductive layer 194 is used as a releasing layer. After that, a sticky or adhesive insulating resin layer 195 is formed and dried on the conductive layer 194 by electro-deposition, thereby forming the insulating layer transferring substrate (FIG. 32(D)). Another insulating layer transferring substrate having an insulating layer pattern to match the pattern of the overlapping-intended portion between the second layer of wiring pattern layer 4 and the third layer of wiring pattern layer 5 to be laid in the next step is preliminarily formed in the same manner (not shown). It is noted that the materials for the conductive layer 194 and the insulating resin layer 195 may be the same materials as those for the conductive layers 3a, 4a, 5a and the insulating resin layers 3b, 4b, 5b, respectively.

FIG. 33 shows an example in which a multi-layer printed-wiring board is formed with the insulating layer transferring substrate 190 etc. thus prepared.

FIG. 33(A) shows a state in which the first layer of wiring pattern layer 3 having the conductive layer 3a and insulating resin layer 3b is transferred on the substrate 2 for multi-layer printed-wiring board, which is formed in the same manner as in FIG. 27(A).

The insulating layer transferring substrate 190 is pressed onto the substrate, on which the first layer of wiring pattern layer 3 was formed. On this occasion, the pressing is effected by either of roller pressing, plate pressing, vacuum pressing, etc. Further, if the insulating resin layer 195 is made of an insulating resin which shows the sticky or adhesive property when heated, thermal pressing may be employed. Then the insulating layer transferring substrate 190 is released to transfer the insulating layer pattern, thereby forming the insulating layer pattern having the conductive layer 194a and the additional insulating layer 195a on the substrate. The additional insulating layer 195a is cured after transfer (FIG. 33(B)).

Then, after achieving alignment of the transferring original plate 20 (see FIG. 3) for the second layer of wiring pattern layer with the first layer of wiring pattern layer, another wiring pattern layer is similarly transferred onto the substrate 2, on which the first layer of wiring pattern layer 3 was transfer-formed, thereby forming the second layer of wiring pattern layer 4 having the conductive layer 4a and the insulating resin layer 4b (FIG. 33(C)). On this occasion, the additional insulating layer 195a (conductive layer 194a) is interposed in the overlapping portions between the first layer of wiring pattern layer 3 and the second layer of wiring pattern layer 4.

Next, the insulating layer transferring substrate having the insulating layer pattern to match the pattern of the overlapping-intended portion between the second layer of wiring pattern layer 4 and the third layer of wiring pattern layer 5 to be laid in the next step, is subjected to transfer, thereby forming the insulating layer pattern having the conductive layer 198a and the additional insulating layer 199a. The insulating layer is cured after transfer (FIG. 33(D)).

Then, after achieving the like alignment using the transferring original plate 30 (see FIG. 4) for the third layer of wiring pattern layer, another wiring pattern layer is transferred onto the substrate 2, on which the first layer of wiring pattern layer 3 and the second layer of wiring pattern layer 4 were transfer-formed, thereby forming the third layer of wiring pattern layer 5 having the conductive layer 5a and the insulating resin layer 5b (FIG. 33(E)). On this occasion, the additional insulating layer 199a is interposed in the overlapping portion between the second layer of wiring pattern layer 4 and the third layer of wiring pattern layer 5. It is noted here that the number of overlapping portions between the wiring pattern layers in FIG. 33 was explained just as an example including an as small number thereof as possible for easier understanding, but it is by no means limited to the number exemplified, of course.

Next described is another interposing method of the additional insulating layer by the dispensing method, which is similar to the screen printing method in the first example, again referring to FIG. 27. The dispensing method can be easily understood for example by imaging a method to eject a coating solution from the tip of a needle of injector and to apply it.

First, the first layer of wiring pattern layer 3 is formed in the same manner as in the above method of FIG. 27(A). An insulating layer is preliminarily formed by the dispensing method using a solution coating apparatus (XYD-4550ZC manufactured by Micro Giken (KK)) only on the overlapping-intended portions of wiring patterns on the substrate 2, on which the first layer of wiring pattern layer 3 thus formed was transferred and cured (FIG. 27(B)). There is no particular limitations as to the ink for the dispensing method as long as electrical insulation after coating and drying can be assured, but a solution composed mainly of a polyimide resin (Semicofine SP-110 manufactured by Toray (KK)) may be listed as a more suitable, specific example. The additional insulating layer 161 is formed by coating and drying it.

Thereafter, after achieving alignment of the transferring original plate 20 for the second layer of wiring pattern layer with the first layer of wiring pattern layer 3, another wiring pattern layer is similarly transferred onto the substrate 2, on which the first layer of wiring pattern layer 3 was transfer-formed, thereby forming the second layer of wiring pattern layer 4 having the conductive layer 4a and the insulating resin layer 4b (FIG. 27(C)). On this occasion, the additional insulating layer 161 is interposed in the overlapping portions between the first layer of wiring pattern layer 3 and the second layer of wiring pattern layer 4.

Next, the additional insulating layer 163 is formed this time in the overlapping-intended portion between the second layer of wiring pattern layer 4 and the third layer of wiring pattern layer 5 to be laid in the next step. It is assumed that the third layer of wiring pattern layer 5 only overlaps the second layer of wiring pattern layer 4, and the additional insulating layer 163 is formed by performing dispensing corresponding to the pattern of the overlapping-intended portion between the wiring pattern layers (FIG. 27(D)).

Further, after achieving the like alignment using the transferring original plate 30 for the third layer of wiring pattern layer, another wiring pattern layer is transferred onto the substrate 2, on which the first layer of wiring pattern layer 3 and the second layer of wiring pattern layer 4 were transfer-formed, thereby forming the third layer of wiring pattern layer 5 having the conductive layer 5a and the insulating resin layer 5b (FIG. 27(E)). On this occasion, the additional insulating layer 163 is interposed in the overlapping portion between the second layer of wiring pattern layer 4 and the third layer of wiring pattern layer 5.

The present invention is next described in further detail, as presenting experimental examples.

EXPERIMENT (1) Production 1 of Multi-layer Printed-wiring Board (Corresponding to FIG. 27)

The transferring original plates A1, A2, and A3 for the three types of wiring pattern layers prepared in (5) of Experiment 1 in the First Embodiment, were pressed in this order on a polyimide film substrate with the thickness of 50 $\mu$m under the following conditions, whereby the three types of wiring pattern layers, each composed of the electrically conductive layer and the insulating resin layer A, were transferred onto the film substrate, thereby forming a multi-layer printed-wiring board.

(Pressing Conditions)

Pressure: 20 kgf/cm$^2$

Temperature: 180° C.

Here, the additional insulating layer 161 was interposed in the overlapping portions between the first layer of wiring pattern layer 3 and the second layer of wiring pattern layer 4 to be formed in the next step, by screen printing with a screen printing plate which was preliminarily formed so as to match the pattern of the overlapping portions. Likewise, the additional insulating layer 163 was interposed on the second layer of wiring pattern layer 4 by screen printing with a screen printing plate which was preliminarily formed so as to match the pattern of the overlapping portion with the third layer of wiring pattern layer 5.

Semicofine SP-110 manufactured by Toray(KK) was used as the ink composition for forming the additional insulating layer 161 and additional insulating layer 163.

(2) Production 2 of Multi-layer Printed-wiring Board (Corresponding to FIG. 29)

The transferring original plates B1, B12, and B3 for the three types of wiring pattern layers prepared in (6) of Experiment 1 in the First Embodiment, were pressed in this order on a polyimide film substrate with the thickness of 50 μm under the following conditions, whereby the three types of wiring pattern layers, each composed of the electrically conductive layer and the insulating resin layer B, were transferred onto the film substrate, thereby forming a multi-layer printed-wiring board.

(Pressing Conditions)
Pressure: 50 kgf/cm$^2$
Temperature: 200° C.

Here, the additional insulating layer 161 of a polyimide resin was interposed in the overlapping portions between the first layer of wiring pattern layer 3 and the second layer of wiring pattern layer 4 to be formed in the next step, by the photolithography process with a photomask which was preliminarily formed so as to match the pattern in the overlapping portions. Likewise, the additional insulating layer 163 of a polyimide resin was interposed on the second layer of wiring pattern layer 4 by the photolithography process with a photomask which was preliminarily formed so as to match the pattern of the overlapping portion with the third layer of wiring pattern layer 5.

Photoniece UP-5100F manufactured by Toray (KK) was used as the photosensitive resin composition for forming the additional insulating layer 161 and additional insulating layer 163.

(3) Production 3 of Multi-layer Printed-wiring Board (Corresponding to FIG. 30 and FIG. 31)

The transferring original plates C1, C2, and C3 for the three types of wiring pattern layers prepared in (7) of Experiment 1 in the First Embodiment, were pressed in this order on a polyimide film substrate with the thickness of 50 μm under the following conditions, whereby the three types of wiring pattern layers, each composed of the electrically conductive layer and the insulating resin layer C, were transferred onto the film substrate, thereby forming a multi-layer printed-wiring board.

(Pressing Conditions)
Pressure: 40 kgf/cm$^2$
Temperature: 200° C.

Here, the additional insulating layer 161 of a polyimide resin was interposed by the production method as shown in FIG. 30 and FIG. 31 in the overlapping portions between the first layer of wiring pattern layer 3 and the second layer of wiring pattern layer 4 to be formed in the next step. Likewise, the additional insulating layer 163 of the polyimide resin was interposed in the same manner in the overlapping portion between the second layer of wiring pattern layer 4 and the third layer of wiring pattern layer 5.

Semicofine SP-341 manufactured by Toray (KK) was used as a coating composition containing the polyimide resin for forming the additional insulating layer 161 and the additional insulating layer 163.

(4) Production 4 of Multi-layer Printed-wiring Board (Corresponding to FIG. 33)

The transferring original plates A1, A2, and A3 for the three types of wiring pattern layers prepared in (5) of Experiment 1 in the First Embodiment, were pressed in this order on a polyimide film substrate with the thickness of 50 μm under the following conditions, whereby the three types of wiring pattern layers, each composed of the electrically conductive layer and the insulating resin layer A, were transferred onto the film substrate, thereby forming a multi-layer printed-wiring board.

(Pressing Conditions)
Pressure: 20 kgf/cm$^2$
Temperature: 180° C.

Here, the additional insulating layer 195a was interposed by the production method as shown in FIG. 33 in the overlapping-intended portions between the first layer of wiring pattern layer 3 and the second layer of wiring pattern layer 4 to be formed in the next step. Likewise, the additional insulating layer 199a was interposed in the same manner in the overlapping portion between the second layer of wiring pattern layer 4 and the third layer of wiring pattern layer 5.

The composition used for forming the additional insulating layers 195a, 199a was the same as the electro-depositing solution C for the insulating resin layer as described above.

Each sample of the multi-layer printed-wiring boards was measured in the resistivity, thereby evaluating the electrical insulation. Namely, the resistivity between the upper and lower electrically conductive layers was measured (applying voltage: 100 V, temperature: 22° C., humidity: 50%). They showed values of at least $10^{15}$ Ωcm. In addition, the dielectric breakdown voltage was further measured. Namely, the voltage was applied between the electrically conductive layers with the insulating resin layer inbetween to achieve the measurement, and the electrical insulation was as good as at least 1 kV of the dielectric breakdown voltage.

As described in detail, the present invention provides the multi-layer printed-wiring board having the substrate for multi-layer printed-wiring board and the plurality of wiring pattern layers which were sequentially transferred onto the substrate. Each wiring pattern layer has the electrically conductive layer and the electrically insulating resin layer formed under the conductive layer, and is fixed to the substrate or the lower wiring pattern layer by the same insulating resin layer. Because of such a structure that the additional insulating layer is interposed in each overlapping portion between the wiring pattern layers, the multi-layer printed-wiring board can be provided with reliable insulation in the overlapping portions between the wiring pattern layers and with excellent reliability as being capable of being produced at low cost and having highly precise patterns. Further, devices that can withstand high voltages can be produced, particularly by making the insulating layer of the polyimide resin.

Third Embodiment

The third embodiment of the present invention is described below with reference to the drawings. Here, same portions as those in the first embodiment shown in FIG. 1 to FIG. 25 are denoted by the same reference numerals and detailed description thereof is omitted.

Figure 34:
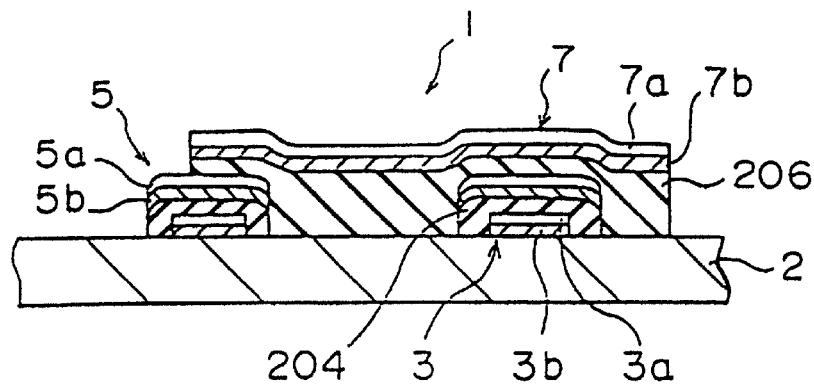
FIG. 34 is a schematic sectional view of the multi-layer printed-wiring board to show the third embodiment of the present invention.

FIG. 34 is a schematic sectional view to show an example of the multi-layer printed-wiring board of the present invention. In FIG. 34, the multi-layer printed-wiring board 1 is provided with a substrate 2 for multi-layer printed-wiring board, a first layer of wiring pattern layer 3 formed on the substrate 2, a second layer of wiring pattern layer 5 laid on the wiring pattern layer 3 through an insulating resin layer 204, and a third layer of wiring pattern layer 7 further laid on the wiring pattern layer 5 through an insulating resin layer 206, and thus is a multi-layer printed-wiring board having the three-layer structure.

Each of wiring pattern layers 3, 5, 7 constituting this multi-layer printed-wiring board 1 has an electrically conductive layer 3a, 5a, 7a and an adhesive layer 3b, 5b, 7b formed under the conductive layer. Further, the multi-layer printed-wiring board 1 is of a superposition printing structure in which the wiring pattern layers 3, 5, 7 are sequentially transferred to be laid on the substrate 2 for multi-layer printed-wiring board or the lower wiring pattern layer through the insulating resin layer, and in portions (intersecting portions) where the wiring pattern layers intersect with each other, electrical insulation between the upper and lower wiring pattern layers is maintained by the insulating resin layers 204, 206. The insulating resin layer 204, 206 is formed by subjecting an insulating photosensitive resin layer to exposure with the wiring pattern layer 5, 7, as a mask as described below, and developing it, and the insulating resin layer 204, 206 exists only under the wiring pattern layer 5, 7. Therefore, the multi-layer printed-wiring board 1 of the present invention is formed in the absence of coating of an insulating layer over the entire wiring pattern, which was observed in the conventional multi-layer printed-wiring boards, and the conductive layer 3a, 5a, 7a of each wiring pattern layer 3, 5, 7 is always partially exposed, whereby mutual connection between wiring pattern layers can be readily made in the intersecting portions of the wiring pattern layers or portions where the wiring pattern layers abut on each other (abutting portions), as described below.

Furthermore, the insulating photosensitive resin for forming the insulating resin layer 204, 206, may be one of those obtained by adding a substance from quinonediazides, nitrobenzyl sulfonates, dihydropyridines, etc. as a substance which promotes dissolution by irradiation with light, to a novolak resin, a polyimide resin, etc. Further, the insulating photosensitive resin may be selected from novolak resins, polyimide resins, etc. having a substituent therein, which promotes dissolution by irradiation with light. The thickness of the insulating resin layer made of one from the insulating photosensitive resins as listed is at least 1 $\mu$m, preferably in the range of 3 to 10 $\mu$m in order to maintain electrical insulation between the upper and lower wiring pattern layers in the intersecting portions and in order to permit a layer to ride across a lower wiring pattern layer without a defect, though it depends on the insulating photosensitive resin used. Furthermore, a conventional thermosetting resin having an unsaturated bond of the thermal polymerization type, for example, of block isocyanate may be added to the above insulating photosensitive resin, and each insulating resin layer may be cured by a heat treatment after each layer in the multi-layer printed-wiring board is transfer-formed. Of course, if a resin having a polymerizable unsaturated bond, (for example, an acrylic group, a vinyl group, an allyl group, etc.) is added to the insulating photosensitive resin, instead of the thermosetting resin, the insulating resin layer can be cured by irradiation of electron beams after each layer in the multi-layer printed-wiring board is transfer-formed.

Figure 35:
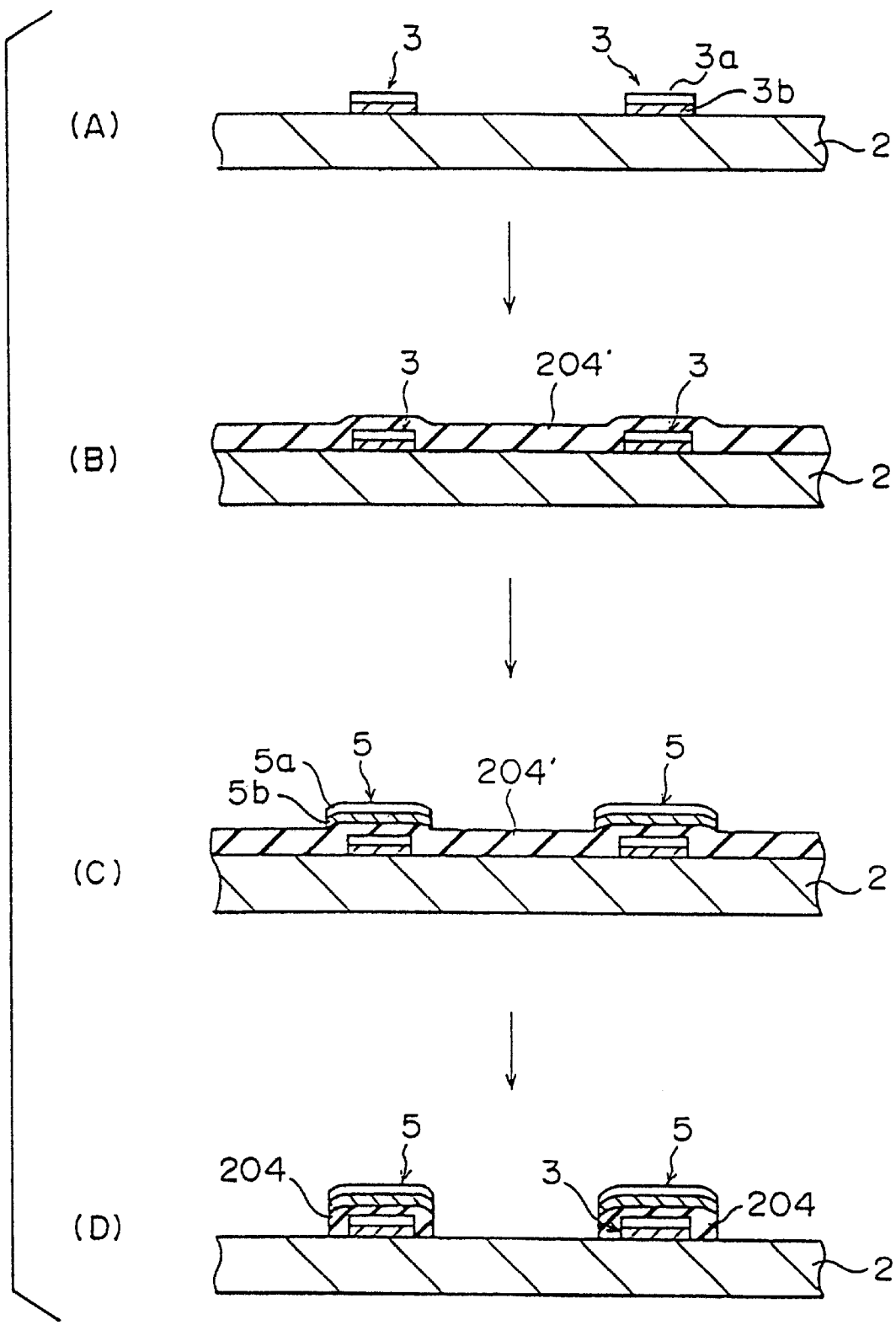
FIG. 35 is a drawing to illustrate a process for producing the multi-layer printed-wiring board of the present invention.
Figure 36:
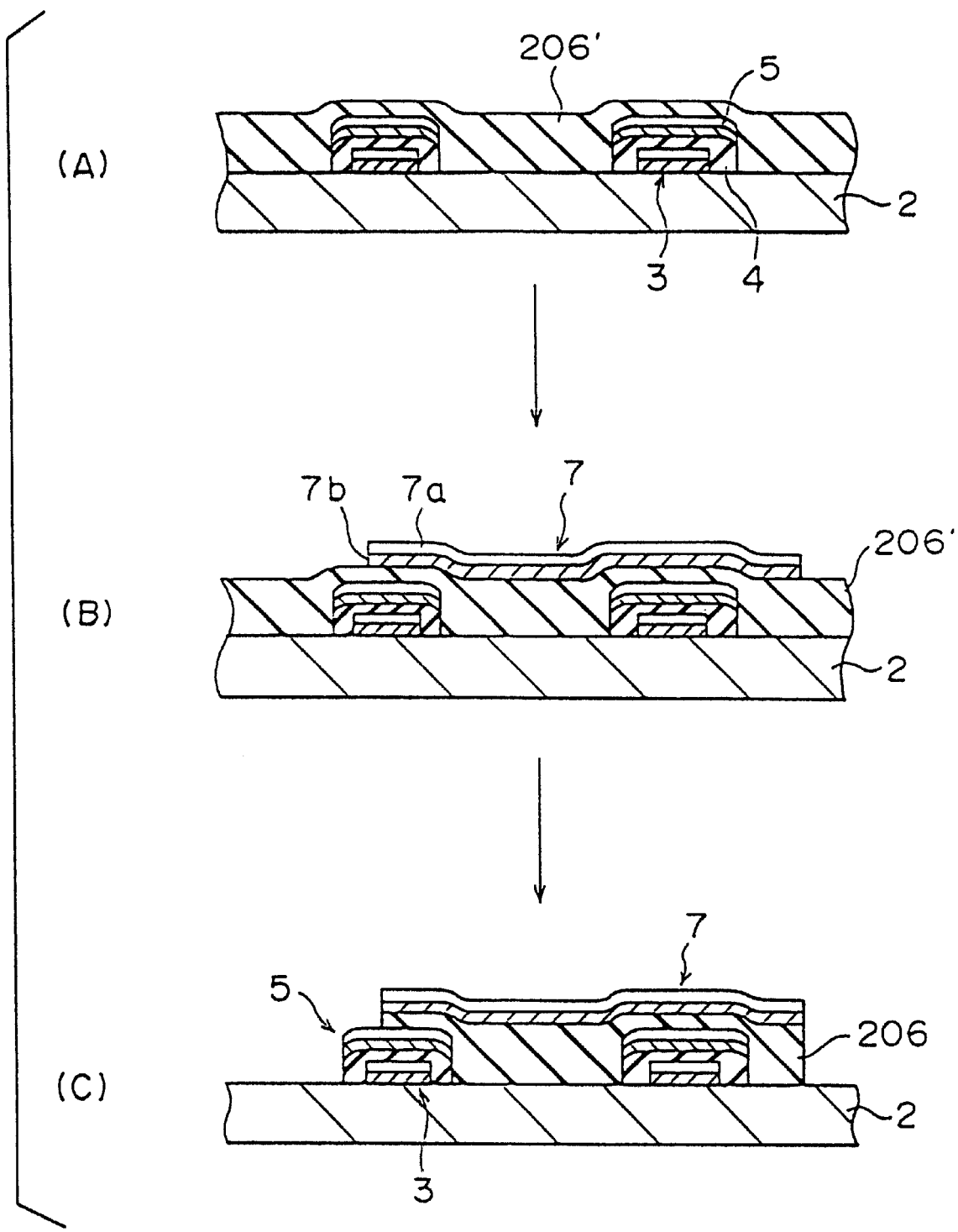
FIG. 36 is a drawing to illustrate a process for producing the multi-layer printed-wiring board of the present invention.

Next, a process for producing the multi-layer printed-wiring board of the present invention is described, referring to FIG. 35 and FIG. 36, with an example of the above multi-layer printed-wiring board.

First, the transferring original plate 10 (see FIG. 2) is pressed onto the substrate 2 for multi-layer printed-wiring board so as to bring the adhesive layer 15 into contact with the substrate 2. This pressing is effected by either of roller pressing, plate pressing, vacuum pressing, etc. Further, if the adhesive layer 15 shows the sticky or adhesive property when heated, thermal pressing may be employed. Then, the conductive layer 11 is released so as to transfer the wiring pattern layer 13 onto the substrate 2, and the adhesive layer 15 is cured, whereby the first layer of wiring pattern layer 3 having the conductive layer 3a and the adhesive layer 3b is formed on the substrate 2 (FIG. 35(A)).

After that, an insulating photosensitive resin layer 204' is formed on the substrate so as to cover the first layer of wiring pattern layer 3 (FIG. 35(B)); and after achieving alignment of the transferring original plate 20 (see FIG. 3) for the second layer of wiring pattern layer with the first layer of wiring pattern layer, another wiring pattern layer is similarly transferred onto the insulating photosensitive resin layer 204', thereby forming the second layer of wiring pattern layer 5 having the conductive layer 5a and the adhesive layer 5b (FIG. 35(C)). Next, the insulating photosensitive resin layer 204' is subjected to exposure with the wiring pattern layer 5 as a mask and to following development, thereby forming an insulating resin layer 204 only under the wiring pattern layer 5. The insulating resin layer 204 and the adhesive layer 5b are then cured (FIG. 35(D)).

Then, an insulating photosensitive resin layer 206' is formed on the substrate 2 so as to cover the second layer of wiring pattern layer 5 (FIG. 36(A)), and after achieving the like alignment using the transferring original plate 30 (see FIG. 4) for the third layer of wiring pattern layer, another wiring pattern layer is transferred onto the insulating photosensitive resin layer 206', thereby forming the third layer of wiring pattern layer 7 having the conductive layer 7a and the adhesive layer 7b (FIG. 36(B)). Next, the insulating photosensitive resin layer 206' is subjected to exposure with the wiring pattern layer 7 as a mask and to following development, thereby forming the insulating resin layer 206 only under the wiring pattern layer 7. The insulating resin layer 206 and the adhesive layer 7b are then cured (FIG. 36(C)).

Figure 37:
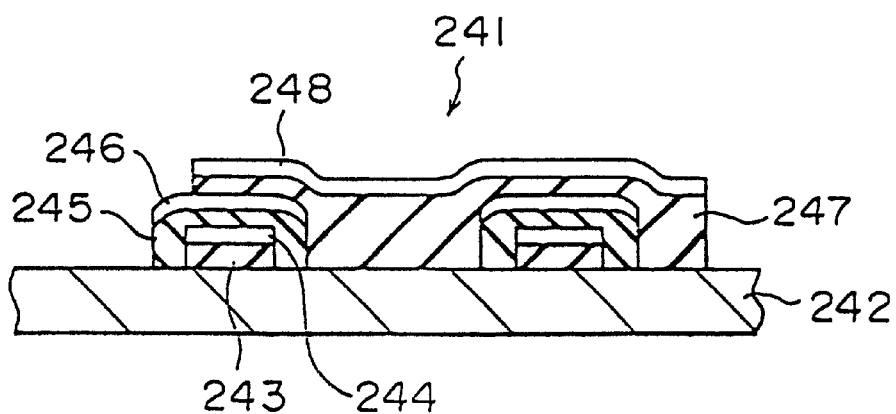
FIG. 37 is a schematic sectional view to show another example) of the multi-layer printed-wiring board of the present invention.

Next described is another example of the multi-layer printed-wiring board according to the present invention. FIG. 37 is a schematic sectional view to show another example of the multi-layer printed-wiring board of the present invention. In FIG. 37, the multi-layer printed-wiring board 241 is a multi-layer printed-wiring board having the three-layer structure, which is provided with a substrate 242 for multi-layer printed-wiring board, a first layer of wiring pattern layer 244 formed on the substrate 242 through an insulating resin layer 243, a second layer of wiring pattern layer 246 laid on the wiring pattern layer 244 through an insulating resin layer 245, and a third layer of wiring pattern layer 248 further laid on the wiring pattern layer 246 through an insulating resin layer 247.

Each wiring pattern layer 244, 246, 248 constituting the multi-layer printed-wiring board 241 is composed of an electrically conductive layer, and the multi-layer printed-wiring board is of a superposition printing structure in which the wiring pattern layers have been sequentially transferred to be laid on the substrate 242 or the lower wiring pattern layer through the insulating resin layer. In portions where the wiring pattern layers intersect with each other (intersecting portions), electrical insulation between the upper and lower, wiring pattern layers is maintained by the insulating resin layers 245, 247. The insulating resin layer 243, 245, 247 is formed by subjecting an adhesive insulating photosensitive resin layer to exposure with the wiring pattern layer 244, 246, 248 as a mask and to following development, as described below, whereby the insulating resin layer 243, 245, 247 exists only under the wiring pattern layer 244, 246, 248. Accordingly, the multi-layer printed-wiring board 241 of the present example is also formed in the absence of coating of an insulating layer over the entire wring pattern, which was observed in the conventional multi-layer printed-wiring boards, and each wiring pattern layer 244, 246, 248 is always partially exposed, whereby mutual connection between wiring pattern layers can be readily made in the intersecting portions of the wiring pattern layers or portions where the wiring pattern layers abut on each other (abutting portions), as described below.

The above substrate 242 constituting the multi-layer printed-wiring board 241 may be the same as the substrate 2 for multi-layer printed-wiring board 1 as described above, and the explanation thereof is omitted herein.

The thickness of each wiring pattern layer 244, 246, 248 is at least 1 $\mu$m, and preferably in the range of 5 to 40 $\mu$m in order to permit a layer to ride across a lower wiring pattern layer without a defect in multi-layer transfer and in order to keep the electric resistance of the wiring pattern layers at a low level, as described below. The linewidth of each wiring pattern layer 244, 246, 248 can be set arbitrarily above the minimum width of about 10 $\mu$m.

Materials suitable for the conductive layers constituting the wiring pattern layers 244, 246, 248 may be the same as those for the above conductive layers 3a, 5a, 7a.

The thickness of the insulating resin layers formed by curing the adhesive insulating photosensitive resin, is at least 1 $\mu$m, and preferably in the range of from 3 to 10 $\mu$m in order to maintain electrical insulation between the upper and lower wiring pattern layers in the intersecting portions and in order to permit a layer to ride across a lower wiring pattern layer without a defect, though it depends on the insulating photosensitive resin used.

Another example of the process for producing the multi-layer printed-wiring board of the present invention is next explained referring to FIG. 37 to FIG. 40, using the above multi-layer printed-wiring board 241 as an example.

First, a transferring original plate for producing the multi-layer printed-wiring board 241 is prepared. A conductive substrate 251 for the transferring substrate is coated with a photoresist to form a photoresist layer, and the photoresist layer is subjected to shadow printing with a predetermined photomask and development, thereby obtaining an insulating layer 252. A conductive layer is then formed on exposed portions of the conductive substrate 251 by the plating method, thereby obtaining a transferring original plate 250 for wiring pattern layer having the first layer of wiring pattern layer 253 (FIG. 38(A)). Likewise, a transferring original plate 260 for the second wiring pattern layer and a transferring original plate 270 for the third wiring pattern layer having respective wiring pattern layers 263 and 273, each composed of a conductive layer, are formed on conductive substrates 261, 271, respectively (FIGS. 38(B), (C)).

Next, an adhesive insulating photosensitive resin layer 243' is formed on a substrate 242 (FIG. 39(A)), and the above transferring original plate 250 for wiring pattern layer is pressed onto the adhesive insulating photosensitive resin layer 243' so as to bring the wiring pattern layer 253 into contact therewith. The pressing is effected by either of roller pressing, plate pressing, vacuum pressing, etc. Further, if the adhesive insulating photosensitive resin layer 243' shows the sticky or adhesive property when heated, thermal pressing may be employed. Then the conductive substrate 251 is released so as to transfer the wiring pattern layer 253 to the substrate 242 (FIG. 39(B)). The adhesive insulating photosensitive resin layer 243' is subjected to exposure with the wiring pattern layer 253 as a mask and development, thereby forming an insulating resin layer 243 only under the wiring pattern layer 253. The insulating resin layer 243 is then cured. By the procedure, the first layer of wiring pattern layer 244 composed of the conductive layer is formed on the substrate 242 through the insulating resin layer 243 (FIG. 39(C)).

After that, an adhesive insulating photosensitive resin layer 245' is formed so as to cover the first layer of wiring pattern layer 244 on the substrate 242 (FIG. 39(D)). After achieving alignment of the transferring original plate 260 for the second layer of wiring pattern layer with the first layer of wiring pattern layer, another wiring pattern layer is similarly transferred onto the adhesive insulating photosensitive resin layer 245', thereby transferring the second layer of wiring pattern layer 263 composed of the conductive layer (FIG. 39(E)). Next, the adhesive insulating photosensitive resin layer 245' is subjected to exposure with the wiring pattern layer 263 as a mask and development, thereby forming an insulating resin layer 245 only under the wiring pattern layer 263. The insulating resin layer 245 is then cured. By the procedure, the second layer of wiring pattern layer 246 composed of the conductive layer is formed on the substrate 242 through the insulating resin layer 245 (FIG. 40(A)).

Next, an adhesive insulating photosensitive resin layer 247' is formed so as to cover the second layer of wiring pattern layer 246 on the substrate 242 (FIG. 40(B)), and after achieving the like alignment of the transferring original plate 270 for the third layer of wiring pattern layer, another wiring pattern layer is transferred onto the adhesive insulating photosensitive resin layer 247' thereby transferring the third layer of wiring pattern layer 273 composed of the conductive layer (FIG. 40(C)). Next, the adhesive insulating photosensitive resin layer 247' is subjected to exposure with the wiring pattern layer 273 as a mask and development, thereby forming an insulating resin layer 247 only under the wiring pattern layer 273. The insulating resin layer 247 is then cured. By the procedure, the third layer of wiring pattern layer 248 composed of the conductive layer is formed on the substrate 242 through the insulating resin layer 247 (FIG. 40(D)).

As described above, since the lamination of the wiring pattern layers 244, 246, 248 is achieved by sequentially transferring the wiring pattern layers 253, 263, 273 of the transferring original plates 250, 260, 270 for wiring pattern layers to the substrate through the adhesive insulating photosensitive resin layers, the multi-layer printed-wiring board 241 is of the so-called superposition printing structure composed of the wiring pattern layers 244, 246, 248.

In each of the processes for producing the multi-layer printed-wiring board of the present invention as described above, the insulating photosensitive resin layer or the adhesive insulating photosensitive resin layer is subjected to exposure and development every after each wiring pattern layer is formed. However, according to the process for producing the multi-layer printed-wiring board of the present invention, the exposure and development may be effected at the final step. For example, as shown in FIG. 41(A), the first layer of wiring pattern layer 3 composed of the conductive layer 3a and the adhesive layer 3b, the insulating photosensitive resin layer 204', the second layer of wiring pattern layer 5 composed of the conductive layer 5a and the adhesive layer 5b, the insulating photosensitive resin layer 206', and the third layer of wiring pattern layer 7 composed of the conductive layer 7a and the adhesive layer 7b are sequentially overlaid onto the substrate 2, and the insulating photosensitive resin layer 204' and insulating photosensitive resin layer 206' are finally subjected to exposure at once with the wiring pattern layers 3, 5, 7 as a mask. This can form a multi-layer printed-wiring board 1', in which the insulating resin layers 204, 206 exist only under the wiring pattern layers 3, 5, 7, as shown in FIG. 41(B).

Figure 42:
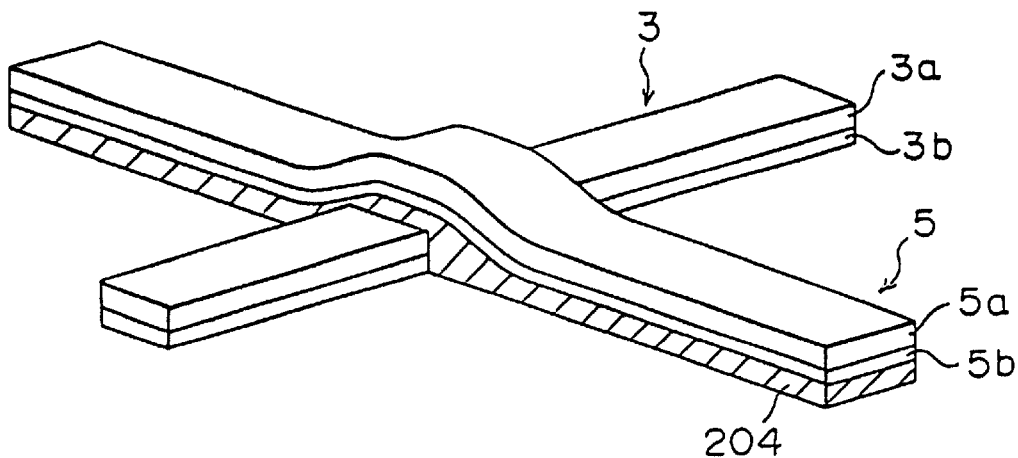
FIG. 42 is a perspective view to show an intersecting portion of wiring pattern layers in an example of the multi-layer printed-wiring board of the present invention.

FIG. 42 is a perspective view to show an intersecting portion between the wiring pattern layers constituting the multi-layer printed-wiring board 1 of the present invention. As shown in FIG. 42, the insulating resin layer 204 (hatched portion) exists between the wiring pattern layer 3 and the wiring pattern layer 5 in the intersecting portion, whereby electrical insulation between the intersecting wiring patterns can be maintained. At the same time, since the insulating resin layer 204 exists only under the wiring pattern layer 5, the conductive layers 3a, 5a in the wiring pattern layers 3, 5 are always exposed in regions except for the intersecting portion.

Figure 43:
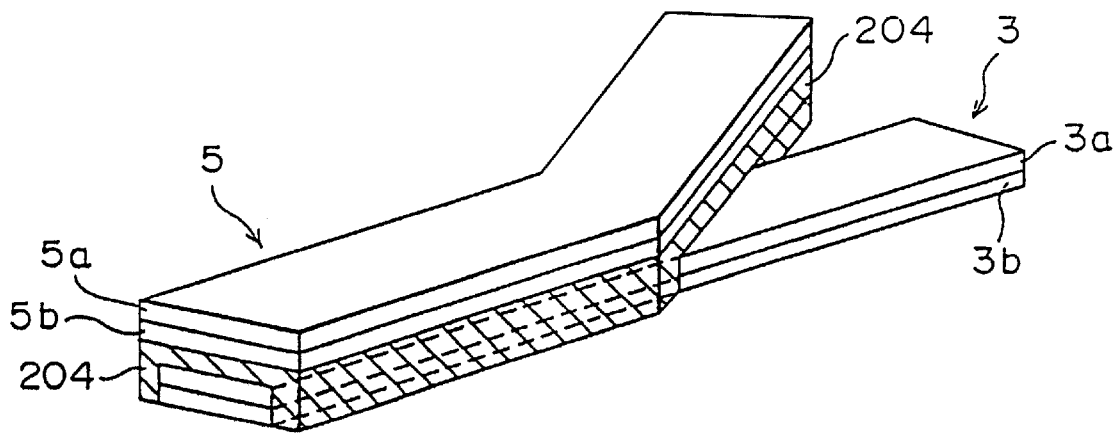
FIG. 43 is a perspective view to show an intersecting portion of wiring pattern layers in another example of the multi-layer printed-wiring board of the present invention.

Further, the multi-layer printed-wiring board of the present invention may include not only wiring in which the upper and lower wiring pattern layers intersect with each other as described above, but also a portion in which the wiring pattern layers overlap in multi-layer structure. FIG. 43 is a perspective view to show a portion in which two wiring pattern layers constituting the multi-layer printed-wiring board 1 of the present invention overlap in multi-layer structure. The wiring distance can be shortened by providing the intersecting portion of the wiring pattern layers 3, 5 as shown in FIG. 42 and the overlapping portion of the wiring pattern layers 3, 5 as shown in FIG. 43, and an inductance of wiring can be reduced by properly designing signal wiring, GND wiring, power supply wiring, etc.

Figure 41:
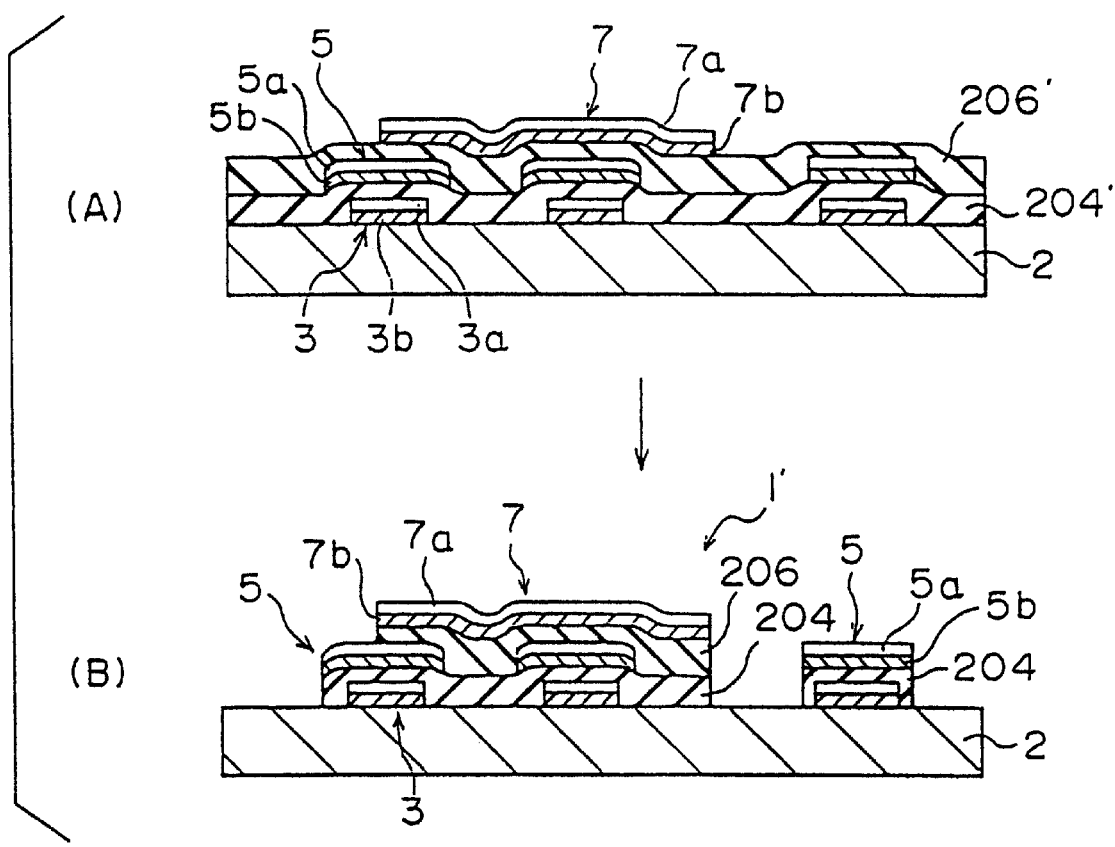
FIG. 41 is a drawing to show another example of the process for producing the multi-layer printed-wiring board of the present invention.

It is of course that the intersecting portion or the overlapping portion in multi-layer structure of the wiring pattern layers as described above may be formed in the multi-layer printed-wiring board 241 as shown in FIG. 37 or in the multi-layer printed-wiring board 1' as shown in FIG. 41.

Figure 44:
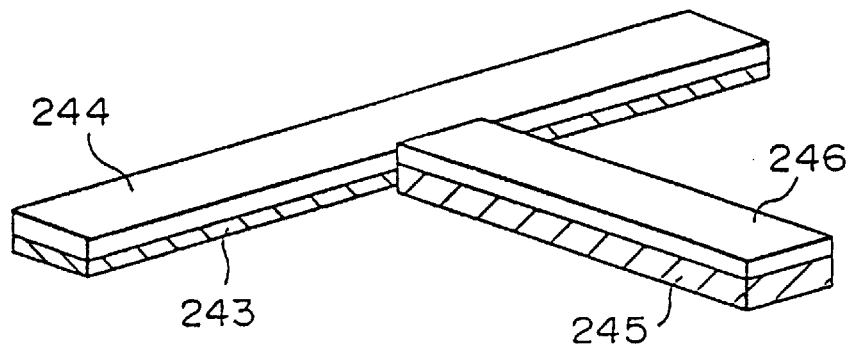
FIG. 44 is a perspective view to show an abutting portion of the wiring pattern layers in the multi-layer printed-wiring board of the present invention.

Further, FIG. 44 is a perspective view to show a portion where the wiring pattern layers constituting the multi-layer printed-wiring board 1 of the present invention abut on each other. As shown in FIG. 44, the wiring pattern layer 244 and the wiring pattern layer 246 abut on each other in the abutting portion and the insulating resin layers 243, 245 (hatched portions) exist only under the wiring pattern layer 244 and the wiring pattern layer 246, respectively, whereby the wiring pattern layers 244, 246 are always exposed.

In the multi-layer printed-wiring board according to the present invention, since the wiring pattern layers are exposed in the intersecting portion or in the abutting portion of the wiring pattern layers, as described above, electrical connection between the wiring pattern layers can be easily made.

Of course, only portions necessitating junction may be mask-exposed without performing exposure over the entire surface at the final stage in the step shown in FIG. 41, thereby perforating the insulating layer and making connection there.

The present invention is next described in further detail, as presenting specific, experimental examples.

EXPERIMENT 1

(1) Preparation of Insulating Photosensitive Resin Solution for Insulating Resin Layer 4.00 g of 4,4'-diamino phenyl ether (hereinafter, simply referred to "DDE") and 6.38 g of dimethyl pyromellitate dichloride were dissolved in 95 g of N-methylpyrrolidone (hereinafter, simply referred to "NMP"), and 8.6 g of sodium carbonate was added thereto. They were reacted at room temperature for 6 hours.

After completion of the reaction, the solution was poured into a liter of water and a precipitate was separated by filtration and dried, thereby obtaining 8.06 g of resin powder. Then 3 g of the resin powder thus obtained was dissolved again in 17 g of NMP, thus preparing a polyamic acid ester having a solid content of 15% by weight.

On the other hand, 4.00 g of DDE and 4.23 g of pyromellitic acid dianhydride were dissolved in 47 g of NMP, and they were reacted at room temperature for 6 hours, thereby obtaining a polyamic acid solution. Then 2 g of the polyamic acid solution and 18 g of the above polyamic acid ester solution were mixed, thereby obtaining a solution mixture of the polyamic acid ester having the solid content of 15% by weight and the polyamic acid.

Then 0.90 g of a compound of 2,3,4,4'-tetrahydroxy benzophenone substituted by 3 moles of 1,2-naphthoquinone-2-diazido-5-sulfonic acid was added to the solution mixture and stirred at room temperature for 3 hours, followed by filtration with 1.0 μm filter, thereby obtaining a desired solution.

(2) Preparation of Electro-depositing Solution for Adhesive Layer 13.2 parts by weight of butyl acrylate, 1.6 parts by weight of methyl methacrylate, 0.2 part by weight of divinylbenzene, and 85 parts by weight of 1% aqueous solution of potassium persulfate were mixed and polymerized at 80° C. for 5 hours to undergo emulsion polymerization without emulsifier, thereby preparing a polybutyl acrylate/polymethyl methacrylate copolymer emulsion solution.

Then, 65 parts by weight of the emulsion solution thus prepared, 2 parts by weight of an acrylic copolymer resin having a carboxylic group as an electro-depositing carrier, 0.85 part by weight of hexamethoxy melamine, 0.35 part by weight of trimethylamine as a neutralizing agent, 3 parts by weight of ethanol, 3 parts by weight of butyl cellosolve, and 18.8 parts by weight of water were stirred to mix, thereby preparing an anionic electro-depositing solution for adhesive layer.

(3) Formation of Electrically Conductive Layer in Transferring Original Plate

Stainless steel plates having the thickness of 0.2 mm, the surfaces of which were polished, were prepared as electrically conductive substrates, and a commercially available photoresist for plating (PMERP-AR900 manufactured by Tokyo Oka Kogyo (KK)) was laid on the stainless steel plates in the thickness of 10 μm and dried. The plates each were subjected to shadow printing with three types of respective photomasks with wiring patterns formed therein, followed by development, washing with water, drying, and thermal curing, thereby preparing transferring original plates (three types) each having an insulating layer.

The transferring original plate prepared above was set as opposed to a platinum electrode and immersed in a copper pyrophosphate plating bath having the below composition (pH=8, the solution temperature=55° C.). An electric current was let to flow for 5 minutes in the current density of 10 A/dm$^2$ while connecting the platinum electrode to the anode of a DC power supply and the transferring substrate prepared above to the cathode thereof, to form a copper plating film as an electrically conductive layer in the thickness of 10 μm on exposed portions of the electrically conductive substrate, not covered with the photoresist. This formation of the electrically conductive layer was carried out for each of the three types of transferring original plates.

| (Composition of copper pyrophosphate plating bath) | |
|---|---|
| Copper pyrophosphate | 94 g/l |
| Potassium copper pyrophosphate | 340 g/l |
| Aqueous ammonia | 3 cc/l |

(4) Formation of Adhesive Layer in Transferring Original Plate

Each of the three types of transferring original plates, in which the electrically conductive layer was formed in above (3), and the platinum electrode were set as opposed to each other and immersed in the anionic electro-depositing solution A for the adhesive layer prepared in above (2). Each transferring original plate was connected to the anode of the DC power supply and the platinum electrode to the cathode thereof, and electro-deposition was carried out at the voltage of 50 V for a minute, followed by drying and heat treatment at 150° C. for 30 minutes to form an adhesive layer in the thickness of 20 µm on the electrically conductive layer, thus obtaining transferring original plates A1, A2, and A3 for the three types of wiring pattern layers.

(5) Formation of Multi-layer Printed-wiring Board (Corresponding to FIG. 35 and FIG. 36)

The transferring original plate A1 for wiring pattern layer prepared in above (4) was pressed onto a polyimide film substrate having the thickness of 25 µm under the following conditions, whereby the first layer of wiring pattern layer, composed of the electrically conductive layer and the adhesive layer, was transferred thereto and then the adhesive layer was cured under the conditions of 180° C. and 30 minutes, thereby completing formation of the first layer of wiring pattern layer.

(Pressing Conditions)

Pressure: 10 kgf/cm$^2$

Temperature: 80° C.

Then, onto the substrate, on which the first layer of wiring pattern layer was formed, the insulating photosensitive resin solution prepared in above (1) was applied by the spin coating method (80° C., 60 minutes) and then dried, thereby forming an insulating photosensitive resin layer in the thickness of 12 µm. Thereafter, onto the insulating photosensitive resin layer, the transferring original plate A2 prepared in above (4) was pressed under the following conditions, thereby transferring the second layer of wiring pattern layer composed of the conductive layer and adhesive layer.

(Pressing Conditions)

Pressure: 10 kgf/cm$^2$

Temperature: 80° C.

Then the insulating photosensitive resin layer was subjected to exposure under the following conditions with the second layer of wiring pattern layer transferred as a mask, and development by dipping, and thereafter the insulating photosensitive resin layer and the adhesive layer were cured under the conditions of 250° C. and 30 minutes, thereby completing formation of the second layer of wiring pattern layer.

(Exposure Conditions)

Shadow printing apparatus: P-202-G manufactured by Dainippon Screen Seizo (KK)

Vacuum drawing: 60 seconds

Exposure time: 600 counts

Likewise, onto the film substrate, on which the second layer of wiring pattern layer was formed, the insulating photosensitive resin solution prepared in above (1) was applied by the spin coating method and dried (80° C., 60 minutes), thereby forming an insulating photosensitive resin layer in the thickness of 12 µm. Then, the transferring original plate A3 for wiring pattern layer prepared in above (4) was pressed onto the insulating photosensitive resin layer under the same pressing conditions as the above transferring original plate A2, thereby transferring the third layer of wiring pattern layer composed of the electrically conductive layer and adhesive layer.

Next, the insulating photosensitive resin layer was subjected to exposure under the above conditions and development by dipping, and then the insulating photosensitive resin layer and adhesive layer were cured under the conditions of 250° C. and 30 minutes, thus completing formation of the third layer of wiring pattern layer.

The multi-layer printed-wiring board of the present invention having the three layers of wiring pattern layers was prepared by the above prooess.

EXPERIMENT 2

(1) Preparation of Adhesive Insulating Photosensitive Resin Solution for Insulating Resin Layer 75 parts by weight of methyl methacrylate, 10 parts by weight of aronix M113 (manufactured by Toa Gosei Kagaku (KK)), and 0.5 part by weight of azobisisobutyronitrile were stirred under heating at 70° C. in the reaction solution, and 50 parts by weight of ethyl acetate was dropped over about 2 hours. Then the mixture was maintained for 2 hours. Next, a solution having 2 parts by weight of azobisisobutyronitrile dissolved in 25 parts by weight of ethyl acetate was dropped into this solution over about 3 hours, and the resulting solution was kept in reaction further for 3 hours. Thereafter, the solution was heated at 140° C. to remove the solvent, thereby obtaining an acrylic copolymer.

The acrylic copolymer thus obtained and the insulating photosensitive resin solution prepared in Experiment 1 were mixed under stirring, thereby obtaining an adhesive insulating photosensitive resin solution.

Figure 38:
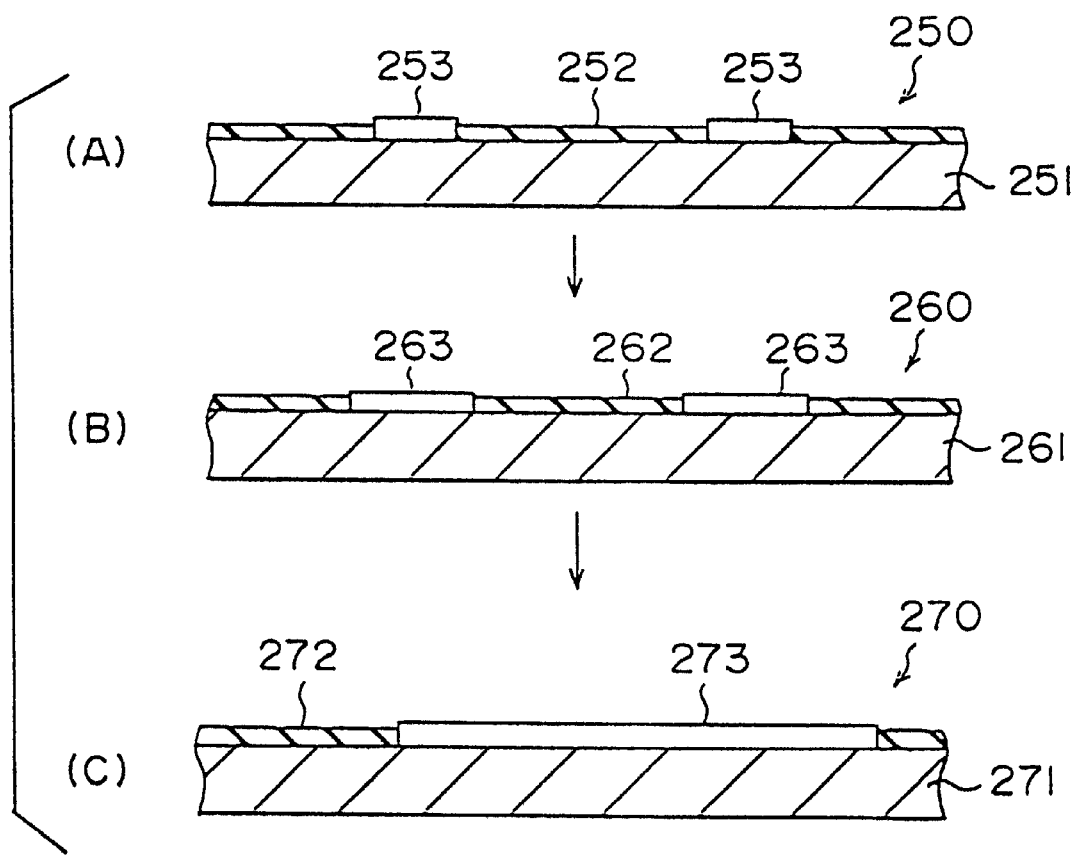
FIG. 38 is a drawing to illustrate an example of the transferring original plate, which is used in another example of the process for producing the multi-layer printed-wiring board of the present invention.

(2) Formation of Electrically Conductive Layer in Transferring Original Plate (Corresponding to FIG. 38)

Stainless steel plates having the thickness of 0.2 mm, the surfaces of which were polished, were prepared as electrically conductive substrates, and a commercially available photoresist for plating (PMERP-AR900 manufactured by Tokyo Oka Kogyo (KK)) was laid on the stainless steel plates in the thickness of 10 µm and dried. The plates each were subjected to shadow printing with three types of respective photomasks with wiring patterns formed therein, followed by development, washing with water, drying, and thermal curing, thereby preparing transferring original plates (three types) each having an insulating layer.

The transferring original plate prepared above was set as opposed to the platinum electrode and immersed in a copper pyrophosphate plating bath having the same composition as used in Experiment 1 (pH=8, the solution temperature=55° C.). An electric current was let to flow for 5 minutes in the current density of 10 A/dm$^2$ while connecting the platinum electrode to the anode of a DC power supply and the transferring substrate prepared above to the cathode thereof, to form a copper plating film as an electrically conductive layer in the thickness of 10 µm on exposed portions of the electrically conductive substrate, not covered with the photoresist. This formation of the electrically conductive layer was carried out for each of the three types of transferring original plates, thus obtaining the transferring original plates B1, B2, B3 for three types of wiring pattern layers.

Figure 39:
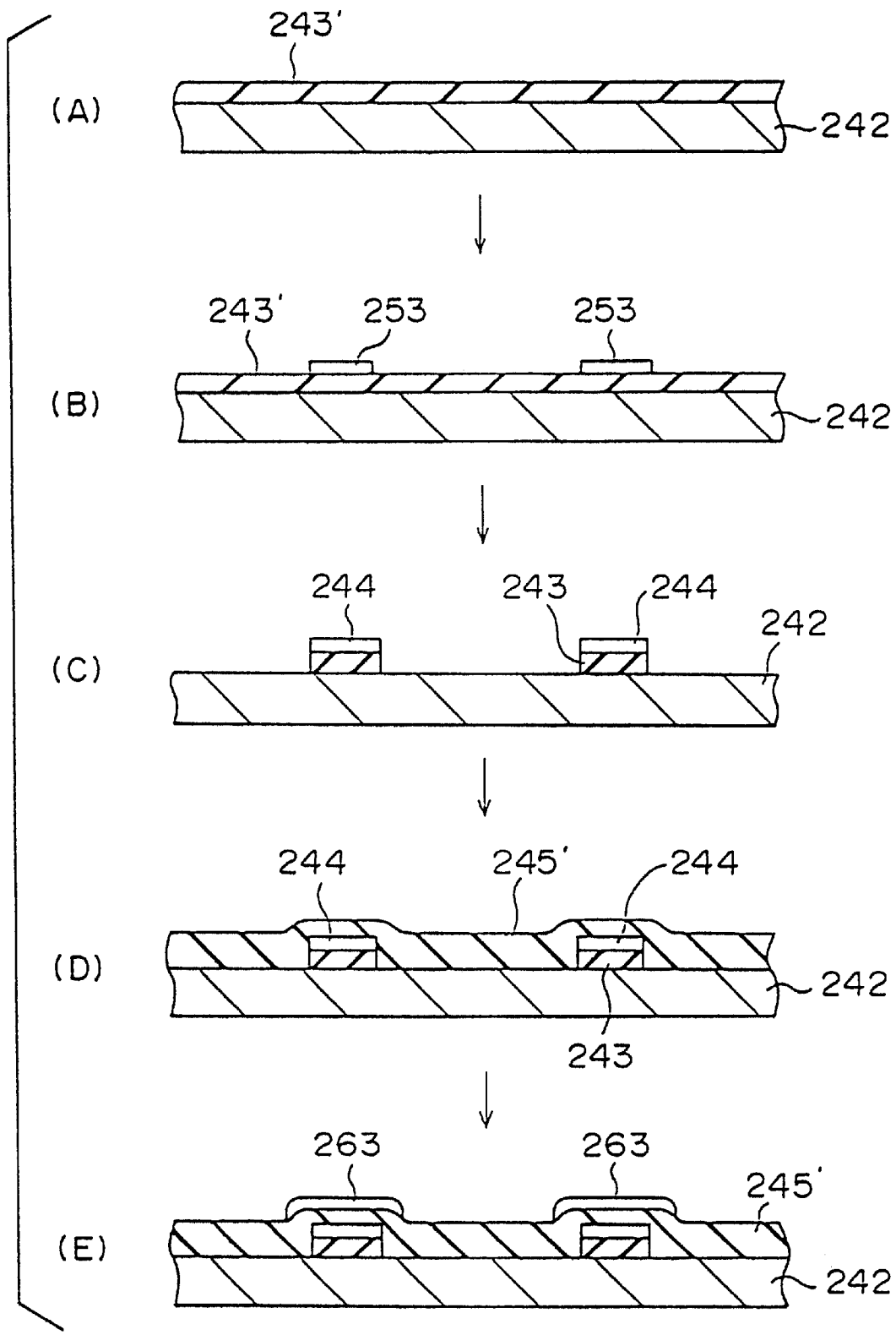
FIG. 39 is a drawing to show another example of the process for producing the multi-layer printed-wiring board of the present invention.
Figure 40:
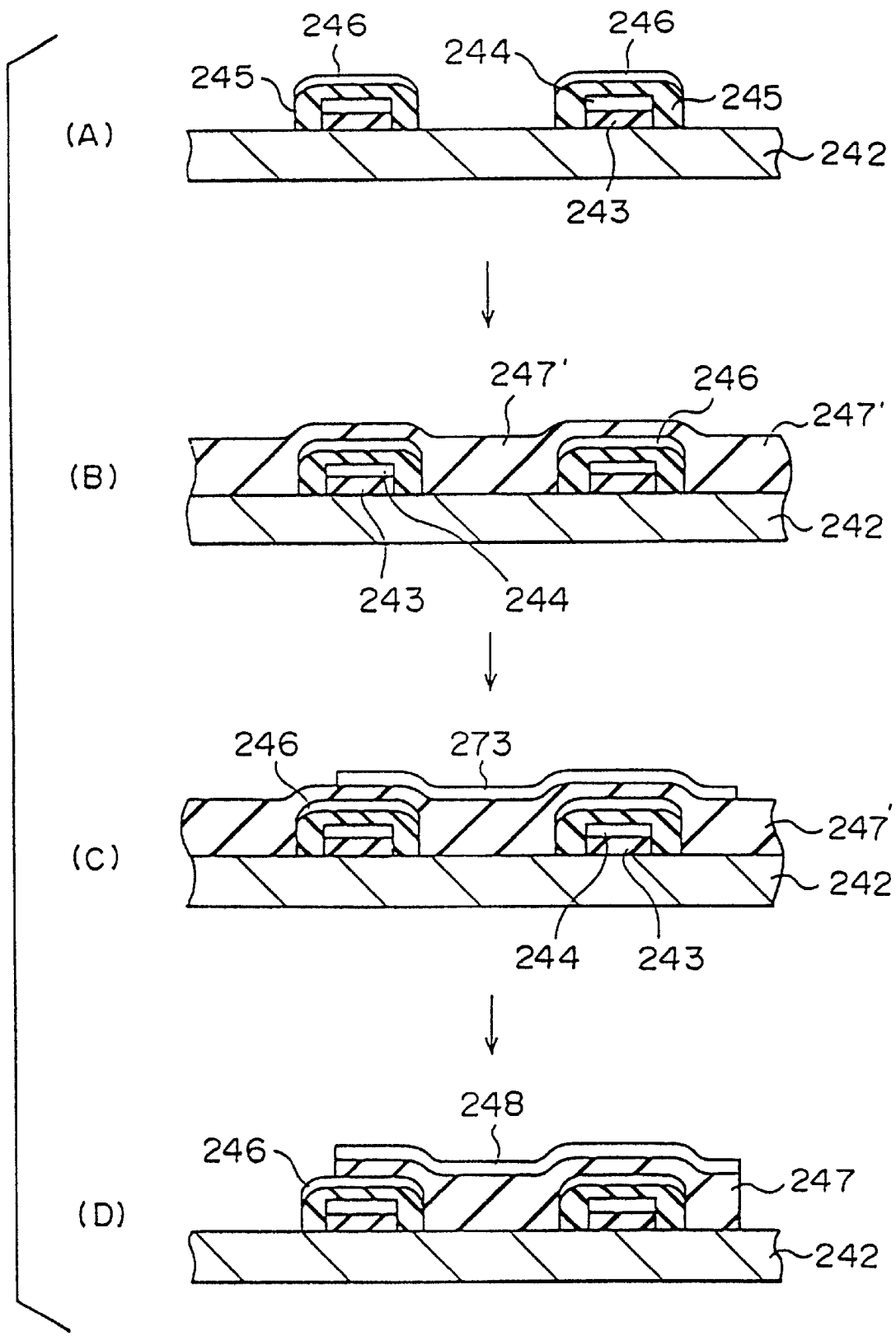
FIG. 40 is a drawing to show another example of the process for producing the multi-layer printed-wiring board of the present invention.

(3) Formation of Multi-layer Printed-wiring Board (Corresponding to FIG. 39 and FIG. 40)

Onto a polyimide film substrate having the thickness of 25 µm, the adhesive insulating photosensitive resin solution prepared in above (1) was applied by the spin coating method and dried (80° C., 30 minutes), thereby forming an adhesive insulating photosensitive resin layer in the thickness of 10 µm. Then the transferring original plate B for wiring pattern layer prepared in above (2) was pressed onto the insulating photosensitive resin layer under the following conditions, thereby transferring the first layer of wiring pattern layer composed of the electrically conductive layer.

(Pressing Conditions)

Pressure: 10 kgf/cm$^2$

Temperature: 80° C.

Next, the adhesive insulating photosensitive resin layer was subjected to exposure under the following conditions with the first layer of wiring pattern layer transferred as a mask, and development by dipping. Then the adhesive insulating photosensitive resin layer was cured under the conditions of 150° C. and 30 minutes, thereby completing formation of the first layer of wiring pattern layer.

(Exposure Conditions)

Shadow printing apparatus: P-202-G manufactured by Dainippon Screen Seizo (KK)

Exposure time: 30 counts

Next, onto the film substrate, on which the first layer of wiring pattern layer was formed, the adhesive insulating photosensitive resin solution prepared in above (1) was applied by the spin coating method and dried (80° C., 30 minutes), thereby forming an adhesive insulating photosensitive resin layer in the thickness of 10 μm. Then, onto the adhesive insulating photosensitive resin layer, the transferring original plate B2 for wiring pattern layer prepared in above (2) was pressed under the same conditions as for the first layer, thereby transferring thereto the second layer of wiring pattern layer composed of the electrically conductive layer.

Next, the adhesive insulating photosensitive resin layer was subjected to exposure under the same conditions as for the first layer with the second layer of wiring pattern layer transferred as a mask, and development by dipping. Then, the adhesive insulating photosensitive resin layer was cured under the conditions of 150° C. and 30 minutes, thereby completing formation of the second layer of wiring pattern layer.

Likewise, onto the film substrate, on which the second layer of wiring pattern layer was formed, the adhesive insulating photosensitive resin solution prepared in above (1) was applied by the spin coating method and dried (80° C., 30 minutes), thereby forming an adhesive insulating photosensitive resin layer in the thickness of 10 μm. Thereafter, onto the adhesive insulating photosensitive resin layer, the transferring original plate B3 for wiring pattern layer prepared in above (2) was pressed under the same conditions as for the first layer, thereby transferring thereto the third layer of wiring pattern layer composed of the electrically conductive layer.

Next, the adhesive insulating photosensitive resin layer was subjected to exposure under the same conditions as for the first layer with the third layer of wiring pattern layer transferred as a mask, and development by dipping. Then, the adhesive insulating photosensitive resin layer was cured under the conditions of 150° C. and 30 minutes, thereby completing formation of the third layer of wiring pattern layer.

By this, the multi-layer printed-wiring board of the present invention having the three layers of wiring pattern layers was prepared.

EXPERIMENT 3

First, transferring original plates C1, C2, C3 for three types of wiring pattern layers were prepared in the same manner as in (3) and (4) of Experiment 1.

Then, onto a polyimide film substrate with the thickness of 25 μm, the transferring original plate C1 for wiring pattern layer was pressed under the following conditions, thereby transferring the first layer of wiring pattern layer composed of the electrically conductive layer and adhesive layer.

(Pressing Conditions)

Pressure: 10 kgf/cm$^2$

Temperature: 80° C.

Next, onto the film substrate, on which the first layer of wiring pattern layer was formed, the insulating photosensitive resin solution prepared in Experiment 1 was applied by the spin coating method and dried (80° C., 30 minutes), thereby forming an insulating photosensitive resin layer in the thickness of 12 μm. Then, the transferring original plate C2 for wiring pattern layer was pressed onto the insulating photosensitive resin layer under the following conditions, thereby transferring the second layer of wiring pattern layer composed of the electrically conductive layer and adhesive layer.

(Pressing Conditions)

Pressure: 10 kgf/c$^2$

Temperature: 80° C.

Further, onto the film substrate, on which the second layer of wiring pattern layer was transferred, the insulating photosensitive resin solution prepared in Experiment 1 was applied by the spin coating method and dried (80° C., 30 minutes), thereby forming an insulating photosensitive resin layer in the thickness of 12 μm. Then the above transferring original plate C3 for wiring pattern layer was pressed onto the insulating photosensitive resin layer in the same manner as for the transferring original plate C2, thereby transferring the third layer of wiring pattern layer composed of the electrically conductive layer and adhesive layer.

After that, the insulating resin layers were subjected to exposure under the following conditions with the wiring pattern layers of the first layer to the third layer transferred as a mask, and development by dipping. Subsequently, the insulating photosensitive resin layers and adhesive layers were cured by the conditions of 250° C. and 30 minutes.

(Exposure Conditions)

Shadow printing apparatus: P-202-G manufactured by Dainippon Screen Seizo (KK)

Exposure time: at least 700 counts

By the above, the multi-layer printed-wiring board of the present invention having these three layers of wiring pattern layers was prepared.

As detailed above, the present invention enables the wiring pattern layers to be laid in multi-layer structure on the substrate, by transferring the wiring pattern layers each composed of the conductive layer or of the conductive layer and adhesive layer, provided on the transferring original plates, onto the substrate. Since this multi-layer lamination is such a parallel-series process that a plurality of transferring original plates each having their predetermined wiring pattern layers are formed in parallel and that the wiring pattern layers are transferred in series with these transferring original plates, a defective product can be eliminated by check before transferring, thereby not only increasing the manufacturing yield, but also attaining a high throughput.

Further, an insulating resin layer exists between the wiring pattern layers which intersect or overlap in multiple layers, thereby maintaining electrical insulation between the wiring pattern layers. Since such an insulating resin layer is formed by exposure of the insulating photosensitive resin layer or adhesive insulating photosensitive resin layer with the wiring pattern layer as a mask and development, obviated is a need to perform formation of wiring layers, plating for patterning, and a lot of alignment steps, which were conventionally carried out on the substrate, thereby enabling to simplify the manufacturing steps. Furthermore, the wiring patterns are not coated with an insulating layer, which was observed in the conventional multi-layer printed-wiring boards, in the multi-layer printed-wiring board, and the electrically conductive layers constituting the respective wiring pattern layers are always partially exposed. Thus, mutual connection of wiring pattern layers can be made easily in an intersecting portion of the wiring pattern layers or a portion where the wiring pattern layers are close to each other, thereby enabling to provide multi-layer printed-wiring boards with extremely high general versatility. Furthermore, the inductance of wiring can be reduced by properly designing wiring, for example, signal wiring, GND wiring, and power supply wiring, so as to intersect or overlap in multi-layer structure, as described above, thereby enabling to provide multi-layer printed-wiring boards excellent in electrical properties.

Fifth Embodiment

The fifth embodiment of the present invention is described below referring to the drawings. Here, same portions as those in the first embodiment shown in FIG. 1 to FIG. 25 are denoted by the same reference numerals, and detailed description thereof is omitted.

Figure 45:
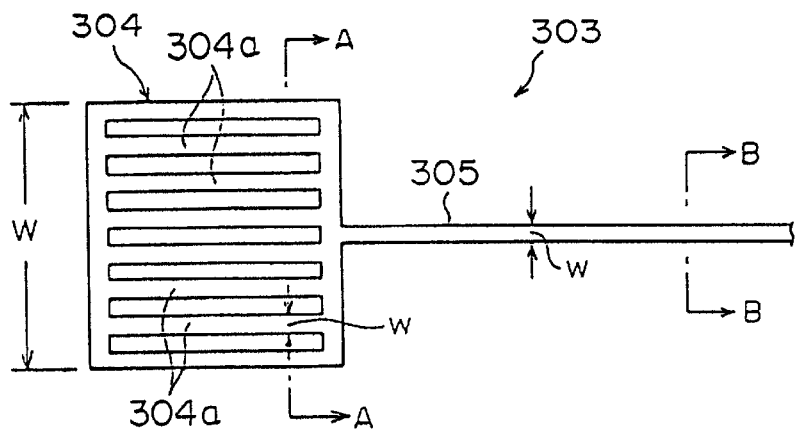
FIG. 45 is a partial plan view of a printed-wiring board to show the fifth embodiment of the present invention.
Figure 46:
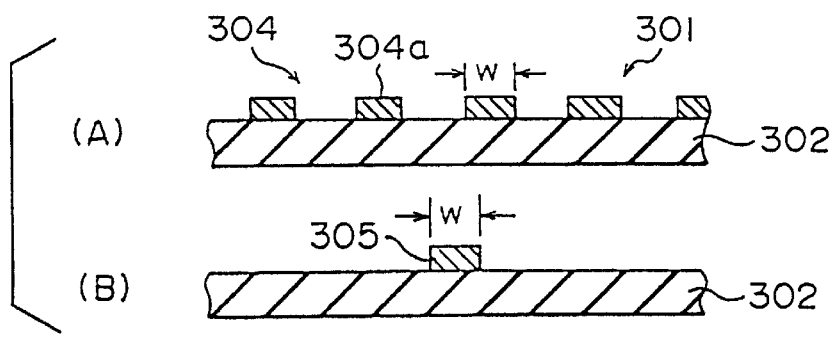
FIG. 46 is partially enlarged vertical sections, taken along A—A line and B—B line, of the printed-wiring board as shown in FIG. 45.

FIG. 45 is a partial plan view to show an example of a printed-wiring board of the present invention, FIG. 46(A) is a partially enlarged vertical section, taken along A—A line in FIG. 45, and FIG. 46(B) is a partially enlarged vertical section, taken along B—B line in FIG. 45. In FIG. 45 and FIG. 46, the printed-wiring board 301 is provided with a wiring pattern layer 303 formed in a predetermined pattern on a substrate 302 for printed-wiring board, and this wiring pattern layer 303 is composed of a pad portion 304 having a large linewidth section (linewidth=W) and a wiring portion 305 having a small linewidth section (linewidth=w).

Figures 47, 48:
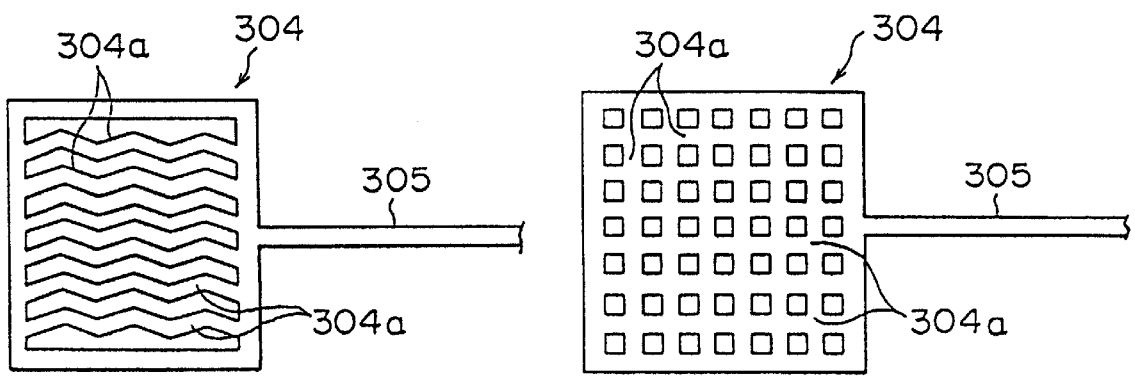
FIG. 47 is a drawing to show an embodiment of large-linewidth wiring on the printed-wiring board of the present invention.
FIG. 48 is a drawing to show another embodiment of large-linewidth wiring in the printed-wiring board of the present invention.
Figure 49:
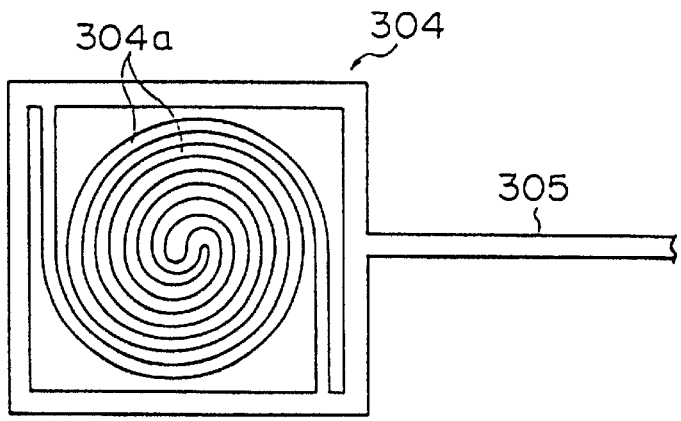
FIG. 49 is a drawing to show another embodiment of large-linewidth wiring in the printed-wiring board of the present invention.
Figure 50:
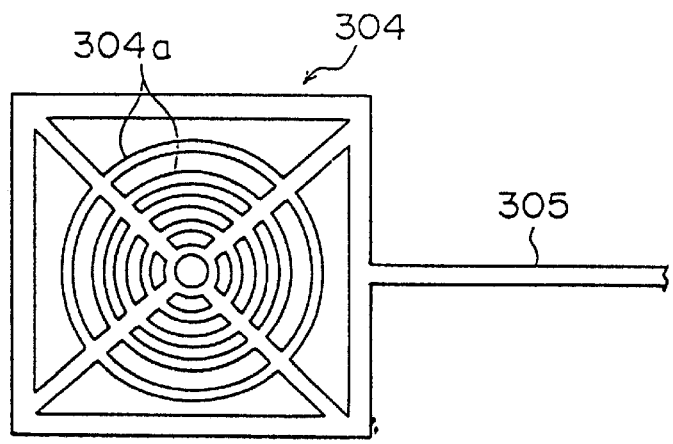
FIG. 50 is a drawing to show another embodiment of large-linewidth wiring in the printed-wiring board of the present invention.

The printed-wiring board 301 of the present invention is characterized in that the pad portion 304 having the large linewidth as described above is a set of lines each having substantially the same linewidth as the linewidth w of the wiring portion 305 having the small linewidth. In the example as illustrated, the pad portion 304 is a set of stripe lines 304a each having the linewidth w, but other embodiments of the pad portion 304 having the large linewidth may include, for example, a set of wave lines each having the linewidth w as shown in FIG. 47, a set of lines in matrix each having the linewidth w as shown in FIG. 48, a scroll line having the linewidth w as shown in FIG. 49, and lines of the linewidth w concentrically formed as shown in FIG. 50.

In the above examples, the linewidth of each of the lines constituting the pad portion 304 is the same as the linewidth w of the wiring portion 305. However, the linewidth is not necessarily limited to this, and the linewidth of each of the lines constituting the pad portion 304 can be set in the range of 50 to 200% of the linewidth w of the wiring portion 305. Further, there occurs no problem as long as line spaces between the lines constituting the pad portion 304 are provided in the range of about 5 to 50 $\mu$m.

The pad portion 304 with the large linewidth is arranged as a set of lines each having substantially the same linewidth as the linewidth w of the wiring portion 305 with the small linewidth as described above, whereby the printed-wiring board 301 of the present invention is composed of lines having substantially the same linewidth in the entire region of the wiring pattern layer 303 and whereby the film thickness of the wiring pattern layer 303 becomes uniform. Further, for example, if wire bonding or soldering is effected in the above pad portion 304, the lines each having the small linewidth and constituting the pad portion 304 are mutually connected with solder or the like, so that wire bonding can be effected without any trouble, as being the case with the pad portion of conventional printed-wiring boards.

In the above example, the wiring pattern layer 303 is composed of two types of wiring parts, the pad portion 304 with the linewidth W and the wiring portion 305 with the linewidth w. In the cases where there are three types of linewidths of wiring parts constituting the wiring pattern layer 303, the wiring part with the large linewidth may be made of a set of lines each having the same linewidth as a wiring line with the smallest linewidth.

The substrate 302 constituting the printed-wiring board 301 of the present invention having the above wiring pattern layer 303, may be one well known as a substrate for printed-wiring board, such as a glass epoxy substrate, a polyimide substrate, an alumina ceramic substrate, or a composite substrate of glass epoxy and polyimide. The thickness of the substrate 302 is preferably in the range of from 5 to 1000 $\mu$m.

On a material for the wiring constituting the wiring pattern layer 303, there is no particular restriction as long as a thin film thereof can be formed by electro-deposition as described below; examples of the material that can be used are copper, silver, gold, nickel, chromium, zinc, tin, platinum, etc. The film thickness is at least 1 $\mu$m and preferably in the range of from 5 to 40 82 m in order to suppress the electric resistance of the wiring pattern layer 303 to a low level. Further, the linewidth of the wiring constituting the wiring pattern layer 303 can be arbitrarily set above the minimum width of about 10 $\mu$m.

Figure 51:
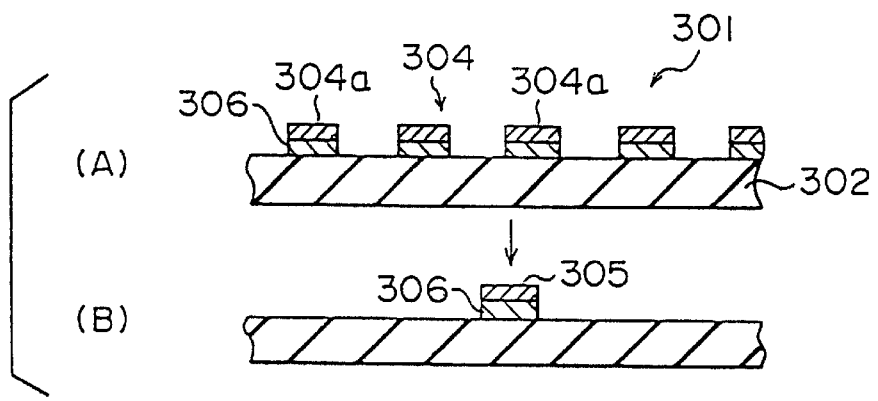
FIG. 51 is a drawing, corresponding to FIG. 46, which shows another example of the printed-wiring board of the present invention.

Further, in the printed-wiring board of the present invention, the wiring pattern layer 303 may be formed on the substrate through an adhesive layer. FIG. 51 is a longitudinal cross section, corresponding to FIG. 46, to show the constitution of such a printed-wiring board. As shown in FIG. 51, the lines 304a constituting the pad portion 304 and the wiring portion 305 are fixed on the substrate 302 through an adhesive layer 306. The thickness of the adhesive layer 306 is at least 1 $\mu$m and preferably in the range of 5 to 30 $\mu$m in order to maintain electrical insulation between upper and lower lines in an intersecting portion in multi-layer wiring as described below, though it depends on electrical insulation properties of an adhesive material used.

A material for the above adhesive layer 306 may be any electro-depositing adhesive substance to show an adhesive property at ordinary temperature or when heated. For example, an anionic or cationic synthetic polymer resin with the adhesive property may be listed as a polymer used.

Specifically, the anionic synthetic polymer resin includes an acrylic resin, a polyester resin, a maleic oil resin, a polybutadiene resin, an epoxy resin, a polyamide resin, a polyimide resin, etc., used alone or in arbitrary combination thereof as a mixture. Further, the above anionic synthetic polymer resin may be used in combination with a cross-linking resin such as a melamine resin, a phenol resin, a urethane resin, etc.

On the other hand, the cationic synthetic polymer resin includes an acrylic resin, an epoxy resin, a urethane resin, a polybutadiene resin, a polyamide resin, a polyimide resin, etc., used alone or in arbitrary combination thereof as a mixture. Further, the above cationic synthetic polymer resin may be used in combination with a cross-linking resin such as a polyester resin, a urethane resin, etc.

Furthermore, in order to impart the adhesive property to the above polymer resin, an adhesion-imparting resin, for example, of a rosin type, a terpene type, or a petroleum resin type may be added thereto as occasion demands.

The above polymer resin is used for the electro-deposition method in a solubilized-to-water state after neutralized with an alkaline or acidic substance or in a water-dispersed state in the production method of the present invention described below. Namely, the anionic synthetic polymer resin is neutralized with one from amines such as trimethylamine, diethylamine, dimethylethanolamine, diisopropanolamine, etc., or inorganic alkaline substances such as ammonia, caustic potash, etc. On the other hand, the cationic synthetic polymer resin is neutralized with one from acids such as acetic acid, formic acid, propionic acid, lactic acid, etc. Then, the polymer resin neutralized to be solubilized to water is used in a water-diluted state in either a water-dispersed type or a water-dissolving type.

In order to enhance the reliability, such as electrical insulation, heat resistance, etc., of the adhesive material, a conventional thermosetting resin having an unsaturated bond of the thermal polymerization type, for example, of block isocyanate may be added to the above polymer resin, and all the adhesive layers may be cured by a thermal treatment after all the layers in the printed-wiring board are formed by transfer. Of course, if a resin having a polymerizable unsaturated bond (for example, an acrylic group, a vinyl group, an allyl group, etc.) is added to the adhesive material, instead of the thermosetting resin, all the adhesive layers can be cured by irradiation of electron rays after all the layers in the printed-wiring board are formed by transfer.

In addition to the above materials, the material for the adhesive layer 306 may be, of course, a thermoplastic resin showing an adhesive property at ordinary temperature or when heated, and a thermosetting resin as being an adhesive resin which loses its adhesive property after cured. Further, in order to increase the strength of the coating layer, those containing an organic or inorganic filler may be used.

Furthermore, the material for the adhesive layer 306 may be an electro-depositing adhesive to show fluidity at ordinary temperature or when heated.

Figure 52:
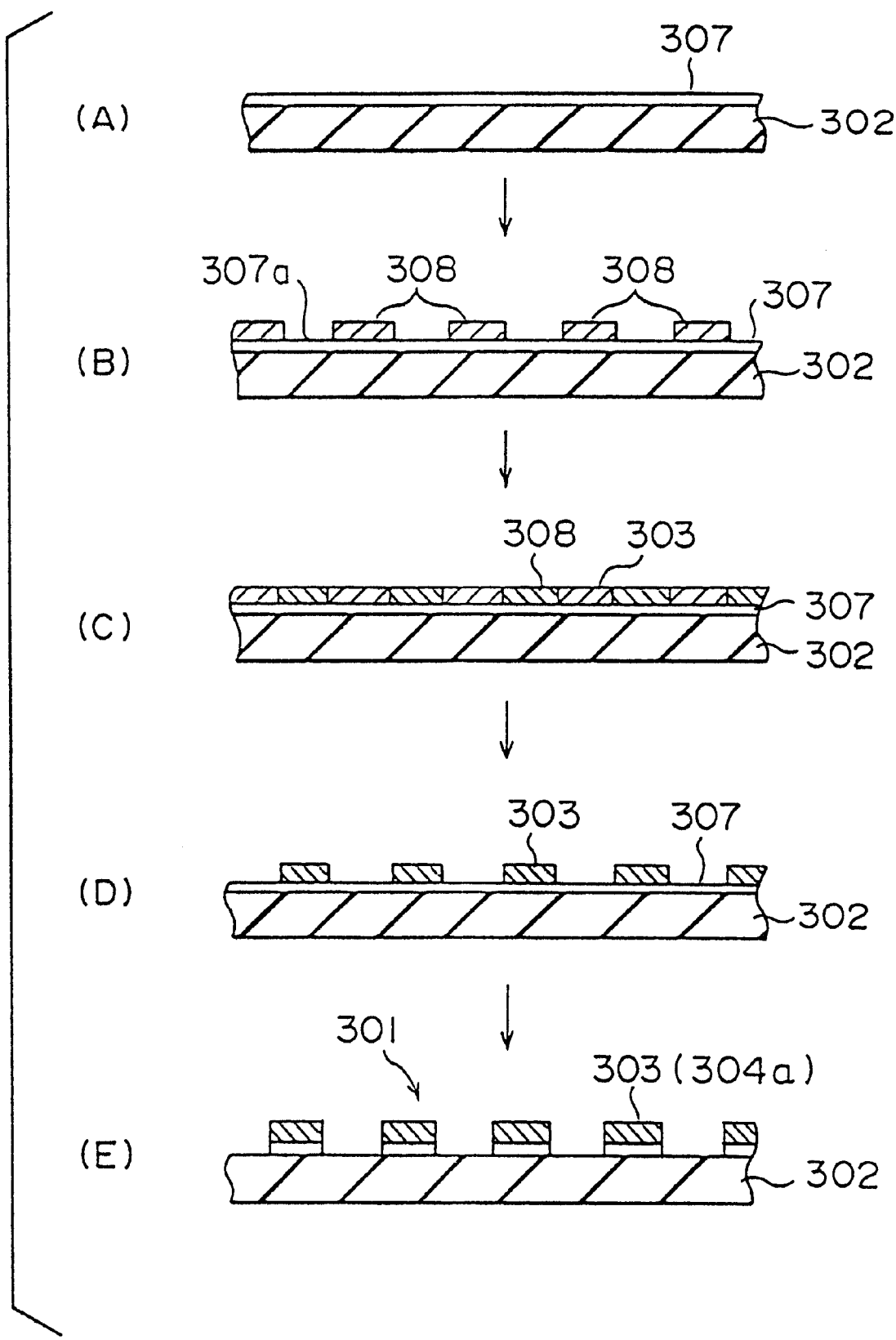
FIG. 52 is a drawing to illustrate a process for producing the printed-wiring board of the present invention.

Next, the process for producing the printed-wiring board of the present invention is described referring to FIG. 52 and using the production of the above printed-wiring board 301 as an example.

First, a current-carrying film 307 is formed on one side of the substrate 302 for printed-wiring board, thereby making the surface of substrate 302 conductive (FIG. 52(A)). This current-carrying film is a thin film made of either of nickel, cobalt, gold, silver, palladium, tin, copper, etc. and formed, for example, by electroless plating, and the film thickness thereof is preferably in the range of above 100 Å to 1 μm. Next, the current-carrying film is coated with a photosensitive resist, and is subjected to shadow printing through a predetermined photomask and development, thereby forming an insulating patterning layer 308 (FIG. 52(B)). Exposed portions 307a of the current-carrying film 307 formed by formation of the patterning layer 308 correspond to a wiring pattern in which the wiring part with the large linewidth is a set of lines each having the same linewidth as the wiring line with the small linewidth. Next, an electrically conductive layer (wiring pattern layer) 303 is formed on the exposed portions 307a of the current-carrying film 307 by electroplating (FIG. 52(C)). In this case, since the linewidths of the exposed portions 307a of the current-carrying film 307 are substantially equal over the entire region of the substrate 302, the density of an electric field formed upon supply of current shows only small scattering. Thus, a precipitating rate is uniform in forming a conductive layer on such a surface by electroplating, and the thickness of the conductive layer 303 formed becomes uniform. Thereafter, the patterning layer 308 is removed (FIG. 52(D)), and further, the substrate 302 is subjected to etching on the conductive layer (wiring pattern layer) 303 side to remove the thin film of the current-carrying film 307, thereby obtaining a printed-wiring board with the wiring pattern layer 303 formed therein (lines 304a in the pad portion 304 in the example as illustrated) (FIG. 52(E)). The etching of the current-carrying film as described above may be conducted by a known and commonly used means, for example, wet etching such as dipping, spraying, etc. or dry etching.

The above process for producing the printed-wiring board is a process for forming the wiring pattern directly on the substrate, and next described is a process for producing the printed-wiring board of the present invention using a transferring original plate.

Figure 53:
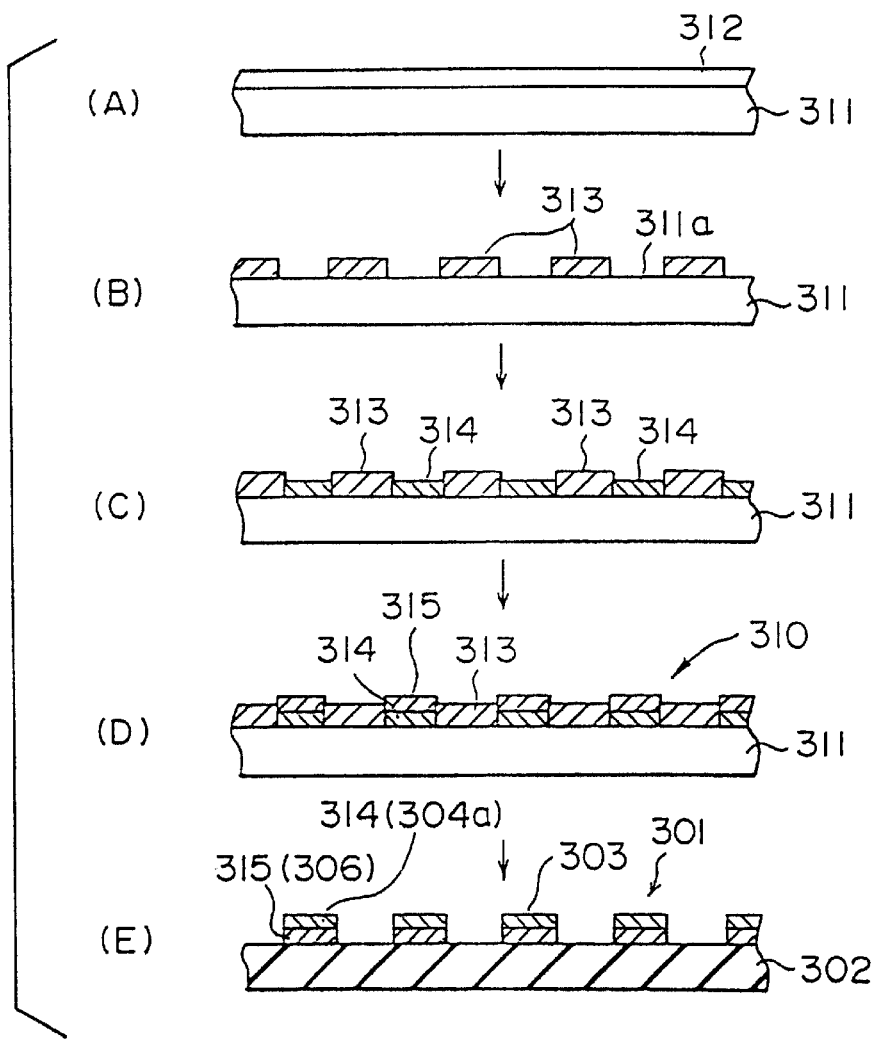
FIG. 53 is a drawing to illustrate a process for producing the transferring original plate and a process for producing the printed-wiring board of the present invention.

First, in order to produce a transferring original plate of the present invention, a photoresist is applied onto a conductive substrate 311, thereby forming a photoresist layer 312 (FIG. 53(A)). Then the photoresist layer 312 is subjected to shadow printing with a predetermined photomask and development to form an insulating layer 313, thereby exposing wiring pattern portions 311a of the conductive substrate 311 (FIG. 53(B)). The wiring pattern portions 311a are such a wiring pattern that the wiring part having the large linewidth is a set of the lines each having substantially the same linewidth as the wiring line having the small linewidth.

Next, a conductive layer 314 is formed on the wiring pattern portions 311a of the conductive substrate 311 by the plating method (FIG. 53(C)). On this occasion, since the linewidths of the wiring pattern portions 311a are substantially equal over the entire region of the conductive substrate 311, the density of an electric field formed upon supply of an electric current shows only small scattering. Thus, the precipitating rate is uniform in forming the conductive layer on such a surface by electroplating and the thickness of the conductive layer 314 formed becomes uniform. Thereafter, an adhesive layer 315 is formed on the conductive layer 314 by the electro-deposition method (FIG. 53(D)). Also, on this occasion, since the linewidths of the conductive layers 314 are substantially equal over the entire region of conductive substrate 311, the density of an electric field formed upon supply of an electric current shows only small scattering. Thus, the precipitating rate is uniform in forming the adhesive layer by electro-deposition on such a surface and the thickness of the adhesive layer 315 becomes uniform. The transferring original plate 310 for wiring-pattern layer provided with the wiring pattern layer 316 having the conductive layer 314 and adhesive layer 315 is obtained by this process.

Next, the above transferring original plate 310 for wiring pattern layer is pressed onto a substrate 302 so as to bring the adhesive layer 315 into contact with the substrate 302. The pressing is effected by either of roller pressing, plate pressing, vacuum pressing, etc. Further, if the adhesive layer 315 is made of an adhesive material which shows the sticky or adhesive property when heated, thermal pressing may be employed. Then the conductive substrate 311 is released so as to transfer the wiring pattern layer 303 onto the substrate 302, thereby forming the wiring pattern layer 303 having the conductive layer 314 (lines 304a) and adhesive layer 315 (adhesive layer 306) on the substrate 302 (FIG. 53(E)).

In the transferring original plate 310 according to the present invention, the conductive substrate 311 may be made of any material at least at surface of which shows electrical conductivity, for example a conductive metal plate of aluminum, copper, nickel, iron, stainless steel, or titanium; or a conductive thin film formed on a surface of an insulating substrate, such as a glass plate or a resin film of a polyester, a polycarbonate, a polyamide, a polyethylene, or an acrylic resin. The thickness of such a conductive substrate 311 is preferably in the range of about 0.05 to 1.0 mm. Further, in order to increase the plate wear of the original plate, a thin film of chromium (Cr) or ceramic Kanigen (Ni+P+SiC manufactured by Kanigen Co.) or another material may be formed on the surface of the conductive substrate. The thickness of the thin film is preferably in the range of about 0.1 to 1.0 $\mu$m.

If the above adhesive layer 315 (adhesive layer 306) is made of a curing type adhesive material, the adhesive layer 306 is cured after the wiring pattern layer 303 is transfer-formed on the substrate. Generally, the curing treatment of the adhesive layer is accompanied by shrinkage of the adhesive layer. In the cases of the conventional printed-wiring boards, wrinkles were formed on the upper layer of conductive layer by shrinkage of the adhesive layer, and this phenomenon was particularly outstanding in the wiring portion having the large linewidth. However, in the case of the present invention, since the wiring portion having the large linewidth (the pad portion 304 in the example as illustrated) is a set of lines each having substantially the same linewidths as the wiring having the small linewidth, there is little effect on the conductive layer 314 (lines 304$a$) caused by the shrinkage of the adhesive layer 306. Therefore, effectively prevented are appearance of wrinkles in the conductive layer 314 (lines 304$a$), deterioration of electrical properties, contact failure, peeling of the conductive layer 314 (lines 304$a$) from adhesive layer 306, etc.

In the printed-wiring board 301, as described above, only one layer of wiring pattern layer is formed on the substrate, but the printed-wiring board of the present invention may include two or more layers of wiring pattern layers formed on the substrate.

Figure 54:
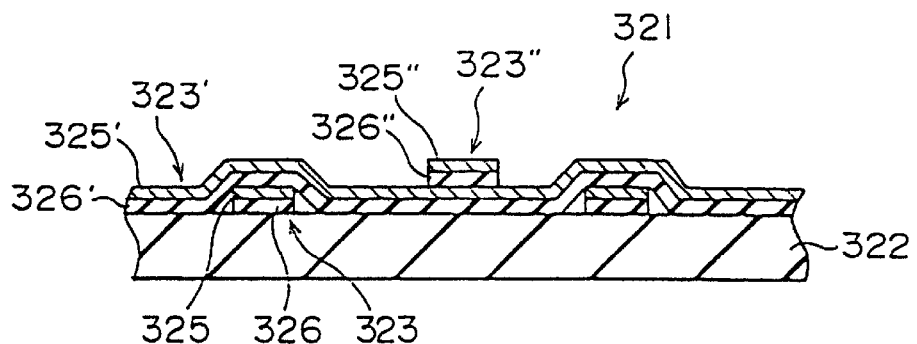
FIG. 54 is a vertical section to show another example of the printed-wiring board of the present invention.

FIG. 54 is a schematic sectional view to show another example of the printed-wiring board of the present invention, and a printed-wiring board 321 is a multi-layer printed-wiring board of three layer structure, which is provided with a substrate 322, a first layer of wiring pattern layer 323 formed on the substrate 322, a second layer of wiring pattern layer 323' laid on the wiring pattern layer 323, and a third layer of wiring pattern layer 323" further laid on the wiring pattern layer 323'. Each wiring pattern layer 323, 323', 323" has an electrically conductive layer (lines) 325, 325', 325" and an adhesive layer 326, 326', 326" formed under the conductive layer (lines).

Such a multi-layer printed-wiring board may be formed by sequentially transferring the wiring pattern layers by the process using the above-described transferring original plates. In this case, the wiring part having the large linewidth is formed as a set of lines each having substantially the same linewidth as the wiring line having the small linewidth.

The present invention is next described in further detail, as presenting specific, experimental examples.

EXPERIMENT 1

A copper thin film was formed in the thickness of 0.5 $\mu$m on a polyimide film substrate of the thickness of 25 $\mu$m by electroless plating, thereby obtaining a current-carrying film (corresponding to FIG. 52(A)). A commercially available photoresist for plating (PMERP-AR900 manufactured by Tokyo Oka Kogyo (KK)) was laid on the current-carrying film in the thickness of 20 $\mu$m and dried. The substrate was subjected to shadow printing using a photomask with a wiring pattern formed therein, followed by development, washing with water, drying, and thermal curing, thereby preparing a patterning layer (corresponding to FIG. 52(B)). The wiring pattern thus obtained was such a pattern as shown in FIG. 45, in which the linewidth of the wiring portion=50 $\mu$m, the linewidth of each line in the set of lines in the pad portion=50 $\mu$m, the wiring spaces in the pad portion=50 $\mu$m, and the total width of the pad portion=550 $\mu$m (equally in length and width). Next, the above substrate and the platinum electrode were set as opposed to each other and immersed in a copper pyrophosphate plating bath having the below composition (pH=8, the solution temperature= 55° C.). An electric current was let to flow for 5 minutes in the current density of 10 A/dm$^2$ while connecting the platinum electrode to the anode of the DC power supply and the substrate to the cathode thereof, to form a copper plating film as an electrically conductive layer on exposed portions of the electrically conductive substrate, not covered with the patterning layer

| (Composition of copper pyrophosphate plating bath) | |
|---|---|
| Copper pyrophosphate | 94 g/l |
| Potassium copper pyrophosphate | 340 g/l |
| Aqueous ammonia | 3 cc/l |

Next, the patterning layer was removed by a 4% NaOH solution heated to 60–70° C. (corresponding to FIG. 52(D)), and then the entire substrate was subjected to etching with a ferric chloride solution until the current-carrying film was removed (corresponding to FIG. 52(E)), thereby obtaining a printed-wiring board.

The thickness of the conductive layer in the wiring portion (wiring portion 305 in FIG. 45) in the printed-wiring board was about 10 $\mu$m, and the thickness of the conductive layer in the pad portion (pad portion 304 in FIG. 45) was about 9 $\mu$m, which confirmed that the film thickness of wiring of the printed-wiring board thus obtained was extremely uniform.

Comparative Experiment 1

A printed-wiring board was prepared in the same manner as in Experiment 1 except that the pad portion was not a set of lines each having a small linewidth but the entire surface was formed as a line (width: 50 $\mu$m (equally in length and width)).

The thickness of the conductive layer in the wiring portion (wiring portion 305 in FIG. 45) in the printed-wiring board was about 10 $\mu$m, and the thickness of the conductive layer in the pad portion (pad portion 304 in FIG. 45) was about 7 $\mu$m, which confirmed that scattering of the thickness of the wiring film in the printed-wiring board thus obtained was large depending on the linewidth of line.

EXPERIMENT 2

(1) Preparation of Electro-depositing Solution for Adhesive Layer 13.2 parts by weight of butyl acrylate, 1.6 parts by weight of methyl methacrylate, 0.2 part by weight of divinyl benzene, and 85 parts by weight of a 1% aqueous solution of potassium persulfate were mixed and polymerized at 80° C. for 5 hours to undergo emulsion polymerization without emulsifier, thereby preparing a polybutyl acrylate/polymethyl methacrylate copolymer emulsion solution.

Then, 65 parts by weight of the emulsion solution thus prepared, 2 parts by weight of an acrylic copolymer resin having a carboxyl group as an electro-depositing carrier, 0.85 part by weight of hexamethoxymelamine, 0.35 part by weight of trimethylamine as a neutralizing agent, 3 parts by weight of ethanol, 3 parts by weight of butyl cellosolve, and 18.8 parts by weight of water were stirred to mix, thereby preparing an anionic electro-depositing solution.

(2) Formation of Electrically Conductive Layer in Transferring Original Plate

A stainless steel plate having the thickness of 0.2 mm, the surface of which was polished, was prepared as an electrically conductive substrate, and a commercially available photoresist for plating (PMERP-AR900 manufactured by Tokyo Oka Kogyo (KK)) was laid on the stainless steel plate in the thickness of 10 $\mu$m and dried. The plate was subjected to shadow printing using a photomask with a predetermined wiring pattern formed therein, followed by development, washing with water, drying, and thermal curing, thereby preparing a transferring original plate having an insulating layer (corresponding to FIG. 53(B)). The exposed pattern (wiring pattern) on the conductive substrate in this transferring original plate was the pattern as shown in FIG. 45, in which the linewidth of the wiring portion=50 $\mu$m, the linewidth of each line in the set of lines in the pad portion= 50 $\mu$m, the wiring spaces in the pad portion=50 $\mu$m, and the total width of the pad portion=550 $\mu$m (equally in length and width).

The transferring original plate prepared above was set as opposed to the platinum electrode and immersed in a copper pyrophosphate plating bath having the below composition (pH=8, the solution temperature=55° C.). An electric current was let to flow for 5 minutes in the current density of 10 A/dm$^2$ while connecting the platinum electrode to the anode of the DC power supply and the transferring original plate prepared above to the cathode thereof, to form a copper plating film as an electrically conductive layer on exposed portions of the electrically conductive substrate, not covered with the photoresist (corresponding to FIG. 53(C)).

| (Composition of copper pyrophosphate plating bath) | |
|---|---|
| Copper pyrophosphate | 94 g/l |
| Potassium copper pyrophosphate | 340 g/l |
| Aqueous ammonia | 3 cc/l |

(3) Formation of Adhesive Layer in Transferring Original Plate (Corresponding to FIG. 53(D))

The transferring original plate, in which the electrically conductive layer was formed in above (2), and the platinum electrode were set as opposed to each other and immersed in the electro-depositing solution prepared in above (1). The transferring original plate was connected to the anode of the DC power supply and the platinum electrode to the cathode thereof, and electro-deposition was carried out at the voltage of 50 V for a minute, followed by a drying and heat treatment at 150° C. for 30 minutes to form an adhesive layer on the electrically conductive layer, thus obtaining a transferring original plate for wiring pattern layer.

(4) Formation of Printed-wiring Board (Corresponding to FIG. 53(E))

The transferring original plate for wiring pattern layer prepared in above (3), was pressed onto a polyimide film substrate having the thickness of 25 $\mu$m under the following conditions, whereby the wiring pattern layer composed of the electrically conductive layer and the adhesive layer was transferred onto the film substrate, and then the adhesive layer was cured under the conditions of 150° C. and 30 minutes to complete formation of the wiring pattern layer, thereby obtaining a printed-wiring board.

(Pressing Conditions)

Pressure: 10 kgf/cm$^2$

Temperature: 80° C.

The thickness of the conductive layer in the wiring portion (wiring portion 305 in FIG. 45) in the printed-wiring board was about 10 $\mu$m, and the thickness of the adhesive layer was about 15 $\mu$m. Further, the thickness of the conductive layer in the pad portion (pad portion 304 in FIG. 45) was about 9 $\mu$m and the thickness of the adhesive layer was about 14 $\mu$m. Thus, it was confirmed that the film thickness of wiring of the printed-wiring board thus obtained was extremely uniform. Further, substantially little wrinkle was observed in the pad portion and the surface condition was good.

Comparative Experiment 2

A printed-wiring board was prepared in the same manner as in Experiment 2 except that the pad portion was not a set of lines each having a small linewidth but the entire surface was formed as a line (width: 550 $\mu$m (equally in length and width)).

The thickness of the conductive layer in the wiring portion (wiring portion 305 in FIG. 45) in the printed-wiring board was about 10 $\mu$m and the thickness of adhesive layer therein was about 15 $\mu$m; and the thickness of the conductive layer in the pad portion (pad portion 304 in FIG. 45) was about 7 $\mu$m and the thickness of adhesive layer therein was about 10 $\mu$m. Thus, it was confirmed that there was large scattering in the film thickness of wiring of the printed-wiring board thus obtained, depending on the linewidth of line. Further, wrinkles appeared distinct in the pad portion, and the surface condition was inadequate.

As detailed above, according to the present invention, the electrically conductive layer is formed on the current-carrying film exposed by electro-deposition in such a wiring pattern that the wiring portion having the large linewidth is a set of lines each having substantially the same linewidth as the wiring portion having the small linewidth. Therefore, the precipitating rate is substantially uniform in forming the conductive layer over the entire region of wiring pattern and the thickness of the wiring pattern layer composed of this conductive layer is uniform. Further, since the electrically conductive layer is formed on the electrically conductive substrate exposed by electro-deposition in such a wiring pattern that the wiring portion having the large linewidth is a set of lines each having substantially the same linewidth as the wiring portion having the small linewidth, the precipitating rate is substantially uniform in forming of the conductive layer over the entire region of wiring pattern, and the thickness of the wiring pattern layer obtained by transferring the conductive layer onto the substrate becomes uniform. Furthermore, when the electrically conductive layer is transferred onto the substrate through the adhesive layer formed by electro-deposition on the conductive layer formed on the conductive substrate, the above adhesive layer can be formed uniformly in thickness. In addition, even though shrinkage by curing of the adhesive layer occurs after formation of the conductive layer on the substrate through the adhesive layer, there is little effect on the conductive layer, whereby appearance of wrinkles in the conductive layer is prevented; the wiring pattern layer is extremely flat; and the adhesive property to the substrate and the electrical properties are excellent.

What is claimed is:

1. A process for producing a multi-layer printed-wiring board, comprising:

a step of forming on electrically conductive substrates respective wiring pattern layers, each having an electrically conductive layer, thereby preparing a plurality of transferring original plates;

a step of forming an adhesive insulating photosensitive resin layer on one surface of a substrate for a multi-layer printed-wiring board, pressing said transferring original plate onto said adhesive insulating photosensitive resin layer, and releasing said electrically conductive substrate, thereby transferring said wiring pattern layer to said substrate for a multi-layer printed-wiring board; and a step of performing exposure and development of said adhesive insulating photosensitive resin layer with said wiring pattern layer transferred as a mask, wherein the step of transferring the wiring pattern layer and the exposure and development step of the adhesive insulating photosensitive resin layer are sequentially repeated, thereby laying a plurality of said wiring pattern layers in lamination on said substrate for a multi-layer printed-wiring board.

2. A process for producing a multi-layer printed-wiring board, comprising:

a step of forming on electrically conductive substrates respective wiring pattern layers, each having an electrically conductive layer and an adhesive layer laid on said conductive layer, thereby preparing a plurality of transferring original plates;

a step of pressing a lower transferring original plate onto one surface of a substrate for a multi-layer printed-wiring board and releasing said electrically conductive substrate, thereby transferring said wiring pattern layer to said substrate for a multi-layer printed-wiring board; and a step of forming an insulating photosensitive resin layer so as to cover the wiring pattern layer on said substrate for a multi-layer printed-wiring board, pressing an upper transferring original plate onto said insulating photosensitive resin layer, and releasing said electrically conductive substrate, thereby transferring the upper wiring pattern layer to said resin layer;

which further comprises a step of sequentially repeating the transfer of the upper wiring pattern layer to lay a multiplicity of wiring pattern layers in lamination on the substrate for a multi-layer printed-wiring board, and thereafter performing exposure and development of said insulating photosensitive resin layer with said wiring pattern layers as a mask.

3. A process for producing a multi-layer printed-wiring board according to claim 2, wherein before the step of transferring the lower wiring pattern layer, an insulating photosensitive resin layer is preliminarily formed on the one surface of said substrate for a multi-layer printed-wiring board.

4. A process for producing a multi-layer printed-wiring board, comprising:

a step of forming on electrically conductive substrates respective wiring pattern layers, each having an electrically conductive layer, thereby preparing a plurality of transferring original plates; and a step of forming an adhesive insulating photosensitive resin layer onto one surface of a substrate for a multi-layer printed-wiring board, pressing said transferring original plate onto said adhesive insulating photosensitive resin layer, and releasing said electrically conductive substrate, thereby transferring said wiring pattern layer to said substrate for a multi-layer printed-wiring board;

which further comprises a step of sequentially repeating the transfer of the upper wiring pattern layer to lay a multiplicity of wiring pattern layers in lamination on the substrate for a multi-layer printed-wiring board, and thereafter performing exposure and development of said insulating photosensitive resin layer with said wiring pattern layers as a mask.

5. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board;

forming a through hole penetrating the wiring pattern layers in a portion where said wiring pattern layers intersect with each other; and connecting said wiring pattern layers with each other by forming a metal layer in said through hole by a plating method.

6. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other in an intersecting portion of said wiring pattern layers or in an abutting portion of said wiring pattern layers by forming a junction portion in such a manner that an electrically conductive paste or solder is fixed so as to bestride the electrically conductive layers of the respective wiring pattern layers.

7. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other in an intersecting portion of said wiring pattern layers or in an abutting portion of said wiring pattern layers by forming a junction portion in such a manner that electrically conductive fine particles are fixed so as to bestride the electrically conductive layers of the respective wiring pattern layers.

8. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other in an intersecting portion of said wiring pattern layers or in an abutting portion of said wiring pattern layers by forming a junction portion in such a manner that electroless plating is partially conducted so as to bestride the electrically conductive layers of the respective wiring pattern layers.

9. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other in an intersecting portion of said wiring pattern layers or in an abutting portion of said wiring pattern layers by forming a junction portion in such a manner that an electrically conductive substance is deposited so as to bestride the electrically conductive layers of the respective wiring pattern layers.

10. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other in an intersecting portion of said wiring pattern layers or in an abutting portion of said wiring pattern layers by forming a junction portion in such a manner that thermal energy is radiated to weld the electrically conductive layers of the respective wiring pattern layers.

11. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other in an intersecting portion of said wiring pattern layers or in an abutting portion of said wiring pattern layers by forming a junction portion of a wire bridge or a bonding bulk by wire bonding.

12. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other by forming a junction portion in such a manner that a laser is emitted onto an intersecting portion of said wiring pattern layers or onto an abutting portion of said wiring pattern layers while the multi-layer printed-wiring board is immersed in a plating solution, thereby precipitating a plating composition on a portion irradiated.

13. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other in an intersecting portion of said wiring pattern layers or in an abutting portions of said wiring pattern layers by forming a junction portion by batch thermal transfer of a laminate of a conductive body and a plating solder.

14. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board; and connecting the wiring pattern layers with each other by forming a junction portion in such a manner that a metal bulk is placed in an intersecting portion of said wiring pattern layers or in an abutting portion of said wiring pattern layers and then a sheet coated with a pressure-sensitive adhesive is pressed thereonto.

15. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates;

pressing said transferring original plate onto one surface of a substrate for a multi-layer printed-wiring board and releasing said electrically conductive substrate, thereby transferring said wiring pattern layer to said substrate for a multi-layer printed-wiring board;

wherein the transferring step of said wiring pattern layer is sequentially repeated with the plurality of transferring original plates, thereby laying the plurality of said wiring pattern layers in lamination on said substrate for a multi-layer printed-wiring board;

forming a catalyst layer by applying an electroless plating catalyst onto the multi-layer printed-wiring board;

applying a photoresist onto the catalyst layer and thereafter subjecting the resist layer to shadow printing with a predetermined photomask and development, thereby exposing an intersecting portion of said wiring pattern layers or an abutting portion of said wiring pattern layers; and activating the exposed portion and thereafter forming a junction portion by conducting electroless plating.

16. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates; and pressing said transferring original plate onto one surface of a substrate for a multi-layer printed-wiring board and releasing said electrically conductive substrate, thereby transferring said wiring pattern layer to said substrate for a multi-layer printed-wiring board;

wherein before laying the wiring pattern layers one over another, an additional insulating layer is preliminarily formed on an overlapping-intended portion of wiring pattern layers in a lower wiring pattern layer by screen printing with a screen printing plate to match a pattern of the overlapping-intended portion of wiring pattern layers in the lower wiring pattern layer, and said step of transferring said wiring pattern layer is sequentially repeated with the plurality of transferring original plates, thereby laying the plurality of said wiring pattern layers in lamination on said substrate for a multi-layer printed-wiring board.

17. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates; and pressing said transferring original plate onto one surface of a substrate for a multi-layer printed-wiring board and releasing said electrically conductive substrate, thereby transferring said wiring pattern layer to said substrate for a multi-layer printed-wiring board;

wherein before laying the wiring pattern layers one over another, an additional insulating layer is preliminarily formed on an overlapping-intended portion of wiring pattern layers in a lower wiring pattern layer by a photolithography process with a photomask to match a pattern of the overlapping-intended portion of wiring pattern layers in the lower wiring pattern layer, and said step of transferring said wiring pattern layer is sequentially repeated with the plurality of transferring original plates, thereby laying the plurality of said wiring pattern layers in lamination on said substrate for a multi-layer printed-wiring board.

18. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates; and pressing said transferring original plate onto one surface of a substrate for a multi-layer printed-wiring board and releasing said electrically conductive substrate, thereby transferring said wiring pattern layer to said substrate for a multi-layer printed-wiring board;

wherein before laying the wiring pattern layers one over another, an additional insulating layer is preliminarily formed on an overlapping-intended portion of wiring pattern layers in a lower wiring pattern layer, said additional insulating layer being formed in such a manner that an insulating material layer is formed on the lower wiring pattern layer, a resist pattern to match a pattern of the overlapping-intended portion of wiring pattern layers is formed on the insulating material layer, an exposed portion of the insulating material layer is thereafter removed by etching, and the resist is finally removed, and said step of transferring said wiring pattern layer is sequentially repeated with the plurality of transferring original plates, thereby laying the plurality of said wiring pattern layers in lamination on said substrate for a multi-layer printed-wiring board.

19. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates; and pressing said transferring original plate onto one surface of a substrate for a multi-layer printed-wiring board and releasing said electrically conductive substrate, thereby transferring said wiring pattern layer to said substrate for a multi-layer printed-wiring board;

wherein before laying the wiring pattern layers one over another, an additional insulating layer is preliminarily formed on an overlapping-intended portion of wiring pattern layers in a lower wiring pattern layer, said additional insulating layer being formed in such a manner that an insulating layer transferring substrate having an insulating layer pattern to match a pattern of the overlapping-intended portion of wiring pattern layers is preliminary prepared, and the insulating layer pattern is transferred onto a lower layer pattern, and said step of transferring said wiring pattern layer is sequentially repeated with the plurality of transferring original plates, thereby laying the plurality of said wiring pattern layers in lamination on said substrate for a multi-layer printed-wiring board.

20. A process for producing a multi-layer printed-wiring board, comprising:

forming on electrically conductive substrates respective wiring pattern layers, each having an electrically conductive layer and a sticky or adhesive, electrically insulating resin layer laid on said conductive layer, thereby preparing a plurality of transferring original plates; and pressing said transferring original plate onto one surface of a substrate for a multi-layer printed-wiring board and releasing said electrically conductive substrate, thereby transferring said wiring pattern layer to said substrate for a multi-layer printed-wiring board;

wherein before laying the wiring pattern layers one over another, an additional insulating layer is preliminarily formed on an overlapping-intended portion of wiring pattern layers in a lower wiring pattern layer by applying an insulating material solution to the overlapping-intended portion of wiring pattern layers in the lower wiring pattern layer, and drying said material, and said step of transferring said wiring pattern layer is sequentially repeated with the plurality of transferring original plates, thereby laying the plurality of said wiring pattern layers in lamination on said substrate for a multi-layer printed-wiring board.

21. A process for producing a multi-layer printed-wiring board, comprising:

forming on electrically conductive substrates respective wiring pattern layers, each having an electrically conductive layer and an adhesive layer laid on said conductive layer, thereby preparing a plurality of transferring original plates;

preliminarily forming an insulating photosensitive resin layer on a surface of a substrate for a multi-layer printed-wiring board;

pressing a lower transferring original plate onto the one surface of the substrate for a multi-layer printed-wiring board and releasing said electrically conductive substrate, thereby transferring said wiring pattern layer to said substrate for a multi-layer printed-wiring board;

performing exposure and development of said insulating photosensitive resin layer, with the lower wiring pattern layer transferred as a mask;

forming an insulating photosensitive resin layer so as to cover said lower wiring pattern layer, pressing an upper transferring original plate onto said insulating photosensitive resin layer, and releasing said electrically conductive substrate, thereby transferring the upper wiring pattern layer to said resin layer; and performing exposure and development of said insulating photosensitive resin layer with the upper wiring pattern layer transferred as a mask.

* * * * *

UNITED STATES PATENT AND TRADEMARK OFFICE
CERTIFICATE OF CORRECTION

PATENT NO. : 6,378,199 B1
DATED : April 30, 2002
INVENTOR(S) : Hiroto Yoshinuma et al.

It is certified that error appears in the above-identified patent and that said Letters Patent is hereby corrected as shown below:

<u>Title page</u>
Item [54], change "MULTI-LAYER PRINTED-WIRING BOARD PROCESS FOR PRODUCING" to -- MULTI-LAUER PRINTED-WIRING BOARD AND PROCESS FOR PRODUCING IT, AND TRANSFERRING ORIGINAL PLATE AND PROCESS FOR PRODUCING IT --.

Signed and Sealed this

Eighteenth Day of June, 2002

*Attest:*

JAMES E. ROGAN
*Attesting Officer*    *Director of the United States Patent and Trademark Office*